(12) United States Patent
Eshel et al.

(10) Patent No.: US 12,372,659 B2
(45) Date of Patent: Jul. 29, 2025

(54) VIRTUAL PROTECTIVE HOUSING FOR BISTATIC LIDAR

(71) Applicant: Innoviz Technologies, Rosh Ha'Ayin (IL)

(72) Inventors: Ronen Eshel, Givatayim (IL); Amit Steinberg, Adanim (IL); Idan Bakish, Petah Tikva (IL); Shahar Levy, Rishon Lezion (IL); Yuval Yifat, Tel Aviv-Jaffa (IL)

(73) Assignee: Innoviz Technologies Ltd., Rosh HaAyin (IL)

( * ) Notice: Subject to any disclaimer, the term of this patent is extended or adjusted under 35 U.S.C. 154(b) by 1125 days.

(21) Appl. No.: 17/283,836

(22) PCT Filed: Oct. 17, 2019

(86) PCT No.: PCT/IB2019/001459
§ 371 (c)(1),
(2) Date: Apr. 8, 2021

(87) PCT Pub. No.: WO2020/148567
PCT Pub. Date: Jul. 23, 2020

(65) Prior Publication Data
US 2021/0389467 A1    Dec. 16, 2021

Related U.S. Application Data

(60) Provisional application No. 62/754,055, filed on Nov. 1, 2018, provisional application No. 62/747,761, filed on Oct. 19, 2018.

(51) Int. Cl.
*G01S 17/93* (2020.01)
*G01S 7/48* (2006.01)
(Continued)

(52) U.S. Cl.
CPC .......... *G01S 17/931* (2020.01); *G01S 7/4808* (2013.01); *G01S 7/497* (2013.01); *G01S 7/51* (2013.01);
(Continued)

(58) Field of Classification Search
None
See application file for complete search history.

(56) References Cited

U.S. PATENT DOCUMENTS

| 2018/0081037 A1 | 3/2018 | Medina et al. |
| 2018/0081038 A1 | 3/2018 | Medina et al. |

(Continued)

FOREIGN PATENT DOCUMENTS

| CN | 1474161 A | 2/2004 |
| CN | 101825431 A | 9/2010 |

(Continued)

OTHER PUBLICATIONS

International Search Report, issued from the European Patent Office in International Application No. PCT/IB2019/001459, dated Aug. 31, 2020 (14 pages).

(Continued)

*Primary Examiner* — Hovhannes Baghdasaryan
(74) *Attorney, Agent, or Firm* — Meitar Patents Ltd.; Daniel Kligler

(57) ABSTRACT

Systems and methods may detect an object within a minimum predetermined distance of a LIDAR system. The LIDAR system may comprise a processor configured to control a light source and a light deflector to illuminate objects located in a space illuminated by the light source; determine a distance to a first object based located within a field of view of a LIDAR sensor; receive, from a supplementary sensor, reflection signals indicative of light reflected from a second object outside the field of view;

(Continued)

determine, based on the second reflection signals that the second object is located within a predetermined distance; and regulate, based on the determination, at least one of the light source and the light deflector to prevent an accumulated energy density of light emitted by the light source from exceeding a maximum permissible exposure level.

23 Claims, 41 Drawing Sheets

(51) Int. Cl.
  *G01S 7/497* (2006.01)
  *G01S 7/51* (2006.01)
  *G01S 17/931* (2020.01)
  *G01S 17/26* (2020.01)
  *G01S 17/32* (2020.01)
  *H10F 30/225* (2025.01)
(52) U.S. Cl.
  CPC ............... *G01S 17/26* (2020.01); *G01S 17/32* (2013.01); *H10F 30/225* (2025.01)

(56) References Cited

U.S. PATENT DOCUMENTS

| | | |
|---|---|---|
| 2018/0100928 A1 | 4/2018 | Keilaf et al. |
| 2018/0107221 A1 | 4/2018 | Droz et al. |
| 2018/0113216 A1 | 4/2018 | Kremer et al. |
| 2018/0136331 A1* | 5/2018 | Rosenzweig ......... G01S 7/4815 |
| 2018/0188359 A1* | 7/2018 | Droz ....................... G01S 7/497 |
| 2020/0025923 A1* | 1/2020 | Eichenholz ........... G01S 17/931 |

FOREIGN PATENT DOCUMENTS

| | | |
|---|---|---|
| WO | WO 2018/052087 A1 | 3/2018 |
| WO | WO 2018/091970 A1 | 5/2018 |

OTHER PUBLICATIONS

Office Action issued in Chinese Patent Application No. 201980073688.7, dated Sep. 13, 2024, and machine translation thereof (22 pages).
Office Action issued in Chinese Patent Application No. 201980073688.7, dated Dec. 12, 2024, and machine translation thereof (18 pages).

* cited by examiner

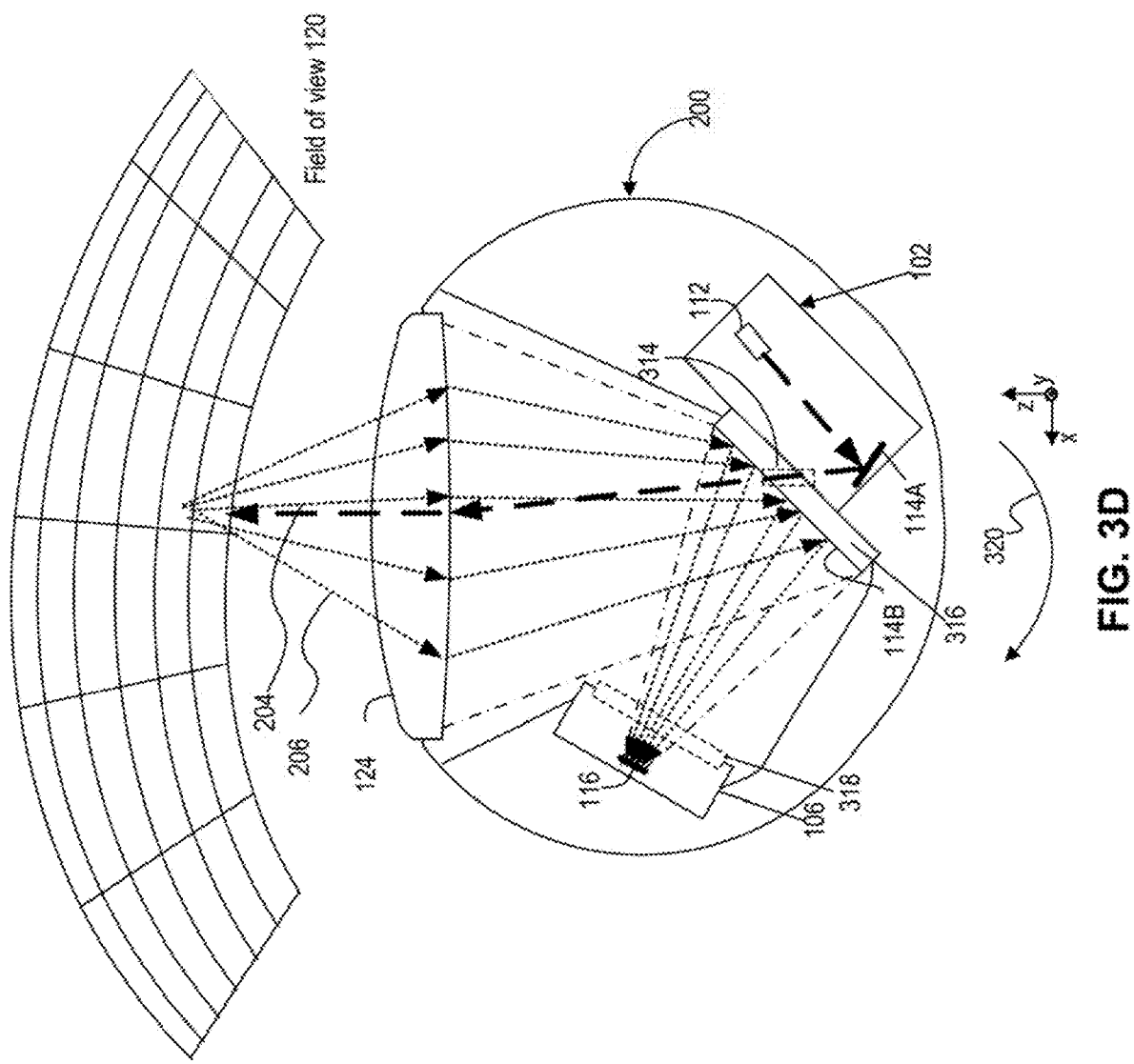

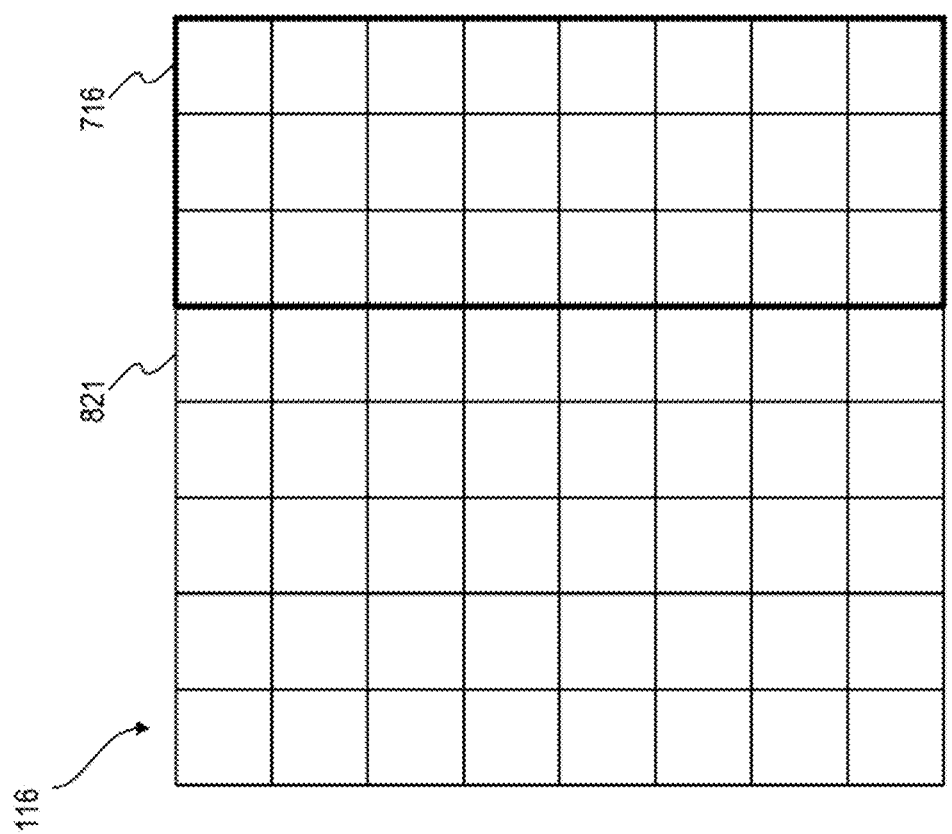

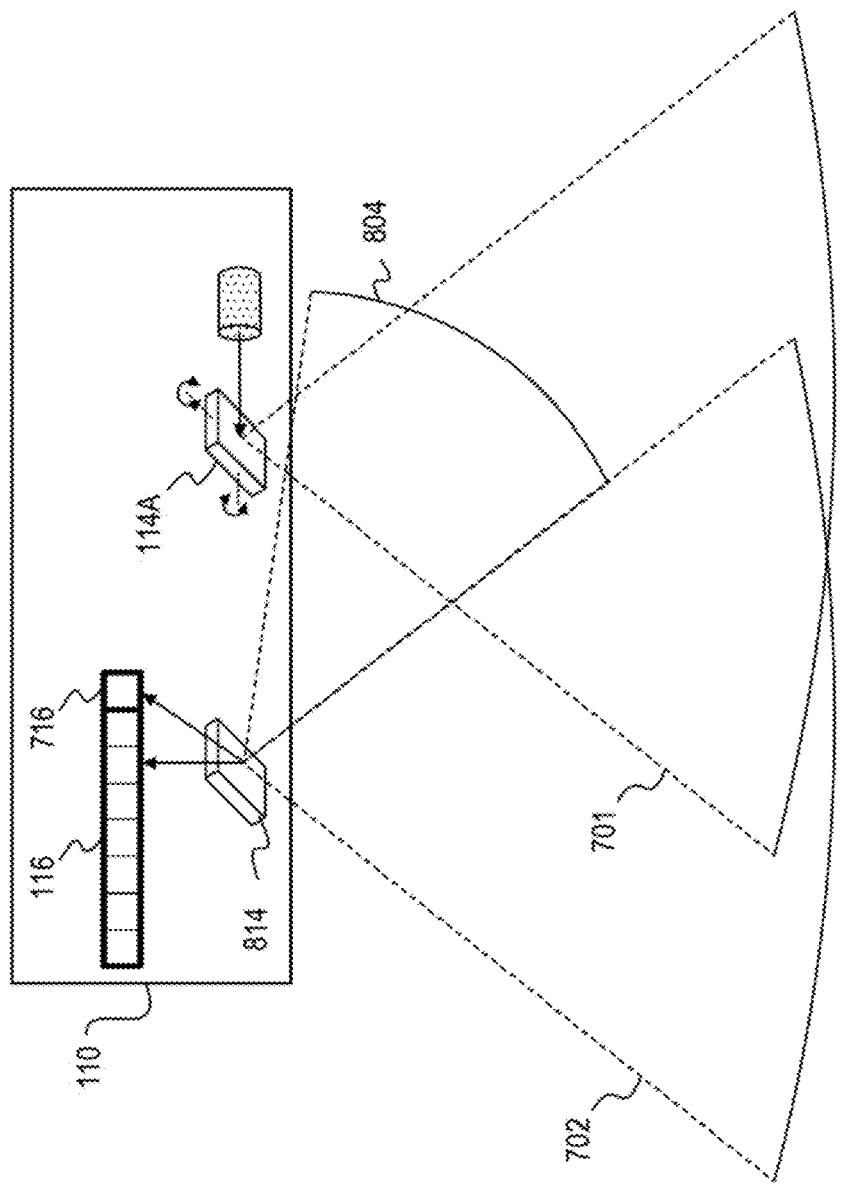

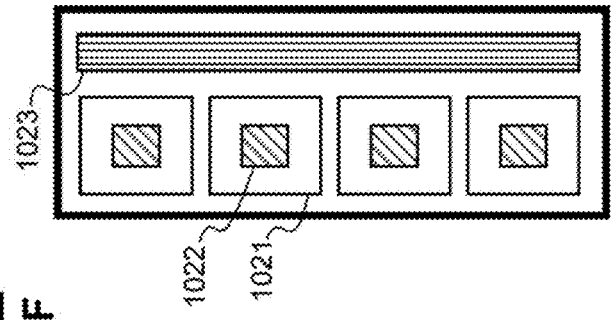
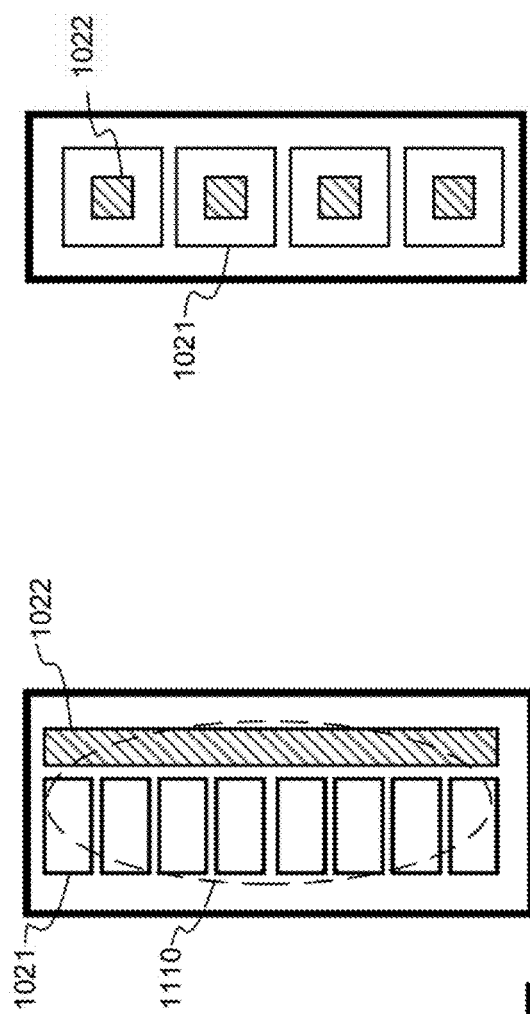
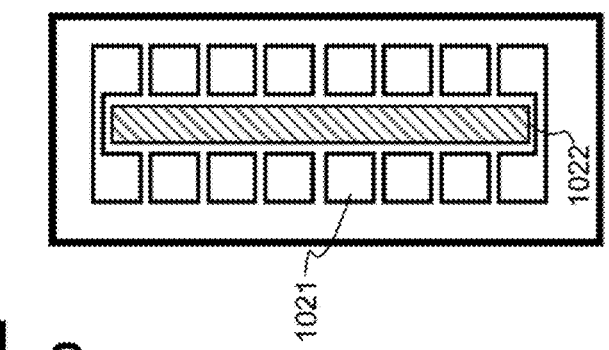
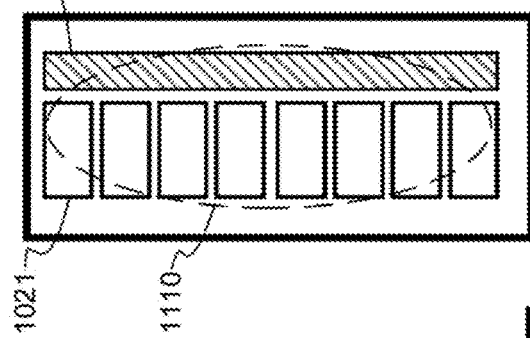
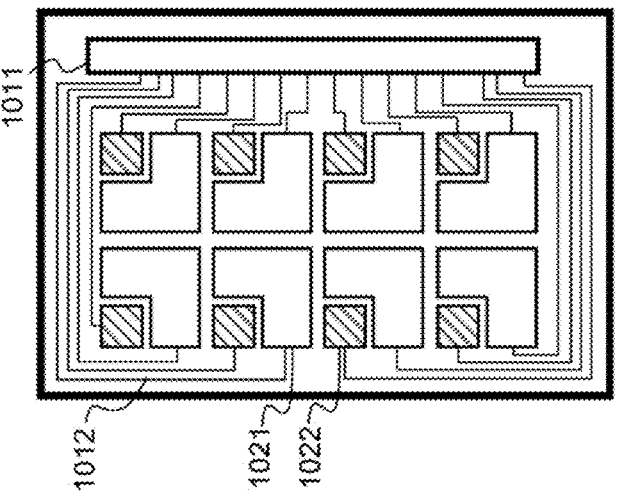

VIRTUAL PROTECTIVE HOUSING FOR BISTATIC LIDAR

CROSS-REFERENCES TO RELATED APPLICATIONS

The present application claims priority to U.S. Provisional Patent Application No. 62/747,761, filed Oct. 19, 2018, and U.S. Provisional Patent Application No. 62/754,055, filed Nov. 1, 2018. The foregoing applications are incorporated herein by reference in their entirety.

BACKGROUND

I. Technical Field

The present disclosure relates generally to technology for scanning a surrounding environment, and, for example, to systems and methods that use LIDAR technology to detect objects in the surrounding environment.

II. Background Information

With the advent of driver assist systems and autonomous vehicles, automobiles need to be equipped with systems capable of reliably sensing and interpreting their surroundings, including identifying obstacles, hazards, objects, and other physical parameters that might impact navigation of the vehicle. To this end, a number of differing technologies have been suggested including radar, LIDAR, camera-based systems, operating alone or in a redundant manner.

One consideration with driver assistance systems and autonomous vehicles is an ability of the system to determine surroundings across different conditions including, rain, fog, darkness, bright light, and snow. A light detection and ranging system, (LIDAR a/k/a LADAR) is an example of technology that can work well in differing conditions, by measuring distances to objects by illuminating objects with light and measuring the reflected pulses with a sensor. A laser is one example of a light source that can be used in a LIDAR system. As with any sensing system, in order for a LIDAR-based sensing system to be fully adopted by the automotive industry, the system should provide reliable data enabling detection of far-away objects. Currently, however, the maximum illumination power of LIDAR systems is limited by the need to make the LIDAR systems eye-safe (i.e., so that they will not damage the human eye which can occur when a projected light emission is absorbed in the eye's cornea and lens, causing thermal damage to the retina.)

The systems and methods of the present disclosure are directed towards improving performance of LIDAR systems while complying with eye safety regulations.

SUMMARY

Embodiments consistent with the present disclosure provide devices and methods for automatically capturing and processing images from an environment, and systems and methods for processing information related to images captured from the environment of the user.

In an embodiment, a LIDAR system may comprise at least one processor. The at least one processor may be configured to control at least one of a light source and a light deflector to illuminate a first object and a second object located in a space being illuminated by the light source, wherein the first object is located within a field of view of a LIDAR sensor of the LIDAR system and the second object is outside the field of view of the LIDAR sensor; determine a distance to the first object based on first reflection signals received from the LIDAR sensor, wherein the first reflection signals are indicative of light reflected from the first object; receive, from a supplementary sensor, second reflection signals indicative of light reflected from the second object; determine, based on the second reflection signals that the second object is located within a predetermined distance from the LIDAR system; and regulate, based on the determination, at least one of the light source and the light deflector to prevent an accumulated energy density of light emitted by the light source within the predetermined distance from exceeding a maximum permissible exposure level.

In an embodiment, a method may detect an object within a minimum threshold safety distance of a LIDAR system. The method may comprise controlling at least one of a light source and a light deflector to illuminate a first object and a second object located in a space being illuminated by the light source, wherein the first object is located within a field of view of a LIDAR sensor of the LIDAR system and the second object is outside the field of view of the LIDAR sensor; determining a distance to the first object based on first reflection signals received from the LIDAR sensor, wherein the first reflection signals are indicative of light reflected from the first object; receiving, from a supplementary sensor, second reflection signals indicative of light reflected from the second object; determining, based on the second reflection signals that the second object is located within a predetermined distance from the LIDAR system; and regulating, based on the determination, at least one of the light source and the light deflector to prevent an accumulated energy density of light emitted from the light source within the predetermined distance from exceeding a maximum permissible exposure level.

In an embodiment, a LIDAR system may comprise a light source configured to project light towards a space; a LIDAR sensor configured to detect light reflected from a plurality of objects in a primary field of view of the LIDAR sensor; and an optical component for directing light from a second object to the LIDAR sensor, such that the LIDAR sensor can detect an object from within the blind spot region, wherein the blind spot region is included in the space but outside of the primary field of view.

In an embodiment, a photodetection sensor having a plurality of performance characteristics may comprise a semiconductor photodiode chip having a detection area and a photodetector array located within the detection area. The photodetector array may comprise a first photodetector having a first performance characteristic, wherein the first photodetector is configured to generate a first detection signal based on light transmitted toward a plurality of target objects and reflected from at least a first object of the plurality of target objects to the first photodetector, and wherein the first detection signal is indicative of a time-of-flight of the light transmitted toward the plurality of target objects and reflected from the first object of the plurality of target objects to the first photodetector; and a second photodetector having a second performance characteristic different from the first performance characteristic, wherein the second photodetector is configured to generate a second detection signal based on the light transmitted toward the plurality of target objects and reflected from at least a second object of the plurality of target objects to the second photodetector; and wherein the second detection signal is indicative of a presence of at least one of the plurality of target objects which is undetectable from the first detection signal.

In an embodiment, a method may detect objects using a photodetection sensor with multiple performance characteristics. The method may comprise generating, by a first photodetector having a first performance characteristic, a first detection signal based on light transmitted toward a plurality of target objects and reflected from at least a first object of the plurality of target objects to the first photodetector, and wherein the first detection signal is indicative of a time-of-flight of the light transmitted toward the plurality of target objects and reflected from the at least first object of the plurality of target objects to the first photodetector; and generating, by a second photodetector having a second performance characteristic different from the first performance characteristic, a second detection signal based on the light transmitted toward the plurality of target objects and reflected from at least a second object of the plurality of target objects to the second photodetector; wherein the second detection signal is indicative of a presence of at least one of the plurality of target objects which is undetectable from the first detection signal.

In an embodiment, an inspection system for road vehicles equipped with LIDAR may comprise at least one processor. The at least one processor may be configured to perform operations comprising accessing at least one recent operation parameter of a LIDAR system of a particular vehicle; accessing at least one historical operation parameter; analyzing the at least one historical operation parameter and the at least one recent operation parameter to determine an indicator of degradation in operation of the LIDAR system; analyzing the indicator of degradation in operation of the LIDAR system and stored data non-specific to the particular vehicle, to determine a condition of the LIDAR system; and triggering, based on the determined condition of the LIDAR system, a remedial action.

In an embodiment, a method may inspect road vehicles equipped with LIDAR. The method may comprise accessing at least one recent operation parameter of a LIDAR system of a particular vehicle; accessing at least one historical operation parameter; analyzing the at least one historical operation parameter and the at least one recent operation parameter to determine an indicator of degradation in operation of the LIDAR system; analyzing the indicator of degradation and stored data non-specific to the particular vehicle, to determine a condition of the LIDAR system; and triggering, based on the determined condition of the LIDAR system, a remedial action.

Consistent with other disclosed embodiments, non-transitory computer-readable storage media may store program instructions, which are executed by at least one processor and perform any of the methods described herein.

The foregoing general description and the following detailed description are exemplary and explanatory only and are not restrictive of the claims.

BRIEF DESCRIPTION OF THE DRAWINGS

The accompanying drawings, which are incorporated in and constitute a part of this disclosure, illustrate various disclosed embodiments. In the drawings:

FIGS. 3A, 3B, 3C, and 3D are diagrams illustrating different configurations of scanning units in accordance with some embodiments of the present disclosure.

FIG. 8D is a diagram illustrating an example supplementary sensor array consistent with some embodiments of the present disclosure.

FIG. 8E is a diagram illustrating another example configuration of a LIDAR system including a supplementary sensor consistent with some embodiments of the present disclosure.

FIGS. 11A-11G illustrate example configurations of photodetector array consistent with some embodiments of the present disclosure.

DETAILED DESCRIPTION

Figure 1A:
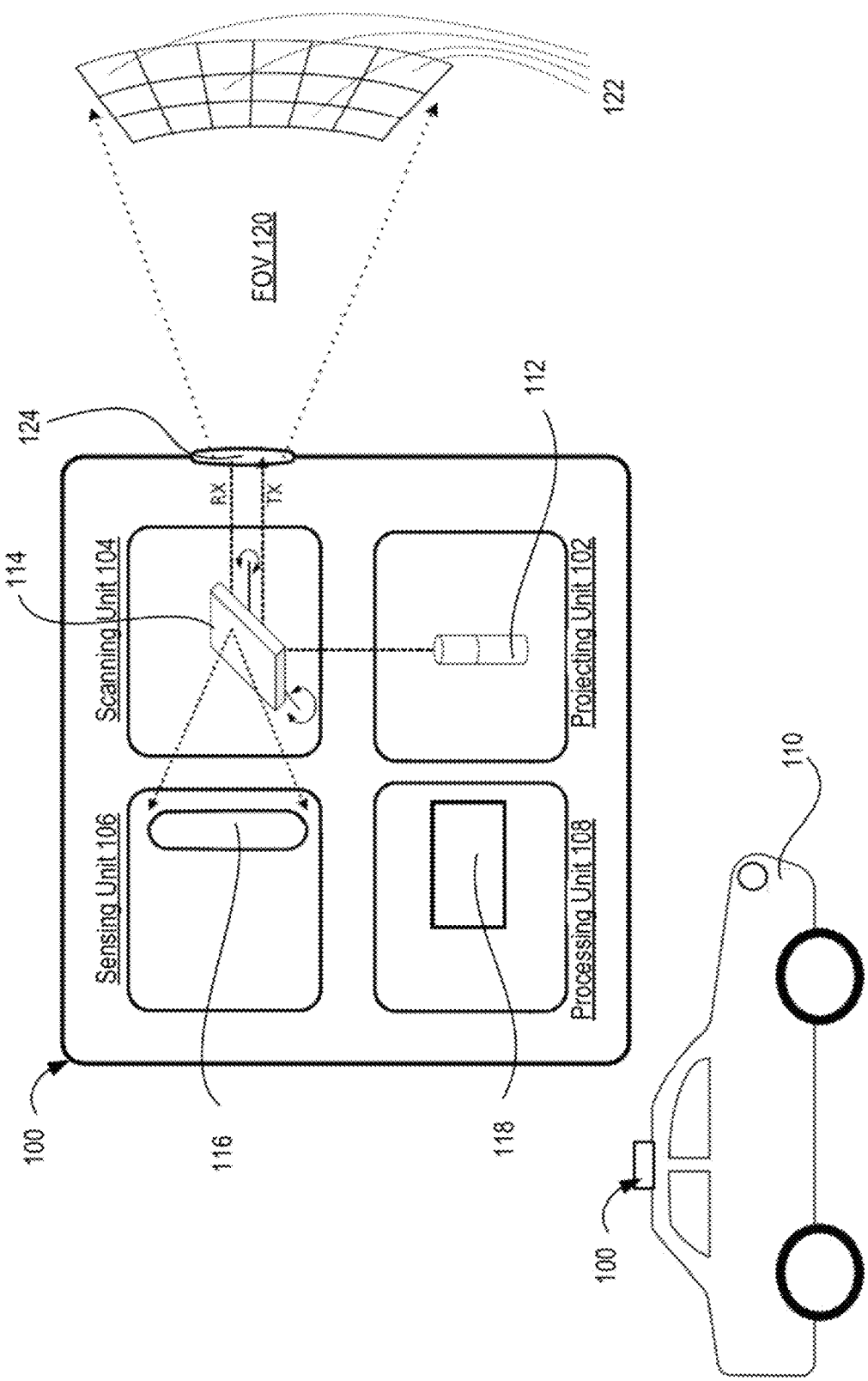
FIG. 1A is a diagram illustrating an exemplary LIDAR system consistent with disclosed embodiments.

The following detailed description refers to the accompanying drawings. Wherever possible, the same reference numbers are used in the drawings and the following description to refer to the same or similar parts. While several illustrative embodiments are described herein, modifications, adaptations and other implementations are possible. For example, substitutions, additions or modifications may be made to the components illustrated in the drawings, and the illustrative methods described herein may be modified by substituting, reordering, removing, or adding steps to the disclosed methods. Accordingly, the following detailed description is not limited to the disclosed embodiments and examples. Instead, the proper scope is defined by the appended claims.

Terms Definitions

Disclosed embodiments may involve an optical system. As used herein, the term "optical system" broadly includes any system that is used for the generation, detection and/or manipulation of light. By way of example only, an optical system may include one or more optical components for generating, detecting and/or manipulating light. For example, light sources, lenses, mirrors, prisms, beam splitters, collimators, polarizing optics, optical modulators, optical switches, optical amplifiers, optical detectors, optical sensors, fiber optics, semiconductor optic components, while each not necessarily required, may each be part of an optical system. In addition to the one or more optical components, an optical system may also include other non-optical components such as electrical components, mechanical components, chemical reaction components, and semiconductor components. The non-optical components may cooperate with optical components of the optical system. For example, the optical system may include at least one processor for analyzing detected light.

Consistent with the present disclosure, the optical system may be a LIDAR system. As used herein, the term "LIDAR system" broadly includes any system which can determine values of parameters indicative of a distance between a pair of tangible objects based on reflected light. In one embodiment, the LIDAR system may determine a distance between a pair of tangible objects based on reflections of light emitted by the LIDAR system. As used herein, the term "determine distances" broadly includes generating outputs which are indicative of distances between pairs of tangible objects. The determined distance may represent the physical dimension between a pair of tangible objects. By way of example only, the determined distance may include a line of flight distance between the LIDAR system and another tangible object in a field of view of the LIDAR system. In another embodiment, the LIDAR system may determine the relative velocity between a pair of tangible objects based on reflections of light emitted by the LIDAR system. Examples of outputs indicative of the distance between a pair of tangible objects include: a number of standard length units between the tangible objects (e.g. number of meters, number of inches, number of kilometers, number of millimeters), a number of arbitrary length units (e.g. number of LIDAR system lengths), a ratio between the distance to another length (e.g. a ratio to a length of an object detected in a field of view of the LIDAR system), an amount of time (e.g. given as standard unit, arbitrary units or ratio, for example, the time it takes light to travel between the tangible objects), one or more locations (e.g. specified using an agreed coordinate system, specified in relation to a known location), and more.

The LIDAR system may determine the distance between a pair of tangible objects based on reflected light. In one embodiment, the LIDAR system may process detection results of a sensor which creates temporal information indicative of a period of time between the emission of a light signal and the time of its detection by the sensor. The period of time is occasionally referred to as "time of flight" of the light signal. In one example, the light signal may be a short pulse, whose rise and/or fall time may be detected in reception. Using known information about the speed of light in the relevant medium (usually air), the information regarding the time of flight of the light signal can be processed to provide the distance the light signal traveled between emission and detection. In another embodiment, the LIDAR system may determine the distance based on frequency phase-shift (or multiple frequency phase-shift). Specifically, the LIDAR system may process information indicative of one or more modulation phase shifts (e.g. by solving some simultaneous equations to give a final measure) of the light signal. For example, the emitted optical signal may be modulated with one or more constant frequencies. The at least one phase shift of the modulation between the emitted signal and the detected reflection may be indicative of the distance the light traveled between emission and detection. The modulation may be applied to a continuous wave light signal, to a quasi-continuous wave light signal, or to another type of emitted light signal. It is noted that additional information may be used by the LIDAR system for determining the distance, e.g. location information (e.g. relative positions) between the projection location, the detection location of the signal (especially if distanced from one another), and more.

In some embodiments, the LIDAR system may be used for detecting a plurality of objects in an environment of the LIDAR system. The term "detecting an object in an environment of the LIDAR system" broadly includes generating information which is indicative of an object that reflected light toward a detector associated with the LIDAR system. If more than one object is detected by the LIDAR system, the generated information pertaining to different objects may be interconnected, for example a car is driving on a road, a bird is sitting on the tree, a man touches a bicycle, a van moves towards a building. The dimensions of the environment in which the LIDAR system detects objects may vary with respect to implementation. For example, the LIDAR system may be used for detecting a plurality of objects in an environment of a vehicle on which the LIDAR system is installed, up to a horizontal distance of 100 m (or 200 m, 300 m, etc.), and up to a vertical distance of 10 m (or 25 m, 50 m, etc.). In another example, the LIDAR system may be used for detecting a plurality of objects in an environment of a vehicle or within a predefined horizontal range (e.g., 25°, 50°, 100°, 180°, etc.), and up to a predefined vertical elevation (e.g., ±10°, ±20°, +40°-20°, ±90° or 0°-90°).

As used herein, the term "detecting an object" may broadly refer to determining an existence of the object (e.g., an object may exist in a certain direction with respect to the LIDAR system and/or to another reference location, or an object may exist in a certain spatial volume). Additionally or alternatively, the term "detecting an object" may refer to determining a distance between the object and another location (e.g. a location of the LIDAR system, a location on earth, or a location of another object). Additionally or alternatively, the term "detecting an object" may refer to identifying the object (e.g. classifying a type of object such as car, plant, tree, road; recognizing a specific object (e.g., the Washington Monument); determining a license plate number; determining a composition of an object (e.g., solid, liquid, transparent, semitransparent); determining a kinematic parameter of an object (e.g., whether it is moving, its velocity, its movement direction, expansion of the object). Additionally or alternatively, the term "detecting an object" may refer to generating a point cloud map in which every point of one or more points of the point cloud map correspond to a location in the object or a location on a face thereof. In one embodiment, the data resolution associated with the point cloud map representation of the field of view may be associated with 0.1°×0.1° or 0.3°×0.3° of the field of view.

Consistent with the present disclosure, the term "object" broadly includes a finite composition of matter that may reflect light from at least a portion thereof. For example, an object may be at least partially solid (e.g. cars, trees); at least partially liquid (e.g. puddles on the road, rain); at least partly gaseous (e.g. fumes, clouds); made from a multitude of distinct particles (e.g. sand storm, fog, spray); and may be of one or more scales of magnitude, such as ~1 millimeter (mm), ~5 mm, ~10 mm, ~50 mm, ~100 mm, ~500 mm, ~1 meter (m), ~5 m, ~10 m, ~50 m, ~100 m, and so on. Smaller or larger objects, as well as any size in between those examples, may also be detected. It is noted that for various reasons, the LIDAR system may detect only part of the object. For example, in some cases, light may be reflected from only some sides of the object (e.g., only the side opposing the LIDAR system will be detected); in other cases, light may be projected on only part of the object (e.g. laser beam projected onto a road or a building); in other cases, the object may be partly blocked by another object between the LIDAR system and the detected object; in other cases, the LIDAR's sensor may only detects light reflected from a portion of the object, e.g., because ambient light or other interferences interfere with detection of some portions of the object.

Consistent with the present disclosure, a LIDAR system may be configured to detect objects by scanning the environment of LIDAR system. The term "scanning the environment of LIDAR system" broadly includes illuminating the field of view or a portion of the field of view of the LIDAR system. In one example, scanning the environment of LIDAR system may be achieved by moving or pivoting a light deflector to deflect light in differing directions toward different parts of the field of view. In another example, scanning the environment of LIDAR system may be achieved by changing a positioning (i.e. location and/or orientation) of a sensor with respect to the field of view. In another example, scanning the environment of LIDAR system may be achieved by changing a positioning (i.e. location and/or orientation) of a light source with respect to the field of view. In yet another example, scanning the environment of LIDAR system may be achieved by changing the positions of at least one light source and of at least one sensor to move rigidly respect to the field of view (i.e. the relative distance and orientation of the at least one sensor and of the at least one light source remains).

As used herein the term "field of view of the LIDAR system" may broadly include an extent of the observable environment of LIDAR system in which objects may be detected. It is noted that the field of view (FOV) of the LIDAR system may be affected by various conditions such as but not limited to: an orientation of the LIDAR system (e.g. is the direction of an optical axis of the LIDAR system); a position of the LIDAR system with respect to the environment (e.g. distance above ground and adjacent topography and obstacles); operational parameters of the LIDAR system (e.g. emission power, computational settings, defined angles of operation), etc. The field of view of LIDAR system may be defined, for example, by a solid angle (e.g. defined using $\phi$, $\theta$ angles, in which $\phi$ and $\theta$ are angles defined in perpendicular planes, e.g. with respect to symmetry axes of the LIDAR system and/or its FOV). In one example, the field of view may also be defined within a certain range (e.g. up to 200 m).

Similarly, the term "instantaneous field of view" may broadly include an extent of the observable environment in which objects may be detected by the LIDAR system at any given moment. For example, for a scanning LIDAR system, the instantaneous field of view is narrower than the entire FOV of the LIDAR system, and it can be moved within the FOV of the LIDAR system in order to enable detection in other parts of the FOV of the LIDAR system. The movement of the instantaneous field of view within the FOV of the LIDAR system may be achieved by moving a light deflector of the LIDAR system (or external to the LIDAR system), so as to deflect beams of light to and/or from the LIDAR system in differing directions. In one embodiment, LIDAR system may be configured to scan scene in the environment in which the LIDAR system is operating. As used herein the term "scene" may broadly include some or all of the objects within the field of view of the LIDAR system, in their relative positions and in their current states, within an operational duration of the LIDAR system. For example, the scene may include ground elements (e.g. earth, roads, grass, sidewalks, road surface marking), sky, man-made objects (e.g. vehicles, buildings, signs), vegetation, people, animals, light projecting elements (e.g. flashlights, sun, other LIDAR systems), and so on.

Disclosed embodiments may involve obtaining information for use in generating reconstructed three-dimensional models. Examples of types of reconstructed three-dimensional models which may be used include point cloud models, and Polygon Mesh (e.g. a triangle mesh). The terms "point cloud" and "point cloud model" are widely known in the art, and should be construed to include a set of data points located spatially in some coordinate system (i.e., having an identifiable location in a space described by a respective coordinate system). The term "point cloud point" refer to a point in space (which may be dimensionless, or a miniature cellular space, e.g. 1 cm$^3$), and whose location may be described by the point cloud model using a set of coordinates (e.g. (X,Y,Z), (r,$\phi$,$\theta$)). By way of example only, the point cloud model may store additional information for some or all of its points (e.g. color information for points generated from camera images). Likewise, any other type of reconstructed three-dimensional model may store additional information for some or all of its objects. Similarly, the terms "polygon mesh" and "triangle mesh" are widely known in the art, and are to be construed to include, among other things, a set of vertices, edges and faces that define the shape of one or more 3D objects (such as a polyhedral object). The faces may include one or more of the following: triangles (triangle mesh), quadrilaterals, or other simple convex polygons, since this may simplify rendering. The faces may also include more general concave polygons, or polygons with holes. Polygon meshes may be represented using differing techniques, such as: Vertex-vertex meshes, Face-vertex meshes, Winged-edge meshes and Render dynamic meshes. Different portions of the polygon mesh (e.g., vertex, face, edge) are located spatially in some coordinate system (i.e., having an identifiable location in a space described by the respective coordinate system), either directly and/or relative to one another. The generation of the reconstructed three-dimensional model may be implemented using any standard, dedicated and/or novel photogrammetry technique, many of which are known in the art. It is noted that other types of models of the environment may be generated by the LIDAR system.

Consistent with disclosed embodiments, the LIDAR system may include at least one projecting unit with a light source configured to project light. As used herein the term "light source" broadly refers to any device configured to emit light. In one embodiment, the light source may be a laser such as a solid-state laser, laser diode, a high power laser, or an alternative light source such as, a light emitting diode (LED)-based light source. In addition, light source 112 as illustrated throughout the figures, may emit light in differing formats, such as light pulses, continuous wave (CW), quasi-CW, and so on. For example, one type of light source that may be used is a vertical-cavity surface-emitting laser (VCSEL). Another type of light source that may be used is an external cavity diode laser (ECDL). In some examples, the light source may include a laser diode configured to emit light at a wavelength between about 650 nm and 1150 nm. Alternatively, the light source may include a laser diode configured to emit light at a wavelength between about 800 nm and about 1000 nm, between about 850 nm and about 950 nm, or between about 1300 nm and about 1600 nm. Unless indicated otherwise, the term "about" with regards to a numeric value is defined as a variance of up to 5% with respect to the stated value. Additional details on the projecting unit and the at least one light source are described below with reference to FIGS. 2A-2C.

Consistent with disclosed embodiments, the LIDAR system may include at least one scanning unit with at least one light deflector configured to deflect light from the light source in order to scan the field of view. The term "light deflector" broadly includes any mechanism or module which is configured to make light deviate from its original path; for example, a mirror, a prism, controllable lens, a mechanical mirror, mechanical scanning polygons, active diffraction (e.g. controllable LCD), Risley prisms, non-mechanical-electro-optical beam steering (such as made by Vscent), polarization grating (such as offered by Boulder Non-Linear Systems), optical phased array (OPA), and more. In one embodiment, a light deflector may include a plurality of optical components, such as at least one reflecting element (e.g. a mirror), at least one refracting element (e.g. a prism, a lens), and so on. In one example, the light deflector may be movable, to cause light deviate to differing degrees (e.g. discrete degrees, or over a continuous span of degrees). The light deflector may optionally be controllable in different ways (e.g. deflect to a degree α, change deflection angle by Δα, move a component of the light deflector by M millimeters, change speed in which the deflection angle changes). In addition, the light deflector may optionally be operable to change an angle of deflection within a single plane (e.g., θ coordinate). The light deflector may optionally be operable to change an angle of deflection within two non-parallel planes (e.g., θ and φ coordinates). Alternatively or in addition, the light deflector may optionally be operable to change an angle of deflection between predetermined settings (e.g. along a predefined scanning route) or otherwise. With respect the use of light deflectors in LIDAR systems, it is noted that a light deflector may be used in the outbound direction (also referred to as transmission direction, or TX) to deflect light from the light source to at least a part of the field of view. However, a light deflector may also be used in the inbound direction (also referred to as reception direction, or RX) to deflect light from at least a part of the field of view to one or more light sensors. Additional details on the scanning unit and the at least one light deflector are described below with reference to FIGS. 3A-3C.

Disclosed embodiments may involve pivoting the light deflector in order to scan the field of view. As used herein the term "pivoting" broadly includes rotating of an object (especially a solid object) about one or more axis of rotation, while substantially maintaining a center of rotation fixed. In one embodiment, the pivoting of the light deflector may include rotation of the light deflector about a fixed axis (e.g., a shaft), but this is not necessarily so. For example, in some MEMS mirror implementation, the MEMS mirror may move by actuation of a plurality of benders connected to the mirror, the mirror may experience some spatial translation in addition to rotation. Nevertheless, such mirror may be designed to rotate about a substantially fixed axis, and therefore consistent with the present disclosure it considered to be pivoted. In other embodiments, some types of light deflectors (e.g. non-mechanical-electro-optical beam steering, OPA) do not require any moving components or internal movements in order to change the deflection angles of deflected light. It is noted that any discussion relating to moving or pivoting a light deflector is also mutatis mutandis applicable to controlling the light deflector such that it changes a deflection behavior of the light deflector. For example, controlling the light deflector may cause a change in a deflection angle of beams of light arriving from at least one direction.

Disclosed embodiments may involve receiving reflections associated with a portion of the field of view corresponding to a single instantaneous position of the light deflector. As used herein, the term "instantaneous position of the light deflector" (also referred to as "state of the light deflector") broadly refers to the location or position in space where at least one controlled component of the light deflector is situated at an instantaneous point in time, or over a short span of time. In one embodiment, the instantaneous position of light deflector may be gauged with respect to a frame of reference. The frame of reference may pertain to at least one fixed point in the LIDAR system. Or, for example, the frame of reference may pertain to at least one fixed point in the scene. In some embodiments, the instantaneous position of the light deflector may include some movement of one or more components of the light deflector (e.g. mirror, prism), usually to a limited degree with respect to the maximal degree of change during a scanning of the field of view. For example, a scanning of the entire the field of view of the LIDAR system may include changing deflection of light over a span of 30°, and the instantaneous position of the at least one light deflector may include angular shifts of the light deflector within 0.05°. In other embodiments, the term "instantaneous position of the light deflector" may refer to the positions of the light deflector during acquisition of light which is processed to provide data for a single point of a point cloud (or another type of 3D model) generated by the LIDAR system. In some embodiments, an instantaneous position of the light deflector may correspond with a fixed position or orientation in which the deflector pauses for a short time during illumination of a particular sub-region of the LIDAR field of view. In other cases, an instantaneous position of the light deflector may correspond with a certain position/orientation along a scanned range of positions/orientations of the light deflector that the light deflector passes through as part of a continuous or semi-continuous scan of the LIDAR field of view. In some embodiments, the light deflector may be moved such that during a scanning cycle of the LIDAR FOV the light deflector is located at a plurality of different instantaneous positions. In other words, during the period of time in which a scanning cycle occurs, the deflector may be moved through a series of different instantaneous positions/orientations, and the deflector may reach each different instantaneous position/orientation at a different time during the scanning cycle.

Consistent with disclosed embodiments, the LIDAR system may include at least one sensing unit with at least one sensor configured to detect reflections from objects in the field of view. The term "sensor" broadly includes any device, element, or system capable of measuring properties (e.g., power, frequency, phase, pulse timing, pulse duration) of electromagnetic waves and to generate an output relating to the measured properties. In some embodiments, the at least one sensor may include a plurality of detectors constructed from a plurality of detecting elements. The at least one sensor may include light sensors of one or more types. It is noted that the at least one sensor may include multiple sensors of the same type which may differ in other characteristics (e.g., sensitivity, size). Other types of sensors may also be used. Combinations of several types of sensors can be used for different reasons, such as improving detection over a span of ranges (especially in close range); improving the dynamic range of the sensor; improving the temporal response of the sensor; and improving detection in varying environmental conditions (e.g. atmospheric temperature, rain, etc.). In one embodiment, the at least one sensor includes a SiPM (Silicon photomultipliers) which is a solid-state single-photon-sensitive device built from an array of avalanche photodiode (APD), single photon avalanche diode (SPAD), serving as detection elements on a common silicon substrate. In one example, a typical distance between SPADs may be between about 10 µm and about 50 µm, wherein each SPAD may have a recovery time of between about 20 ns and about 100 ns. Similar photomultipliers from other, non-silicon materials may also be used. Although a SiPM device works in digital/switching mode, the SiPM is an analog device because all the microcells may be read in parallel, making it possible to generate signals within a dynamic range from a single photon to hundreds and thousands of photons detected by the different SPADs. It is noted that outputs from different types of sensors (e.g., SPAD, APD, SiPM, PIN diode, Photodetector) may be combined together to a single output which may be processed by a processor of the LIDAR system. Additional details on the sensing unit and the at least one sensor are described below with reference to FIGS. 4A-4C.

Consistent with disclosed embodiments, the LIDAR system may include or communicate with at least one processor configured to execute differing functions. The at least one processor may constitute any physical device having an electric circuit that performs a logic operation on input or inputs. For example, the at least one processor may include one or more integrated circuits (IC), including Application-specific integrated circuit (ASIC), microchips, microcontrollers, microprocessors, all or part of a central processing unit (CPU), graphics processing unit (GPU), digital signal processor (DSP), field-programmable gate array (FPGA), or other circuits suitable for executing instructions or performing logic operations. The instructions executed by at least one processor may, for example, be pre-loaded into a memory integrated with or embedded into the controller or may be stored in a separate memory. The memory may comprise a Random Access Memory (RAM), a Read-Only Memory (ROM), a hard disk, an optical disk, a magnetic medium, a flash memory, other permanent, fixed, or volatile memory, or any other mechanism capable of storing instructions. In some embodiments, the memory is configured to store information representative data about objects in the environment of the LIDAR system. In some embodiments, the at least one processor may include more than one processor. Each processor may have a similar construction or the processors may be of differing constructions that are electrically connected or disconnected from each other. For example, the processors may be separate circuits or integrated in a single circuit. When more than one processor is used, the processors may be configured to operate independently or collaboratively. The processors may be coupled electrically, magnetically, optically, acoustically, mechanically or by other means that permit them to interact. Additional details on the processing unit and the at least one processor are described below with reference to FIGS. 5A-5C.

System Overview

FIG. 1A illustrates a LIDAR system 100 including a projecting unit 102, a scanning unit 104, a sensing unit 106, and a processing unit 108. LIDAR system 100 may be mountable on a vehicle 110. Consistent with embodiments of the present disclosure, projecting unit 102 may include at least one light source 112, scanning unit 104 may include at least one light deflector 114, sensing unit 106 may include at least one sensor 116, and processing unit 108 may include at least one processor 118. In one embodiment, at least one processor 118 may be configured to coordinate operation of the at least one light source 112 with the movement of at least one light deflector 114 in order to scan a field of view 120. During a scanning cycle, each instantaneous position of at least one light deflector 114 may be associated with a particular portion 122 of field of view 120. In addition, LIDAR system 100 may include at least one optional optical window 124 for directing light projected towards field of view 120 and/or receiving light reflected from objects in field of view 120. Optional optical window 124 may serve different purposes, such as collimation of the projected light and focusing of the reflected light. In one embodiment, optional optical window 124 may be an opening, a flat window, a lens, or any other type of optical window.

Consistent with the present disclosure, LIDAR system 100 may be used in autonomous or semi-autonomous road-vehicles (for example, cars, buses, vans, trucks and any other terrestrial vehicle). Autonomous road-vehicles with LIDAR system 100 may scan their environment and drive to a destination vehicle without human input. Similarly, LIDAR system 100 may also be used in autonomous/semi-autonomous aerial-vehicles (for example, UAV, drones, quadcopters, and any other airborne vehicle or device); or in an autonomous or semi-autonomous water vessel (e.g., boat, ship, submarine, or any other watercraft). Autonomous aerial-vehicles and water craft with LIDAR system 100 may scan their environment and navigate to a destination autonomously or using a remote human operator. According to one embodiment, vehicle 110 (either a road-vehicle, aerial-vehicle, or watercraft) may use LIDAR system 100 to aid in detecting and scanning the environment in which vehicle 110 is operating.

It should be noted that LIDAR system 100 or any of its components may be used together with any of the example embodiments and methods disclosed herein. Further, while some aspects of LIDAR system 100 are described relative to an exemplary vehicle-based LIDAR platform, LIDAR system 100, any of its components, or any of the processes described herein may be applicable to LIDAR systems of other platform types.

In some embodiments, LIDAR system 100 may include one or more scanning units 104 to scan the environment around vehicle 110. LIDAR system 100 may be attached or mounted to any part of vehicle 110. Sensing unit 106 may receive reflections from the surroundings of vehicle 110, and transfer reflections signals indicative of light reflected from objects in field of view 120 to processing unit 108. Consistent with the present disclosure, scanning units 104 may be mounted to or incorporated into a bumper, a fender, a side panel, a spoiler, a roof, a headlight assembly, a taillight assembly, a rear-view mirror assembly, a hood, a trunk or any other suitable part of vehicle 110 capable of housing at least a portion of the LIDAR system. In some cases, LIDAR system 100 may capture a complete surround view of the environment of vehicle 110. Thus, LIDAR system 100 may have a 360-degree horizontal field of view. In one example, as shown in FIG. 1A, LIDAR system 100 may include a single scanning unit 104 mounted on a roof vehicle 110. Alternatively, LIDAR system 100 may include multiple scanning units (e.g., two, three, four, or more scanning units 104) each with a field of few such that in the aggregate the horizontal field of view is covered by a 360-degree scan around vehicle 110. One skilled in the art will appreciate that LIDAR system 100 may include any number of scanning units 104 arranged in any manner, each with an 80° to 120° field of view or less, depending on the number of units employed. Moreover, a 360-degree horizontal field of view may be also obtained by mounting a multiple LIDAR systems 100 on vehicle 110, each with a single scanning unit 104. It is nevertheless noted, that the one or more LIDAR systems 100 do not have to provide a complete 360° field of view, and that narrower fields of view may be useful in some situations. For example, vehicle 110 may require a first LIDAR system 100 having an field of view of 75° looking ahead of the vehicle, and possibly a second LIDAR system 100 with a similar FOV looking backward (optionally with a lower detection range). It is also noted that different vertical field of view angles may also be implemented.

Figure 1B:
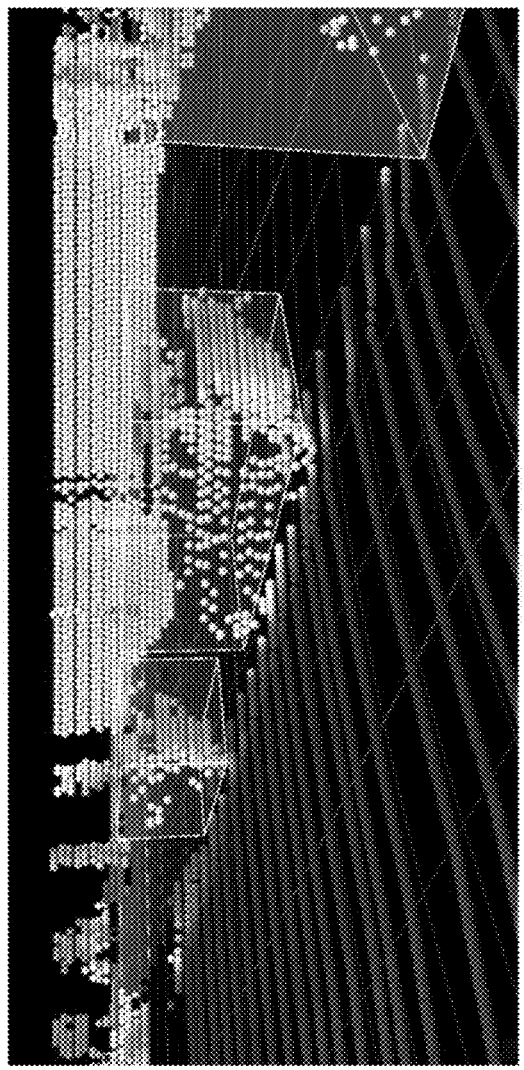
FIG. 1B is an image showing an exemplary output of single scanning cycle of a LIDAR system mounted on a vehicle consistent with disclosed embodiments.

FIG. 1B is an image showing an exemplary output from a single scanning cycle of LIDAR system 100 mounted on vehicle 110 consistent with disclosed embodiments. In this example, scanning unit 104 is incorporated into a right headlight assembly of vehicle 110. Every gray dot in the image corresponds to a location in the environment around vehicle 110 determined from reflections detected by sensing unit 106. In addition to location, each gray dot may also be associated with different types of information, for example, intensity (e.g., how much light returns back from that location), reflectivity, proximity to other dots, and more. In one embodiment, LIDAR system 100 may generate a plurality of point-cloud data entries from detected reflections of multiple scanning cycles of the field of view to enable, for example, determining a point cloud model of the environment around vehicle 110.

Figure 1C:
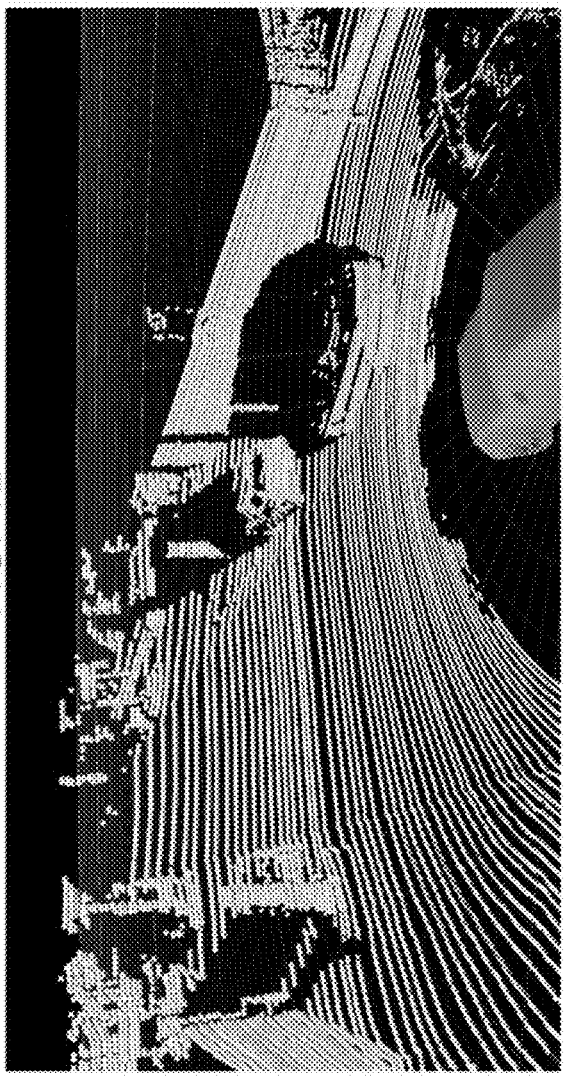
FIG. 1C is another image showing a representation of a point cloud model determined from output of a LIDAR system consistent with disclosed embodiments.

FIG. 1C is an image showing a representation of the point cloud model determined from the output of LIDAR system 100. Consistent with disclosed embodiments, by processing the generated point-cloud data entries of the environment around vehicle 110, a surround-view image may be produced from the point cloud model. In one embodiment, the point cloud model may be provided to a feature extraction module, which processes the point cloud information to identify a plurality of features. Each feature may include data about different aspects of the point cloud and/or of objects in the environment around vehicle 110 (e.g. cars, trees, people, and roads). Features may have the same resolution of the point cloud model (i.e. having the same number of data points, optionally arranged into similar sized 2D arrays), or may have different resolutions. The features may be stored in any kind of data structure (e.g. raster, vector, 2D array, 1D array). In addition, virtual features, such as a representation of vehicle 110, border lines, or bounding boxes separating regions or objects in the image (e.g., as depicted in FIG. 1B), and icons representing one or more identified objects, may be overlaid on the representation of the point cloud model to form the final surround-view image. For example, a symbol of vehicle 110 may be overlaid at a center of the surround-view image.

The Projecting Unit

Figure 2A:
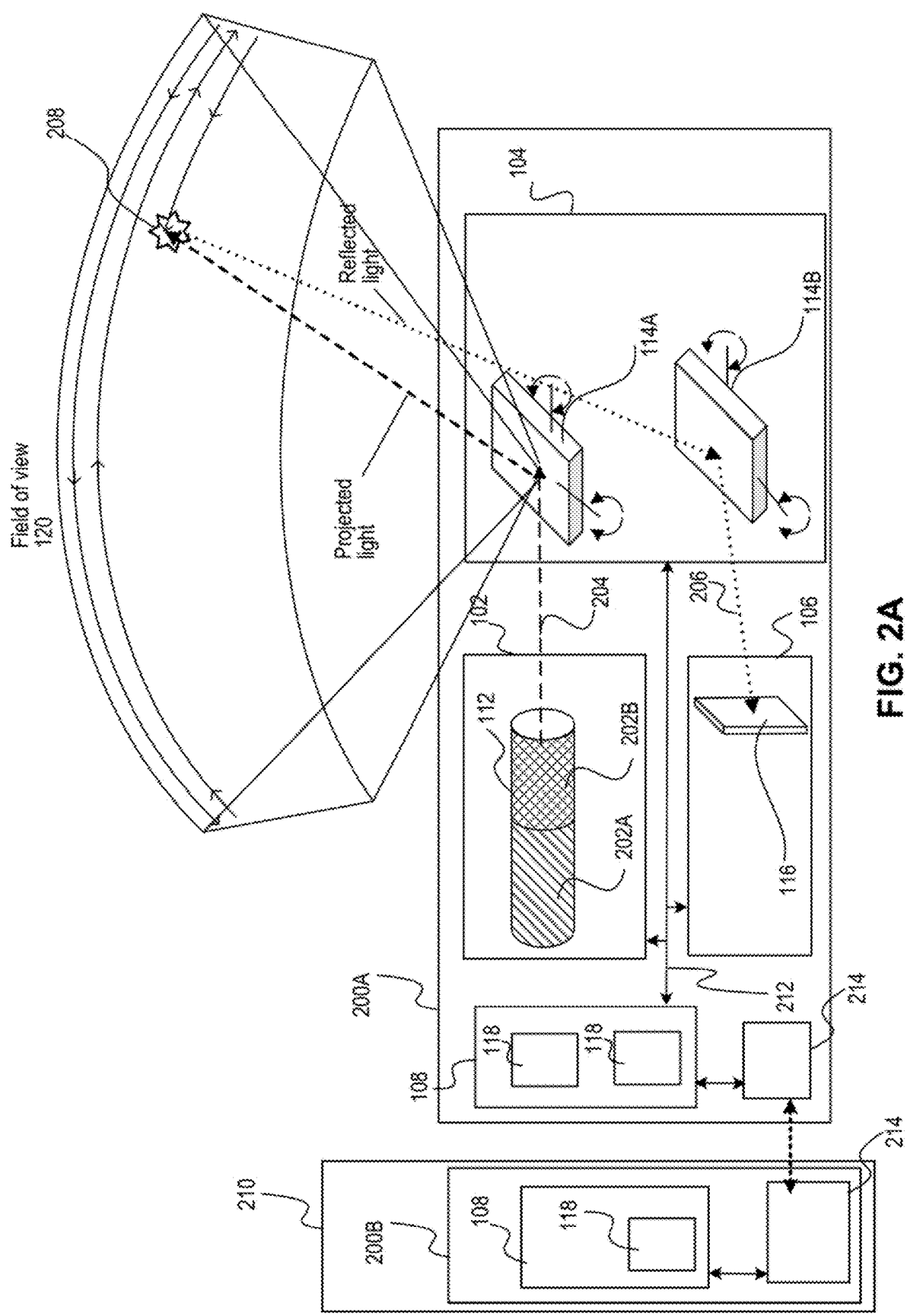
FIGS. 2A, 2B, 2C, 2D, 2E, 2F, and 2G are diagrams illustrating different configurations of projecting units in accordance with some embodiments of the present disclosure.
Figure 2B:
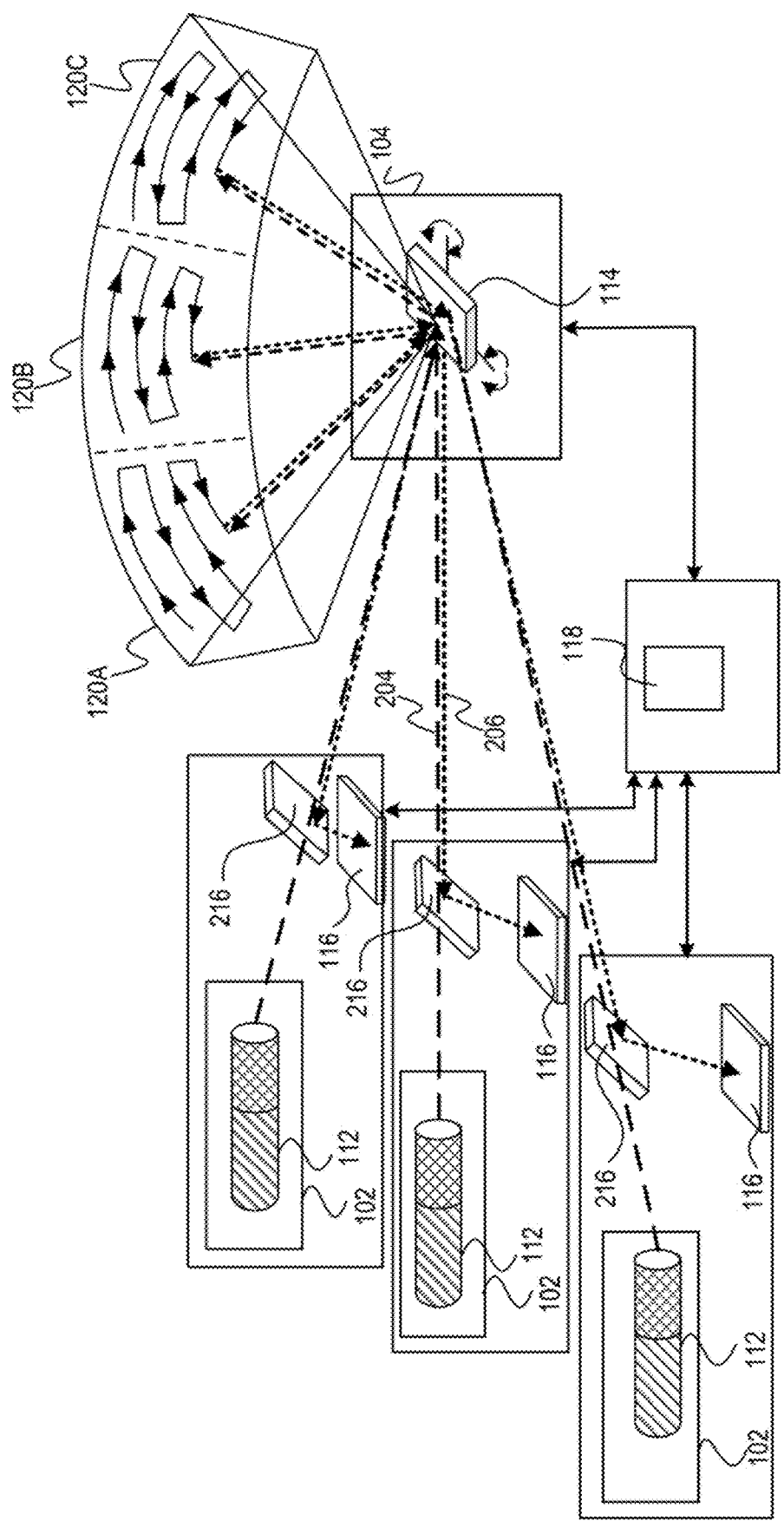
Figure 2C:
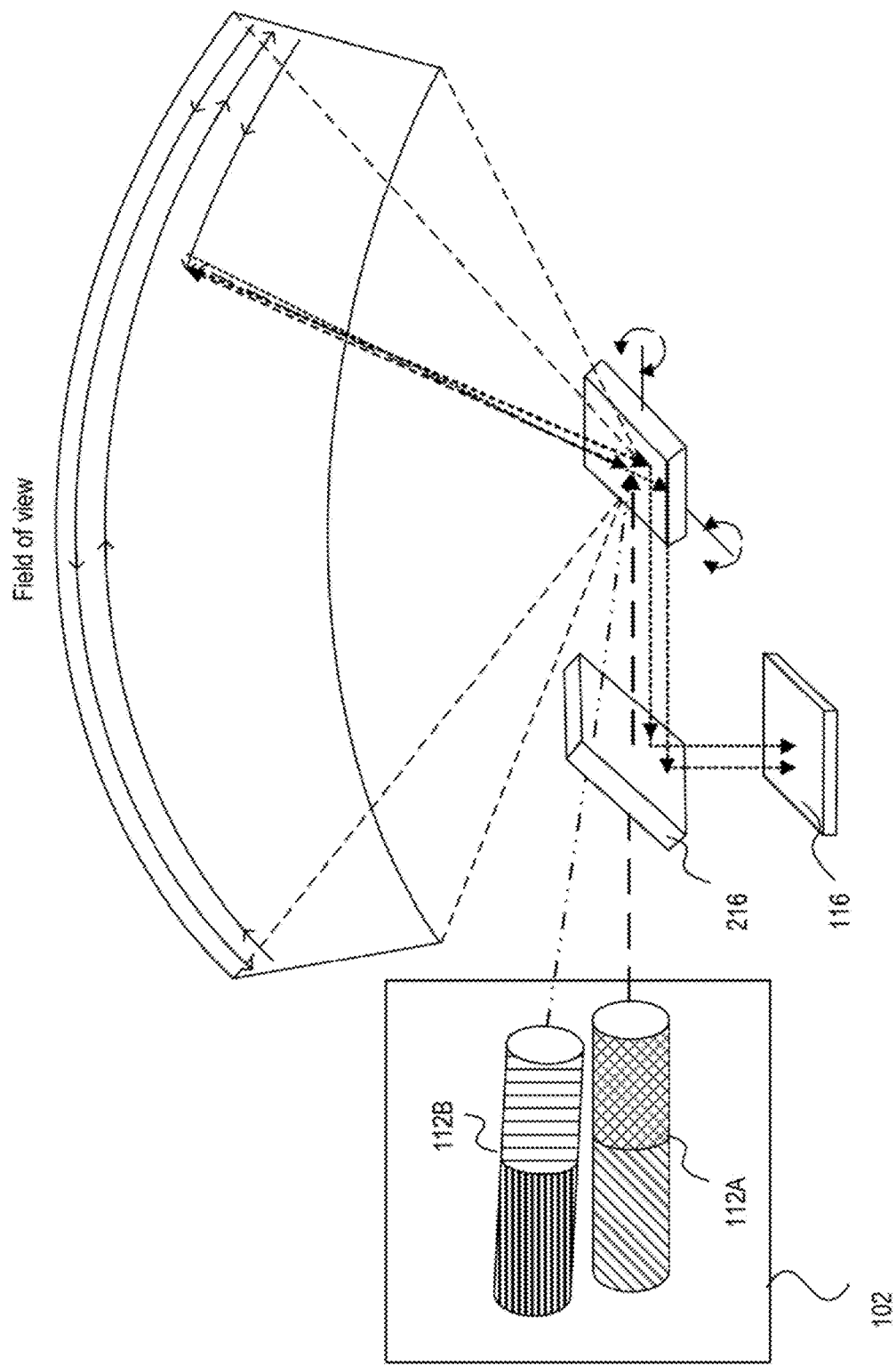
Figure 2D:
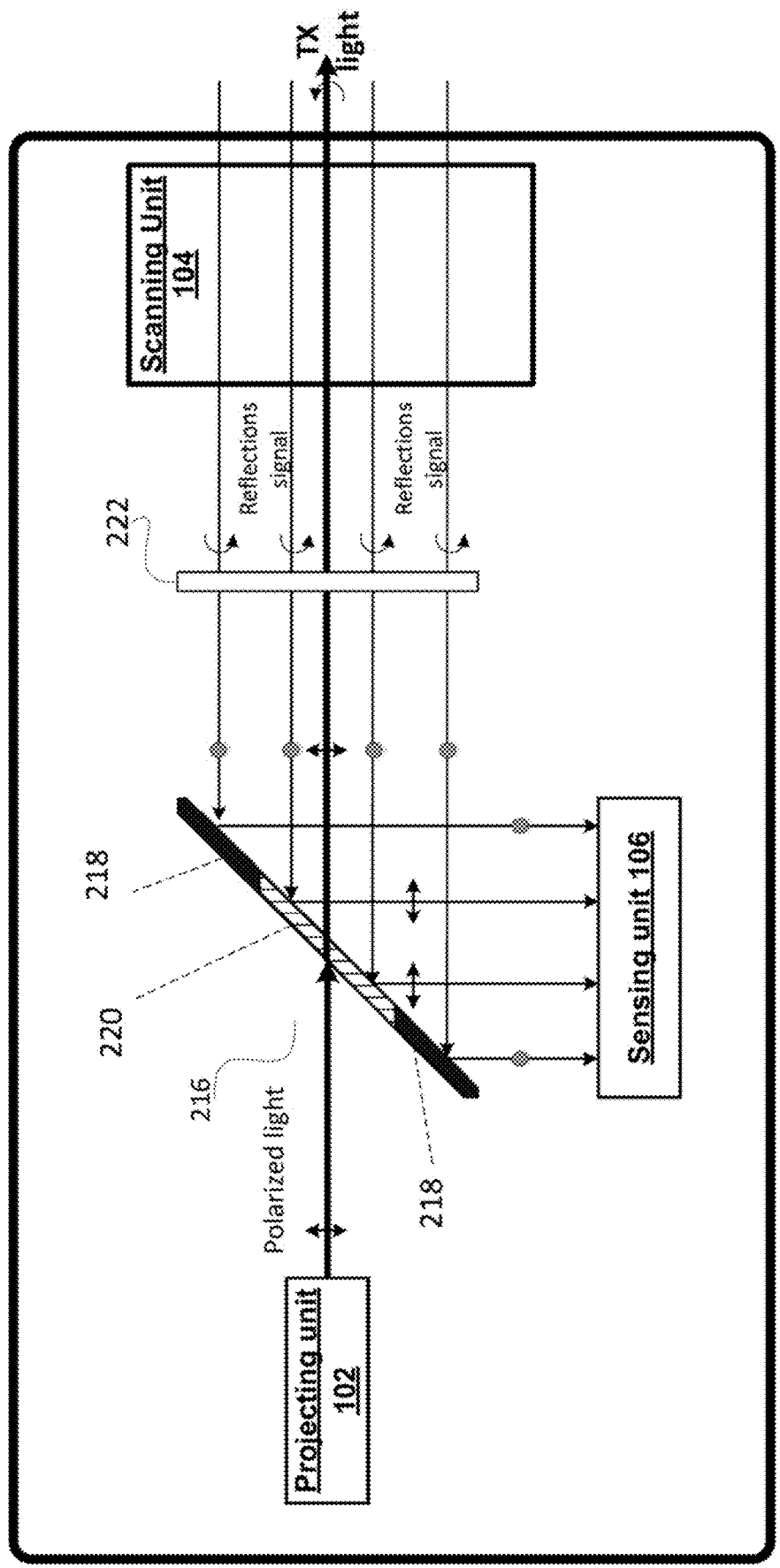
Figure 2E:
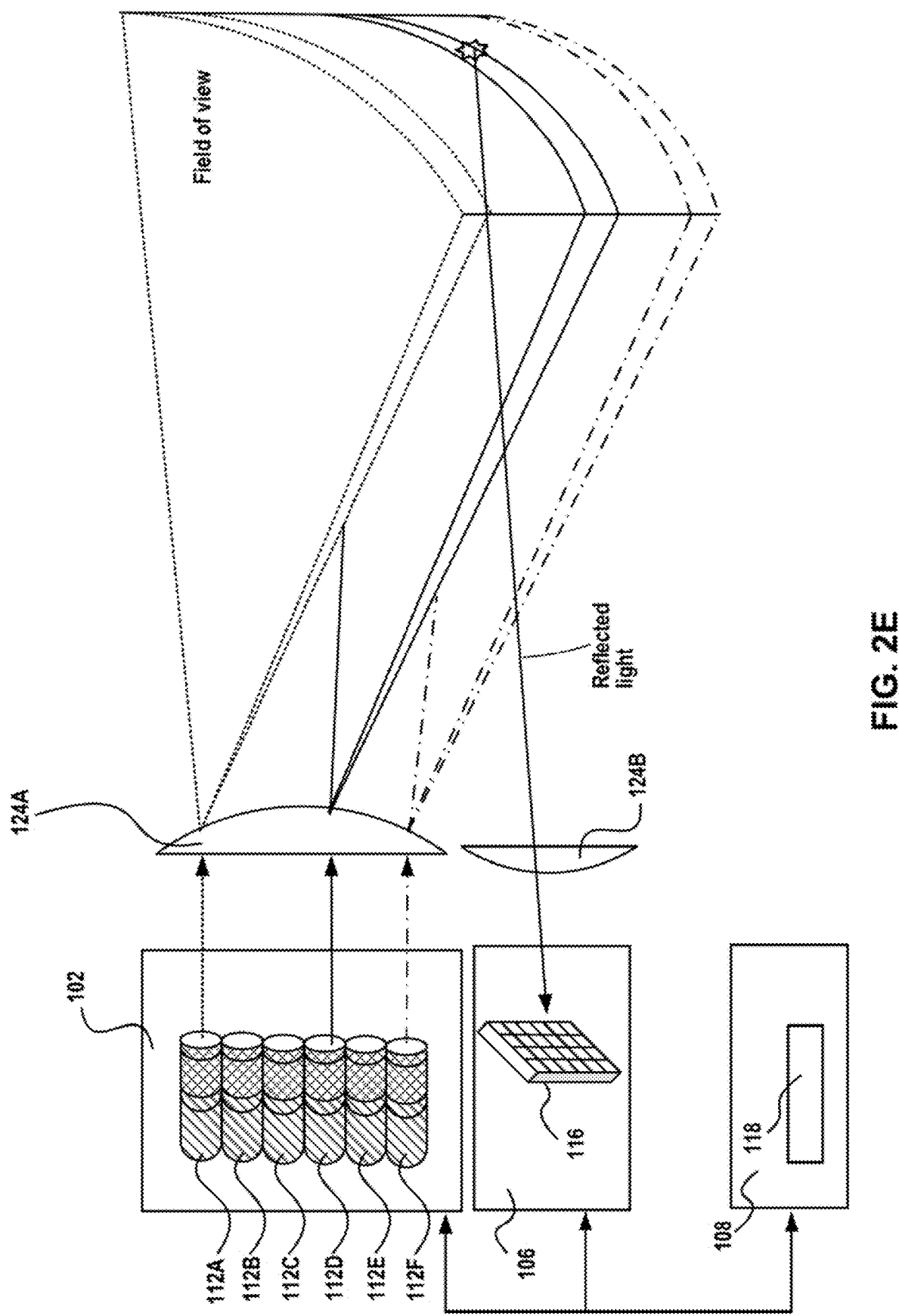
Figure 2F:
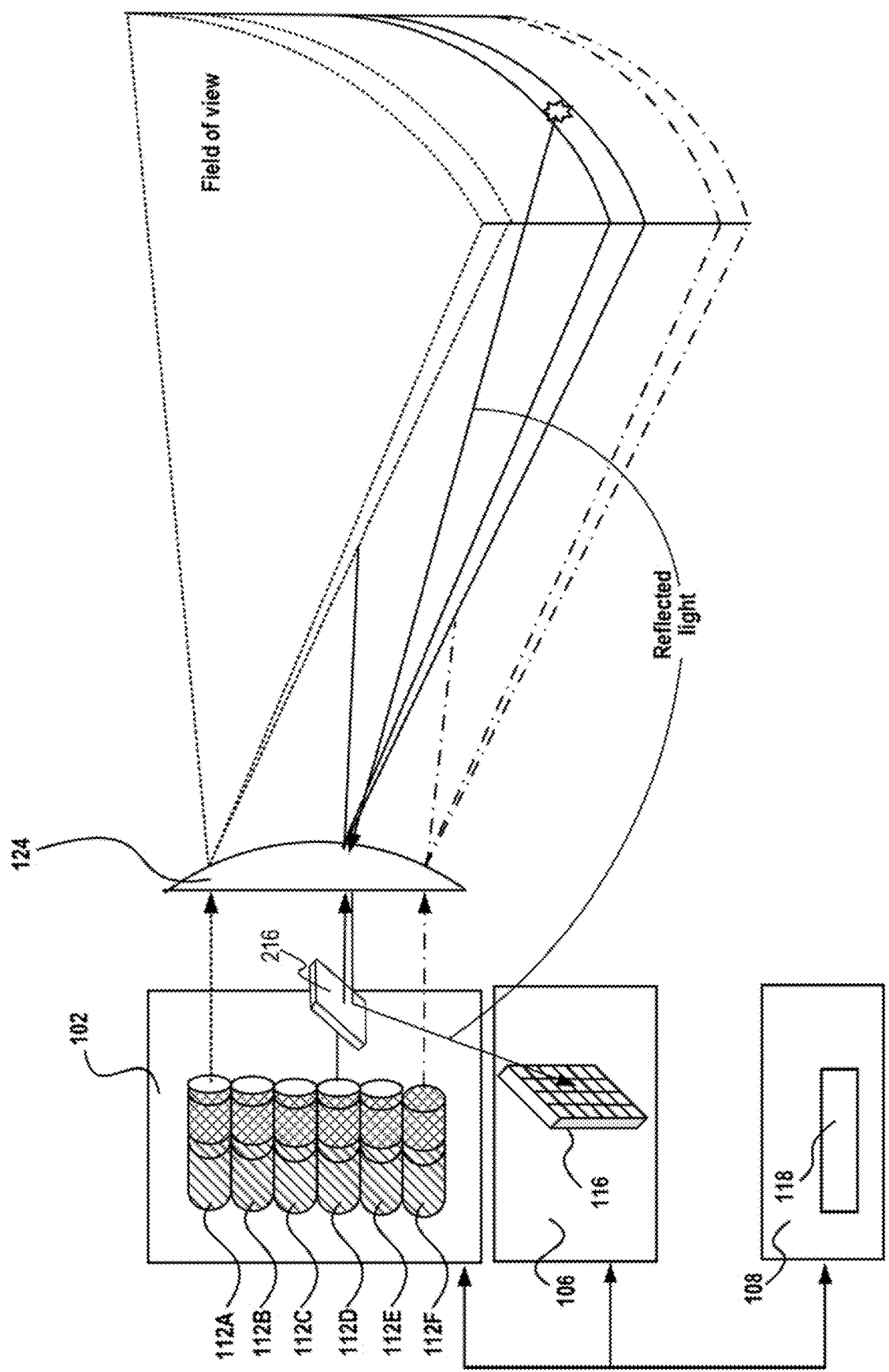
Figure 2G:
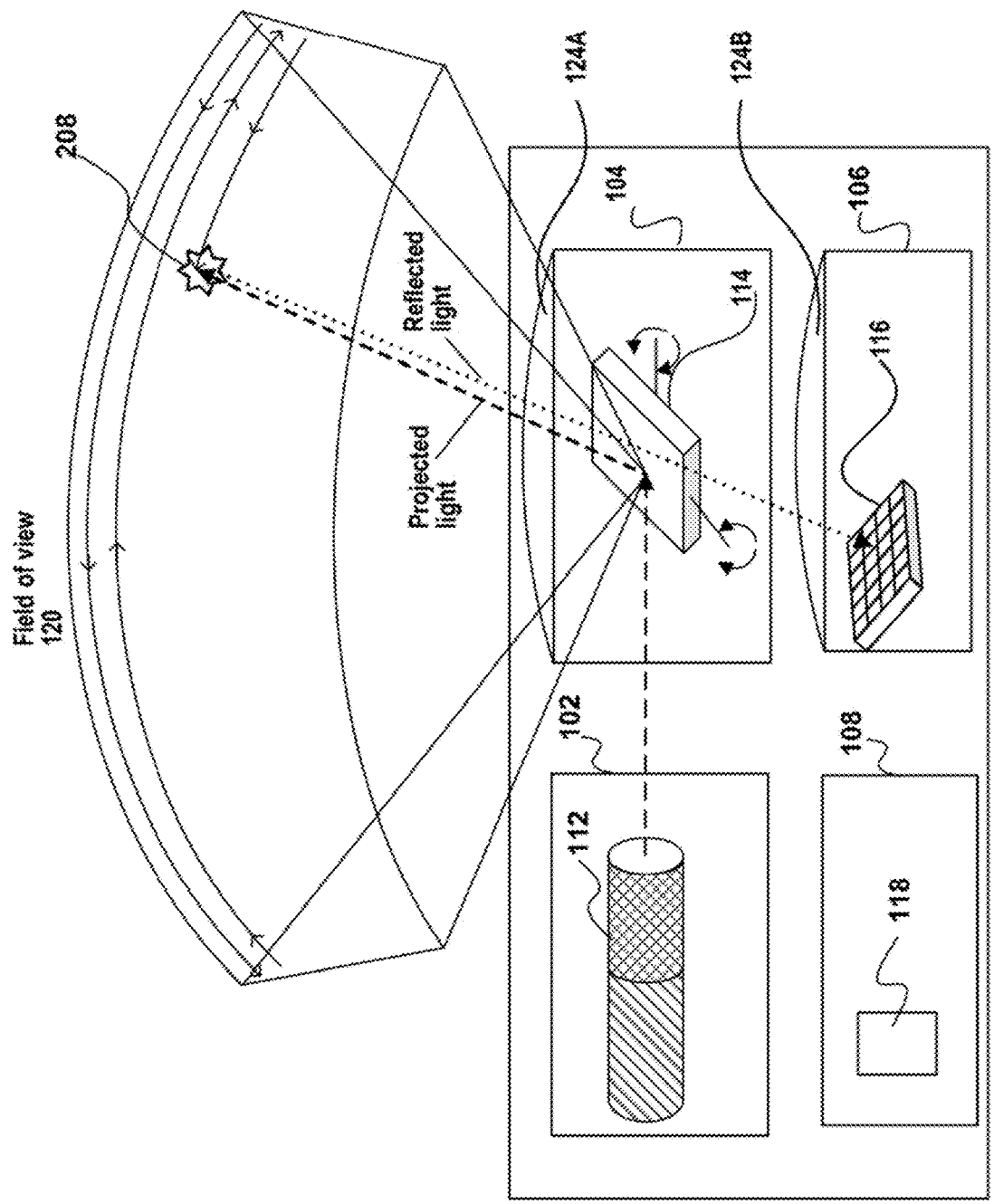

FIGS. 2A-2G depict various configurations of projecting unit 102 and its role in LIDAR system 100. Specifically, FIG. 2A is a diagram illustrating projecting unit 102 with a single light source; FIG. 2B is a diagram illustrating a plurality of projecting units 102 with a plurality of light sources aimed at a common light deflector 114; FIG. 2C is a diagram illustrating projecting unit 102 with a primary and a secondary light sources 112; FIG. 2D is a diagram illustrating an asymmetrical deflector used in some configurations of projecting unit 102; FIG. 2E is a diagram illustrating a first configuration of a non-scanning LIDAR system; FIG. 2F is a diagram illustrating a second configuration of a non-scanning LIDAR system; and FIG. 2G is a diagram illustrating a LIDAR system that scans in the outbound direction and does not scan in the inbound direction. One skilled in the art will appreciate that the depicted configurations of projecting unit 102 may have numerous variations and modifications.

FIG. 2A illustrates an example of a bi-static configuration of LIDAR system 100 in which projecting unit 102 includes a single light source 112. The term "bi-static configuration" broadly refers to LIDAR systems configurations in which the projected light exiting the LIDAR system and the reflected light entering the LIDAR system pass through substantially different optical paths. In some embodiments, a bi-static configuration of LIDAR system 100 may include a separation of the optical paths by using completely different optical components, by using parallel but not fully separated optical components, or by using the same optical components for only part of the of the optical paths (optical components may include, for example, windows, lenses, mirrors, beam splitters, etc.). In the example depicted in FIG. 2A, the bi-static configuration includes a configuration where the outbound light and the inbound light pass through a single optical window 124 but scanning unit 104 includes two light deflectors, a first light deflector 114A for outbound light and a second light deflector 114B for inbound light (the inbound light in LIDAR system includes emitted light reflected from objects in the scene, and may also include ambient light arriving from other sources). In the examples depicted in FIGS. 2E and 2G, the bi-static configuration includes a configuration where the outbound light passes through a first optical window 124A, and the inbound light passes through a second optical window 124B. In all the example configurations above, the inbound and outbound optical paths differ from one another.

In this embodiment, all the components of LIDAR system 100 may be contained within a single housing 200, or may be divided among a plurality of housings. As shown, projecting unit 102 is associated with a single light source 112 that includes a laser diode 202A (or one or more laser diodes coupled together) configured to emit light (projected light 204). In one non-limiting example, the light projected by light source 112 may be at a wavelength between about 800 nm and 950 nm, have an average power between about 50 mW and about 500 mW, have a peak power between about 50 W and about 200 W, and a pulse width of between about 2 ns and about 100 ns. In addition, light source 112 may optionally be associated with optical assembly 202B used for manipulation of the light emitted by laser diode 202A (e.g. for collimation, focusing, etc.). It is noted that other types of light sources 112 may be used, and that the disclosure is not restricted to laser diodes. In addition, light source 112 may emit its light in different formats, such as light pulses, frequency modulated, continuous wave (CW), quasi-CW, or any other form corresponding to the particular light source employed. The projection format and other parameters may be changed by the light source from time to time based on different factors, such as instructions from processing unit 108. The projected light is projected towards an outbound deflector 114A that functions as a steering element for directing the projected light in field of view 120. In this example, scanning unit 104 also include a pivotable return deflector 114B that direct photons (reflected light 206) reflected back from an object 208 within field of view 120 toward sensor 116. The reflected light is detected by sensor 116 and information about the object (e.g., the distance to object 212) is determined by processing unit 108.

In this figure, LIDAR system 100 is connected to a host 210. Consistent with the present disclosure, the term "host" refers to any computing environment that may interface with LIDAR system 100, it may be a vehicle system (e.g., part of vehicle 110), a testing system, a security system, a surveillance system, a traffic control system, an urban modelling system, or any system that monitors its surroundings. Such computing environment may include at least one processor and/or may be connected LIDAR system 100 via the cloud. In some embodiments, host 210 may also include interfaces to external devices such as camera and sensors configured to measure different characteristics of host 210 (e.g., acceleration, steering wheel deflection, reverse drive, etc.). Consistent with the present disclosure, LIDAR system 100 may be fixed to a stationary object associated with host 210 (e.g. a building, a tripod) or to a portable system associated with host 210 (e.g., a portable computer, a movie camera). Consistent with the present disclosure, LIDAR system 100 may be connected to host 210, to provide outputs of LIDAR system 100 (e.g., a 3D model, a reflectivity image) to host 210. Specifically, host 210 may use LIDAR system 100 to aid in detecting and scanning the environment of host 210 or any other environment. In addition, host 210 may integrate, synchronize or otherwise use together the outputs of LIDAR system 100 with outputs of other sensing systems (e.g. cameras, microphones, radar systems). In one example, LIDAR system 100 may be used by a security system.

LIDAR system 100 may also include a bus 212 (or other communication mechanisms) that interconnect subsystems and components for transferring information within LIDAR system 100. Optionally, bus 212 (or another communication mechanism) may be used for interconnecting LIDAR system 100 with host 210. In the example of FIG. 2A, processing unit 108 includes two processors 118 to regulate the operation of projecting unit 102, scanning unit 104, and sensing unit 106 in a coordinated manner based, at least partially, on information received from internal feedback of LIDAR system 100. In other words, processing unit 108 may be configured to dynamically operate LIDAR system 100 in a closed loop. A closed loop system is characterized by having feedback from at least one of the elements and updating one or more parameters based on the received feedback. Moreover, a closed loop system may receive feedback and update its own operation, at least partially, based on that feedback. A dynamic system or element is one that may be updated during operation.

According to some embodiments, scanning the environment around LIDAR system 100 may include illuminating field of view 120 with light pulses. The light pulses may have parameters such as: pulse duration, pulse angular dispersion, wavelength, instantaneous power, photon density at different distances from light source 112, average power, pulse power intensity, pulse width, pulse repetition rate, pulse sequence, pulse duty cycle, wavelength, phase, polarization, and more. Scanning the environment around LIDAR system 100 may also include detecting and characterizing various aspects of the reflected light. Characteristics of the reflected light may include, for example: time-of-flight (i.e., time from emission until detection), instantaneous power (e.g., power signature), average power across entire return pulse, and photon distribution/signal over return pulse period. By comparing characteristics of a light pulse with characteristics of corresponding reflections, a distance and possibly a physical characteristic, such as reflected intensity of object 212 may be estimated. By repeating this process across multiple adjacent portions 122, in a predefined pattern (e.g., raster, Lissajous or other patterns) an entire scan of field of view 120 may be achieved. As discussed below in greater detail, in some situations LIDAR system 100 may direct light to only some of the portions 122 in field of view 120 at every scanning cycle. These portions may be adjacent to each other, but not necessarily so.

In another embodiment, LIDAR system 100 may include network interface 214 for communicating with host 210 (e.g., a vehicle controller). The communication between LIDAR system 100 and host 210 is represented by a dashed arrow. In one embodiment, network interface 214 may include an integrated service digital network (ISDN) card, cable modem, satellite modem, or a modem to provide a data communication connection to a corresponding type of telephone line. As another example, network interface 214 may include a local area network (LAN) card to provide a data communication connection to a compatible LAN. In another embodiment, network interface 214 may include an Ethernet port connected to radio frequency receivers and transmitters and/or optical (e.g., infrared) receivers and transmitters. The specific design and implementation of network interface 214 depends on the communications network(s) over which LIDAR system 100 and host 210 are intended to operate. For example, network interface 214 may be used, for example, to provide outputs of LIDAR system 100 to the external system, such as a 3D model, operational parameters of LIDAR system 100, and so on. In other embodiment, the communication unit may be used, for example, to receive instructions from the external system, to receive information regarding the inspected environment, to receive information from another sensor, etc.

FIG. 2B illustrates an example of a monostatic configuration of LIDAR system 100 including a plurality projecting units 102. The term "monostatic configuration" broadly refers to LIDAR system configurations in which the projected light exiting from the LIDAR system and the reflected light entering the LIDAR system pass through substantially similar optical paths. In one example, the outbound light beam and the inbound light beam may share at least one optical assembly through which both outbound and inbound light beams pass. In another example, the outbound light may pass through an optical window (not shown) and the inbound light radiation may pass through the same optical window. A monostatic configuration may include a configuration where the scanning unit 104 includes a single light deflector 114 that directs the projected light towards field of view 120 and directs the reflected light towards a sensor 116. As shown, both projected light 204 and reflected light 206 hits an asymmetrical deflector 216. The term "asymmetrical deflector" refers to any optical device having two sides capable of deflecting a beam of light hitting it from one side in a different direction than it deflects a beam of light hitting it from the second side. In one example, the asymmetrical deflector does not deflect projected light 204 and deflects reflected light 206 towards sensor 116. One example of an asymmetrical deflector may include a polarization beam splitter. In another example, asymmetrical 216 may include an optical isolator that allows the passage of light in only one direction. A diagrammatic representation of asymmetrical deflector 216 is illustrated in FIG. 2D. Consistent with the present disclosure, a monostatic configuration of LIDAR system 100 may include an asymmetrical deflector to prevent reflected light from hitting light source 112, and to direct all the reflected light toward sensor 116, thereby increasing detection sensitivity.

In the embodiment of FIG. 2B, LIDAR system 100 includes three projecting units 102 each with a single of light source 112 aimed at a common light deflector 114. In one embodiment, the plurality of light sources 112 (including two or more light sources) may project light with substantially the same wavelength and each light source 112 is generally associated with a differing area of the field of view (denoted in the figure as 120A, 120B, and 120C). This enables scanning of a broader field of view than can be achieved with a light source 112. In another embodiment, the plurality of light sources 102 may project light with differing wavelengths, and all the light sources 112 may be directed to the same portion (or overlapping portions) of field of view 120.

FIG. 2C illustrates an example of LIDAR system 100 in which projecting unit 102 includes a primary light source 112A and a secondary light source 112B. Primary light source 112A may project light with a longer wavelength than is sensitive to the human eye in order to optimize SNR and detection range. For example, primary light source 112A may project light with a wavelength between about 750 nm and 1100 nm. In contrast, secondary light source 112B may project light with a wavelength visible to the human eye. For example, secondary light source 112B may project light with a wavelength between about 400 nm and 700 nm. In one embodiment, secondary light source 112B may project light along substantially the same optical path the as light projected by primary light source 112A. Both light sources may be time-synchronized and may project light emission together or in interleaved pattern. An interleave pattern means that the light sources are not active at the same time which may mitigate mutual interference. A person who is of skill in the art would readily see that other combinations of wavelength ranges and activation schedules may also be implemented.

Consistent with some embodiments, secondary light source 112B may cause human eyes to blink when it is too close to the LIDAR optical output port. This may ensure an eye safety mechanism not feasible with typical laser sources that utilize the near-infrared light spectrum. In another embodiment, secondary light source 112B may be used for calibration and reliability at a point of service, in a manner somewhat similar to the calibration of headlights with a special reflector/pattern at a certain height from the ground with respect to vehicle 110. An operator at a point of service could examine the calibration of the LIDAR by simple visual inspection of the scanned pattern over a featured target such a test pattern board at a designated distance from LIDAR system 100. In addition, secondary light source 112B may provide means for operational confidence that the LIDAR is working for the end-user. For example, the system may be configured to permit a human to place a hand in front of light deflector 114 to test its operation.

Secondary light source 112B may also have a non-visible element that can double as a backup system in case primary light source 112A fails. This feature may be useful for fail-safe devices with elevated functional safety ratings. Given that secondary light source 112B may be visible and also due to reasons of cost and complexity, secondary light source 112B may be associated with a smaller power compared to primary light source 112A. Therefore, in case of a failure of primary light source 112A, the system functionality will fall back to secondary light source 112B set of functionalities and capabilities. While the capabilities of secondary light source 112B may be inferior to the capabilities of primary light source 112A, LIDAR system 100 system may be designed in such a fashion to enable vehicle 110 to safely arrive its destination.

FIG. 2D illustrates asymmetrical deflector 216 that may be part of LIDAR system 100. In the illustrated example, asymmetrical deflector 216 includes a reflective surface 218 (such as a mirror) and a one-way deflector 220. While not necessarily so, asymmetrical deflector 216 may optionally be a static deflector. Asymmetrical deflector 216 may be used in a monostatic configuration of LIDAR system 100, in order to allow a common optical path for transmission and for reception of light via the at least one deflector 114, e.g. as illustrated in FIGS. 2B and 2C. However, typical asymmetrical deflectors such as beam splitters are characterized by energy losses, especially in the reception path, which may be more sensitive to power loses than the transmission path.

As depicted in FIG. 2D, LIDAR system 100 may include asymmetrical deflector 216 positioned in the transmission path, which includes one-way deflector 220 for separating between the transmitted and received light signals. Optionally, one-way deflector 220 may be substantially transparent to the transmission light and substantially reflective to the received light. The transmitted light is generated by projecting unit 102 and may travel through one-way deflector 220 to scanning unit 104 which deflects it towards the optical outlet. The received light arrives through the optical inlet, to the at least one deflecting element 114, which deflects the reflections signal into a separate path away from the light source and towards sensing unit 106. Optionally, asymmetrical deflector 216 may be combined with a polarized light source 112 which is linearly polarized with the same polarization axis as one-way deflector 220. Notably, the cross-section of the outbound light beam is much smaller than that of the reflections signals. Accordingly, LIDAR system 100 may include one or more optical components (e.g. lens, collimator) for focusing or otherwise manipulating the emitted polarized light beam to the dimensions of the asymmetrical deflector 216. In one embodiment, one-way deflector 220 may be a polarizing beam splitter that is virtually transparent to the polarized light beam.

Consistent with some embodiments, LIDAR system 100 may further include optics 222 (e.g., a quarter wave plate retarder) for modifying a polarization of the emitted light. For example, optics 222 may modify a linear polarization of the emitted light beam to circular polarization. Light reflected back to system 100 from the field of view would arrive back through deflector 114 to optics 222, bearing a circular polarization with a reversed handedness with respect to the transmitted light. Optics 222 would then convert the received reversed handedness polarization light to a linear polarization that is not on the same axis as that of the polarized beam splitter 216. As noted above, the received light-patch is larger than the transmitted light-patch, due to optical dispersion of the beam traversing through the distance to the target.

Some of the received light will impinge on one-way deflector 220 that will reflect the light towards sensor 106 with some power loss. However, another part of the received patch of light will fall on a reflective surface 218 which surrounds one-way deflector 220 (e.g., polarizing beam splitter slit). Reflective surface 218 will reflect the light towards sensing unit 106 with substantially zero power loss. One-way deflector 220 would reflect light that is composed of various polarization axes and directions that will eventually arrive at the detector. Optionally, sensing unit 106 may include sensor 116 that is agnostic to the laser polarization, and is primarily sensitive to the amount of impinging photons at a certain wavelength range.

It is noted that the proposed asymmetrical deflector 216 provides far superior performances when compared to a simple mirror with a passage hole in it. In a mirror with a hole, all of the reflected light which reaches the hole is lost to the detector. However, in deflector 216, one-way deflector 220 deflects a significant portion of that light (e.g., about 50%) toward the respective sensor 116. In LIDAR systems, the number photons reaching the LIDAR from remote distances is very limited, and therefore the improvement in photon capture rate is important.

According to some embodiments, a device for beam splitting and steering is described. A polarized beam may be emitted from a light source having a first polarization. The emitted beam may be directed to pass through a polarized beam splitter assembly. The polarized beam splitter assembly includes on a first side a one-directional slit and on an opposing side a mirror. The one-directional slit enables the polarized emitted beam to travel toward a quarter-waveplate/wave-retarder which changes the emitted signal from a polarized signal to a linear signal (or vice versa) so that subsequently reflected beams cannot travel through the one-directional slit.

FIG. 2E shows an example of a bi-static configuration of LIDAR system 100 without scanning unit 104. In order to illuminate an entire field of view (or substantially the entire field of view) without deflector 114, projecting unit 102 may optionally include an array of light sources (e.g., 112A-112F). In one embodiment, the array of light sources may include a linear array of light sources controlled by processor 118. For example, processor 118 may cause the linear array of light sources to sequentially project collimated laser beams towards first optional optical window 124A. First optional optical window 124A may include a diffuser lens for spreading the projected light and sequentially forming wide horizontal and narrow vertical beams. Optionally, some or all of the at least one light source 112 of system 100 may project light concurrently. For example, processor 118 may cause the array of light sources to simultaneously project light beams from a plurality of non-adjacent light sources 112. In the depicted example, light source 112A, light source 112D, and light source 112F simultaneously project laser beams towards first optional optical window 124A thereby illuminating the field of view with three narrow vertical beams. The light beam from fourth light source 112D may reach an object in the field of view. The light reflected from the object may be captured by second optical window 124B and may be redirected to sensor 116. The configuration depicted in FIG. 2E is considered to be a bi-static configuration because the optical paths of the projected light and the reflected light are substantially different. It is noted that projecting unit 102 may also include a plurality of light sources 112 arranged in non-linear configurations, such as a two dimensional array, in hexagonal tiling, or in any other way.

FIG. 2F illustrates an example of a monostatic configuration of LIDAR system 100 without scanning unit 104. Similar to the example embodiment represented in FIG. 2E, in order to illuminate an entire field of view without deflector 114, projecting unit 102 may include an array of light sources (e.g., 112A-112F). But, in contrast to FIG. 2E, this configuration of LIDAR system 100 may include a single optical window 124 for both the projected light and for the reflected light. Using asymmetrical deflector 216, the reflected light may be redirected to sensor 116. The configuration depicted in FIG. 2E is considered to be a monostatic configuration because the optical paths of the projected light and the reflected light are substantially similar to one another. The term "substantially similar" in the context of the optical paths of the projected light and the reflected light means that the overlap between the two optical paths may be more than 80%, more than 85%, more than 90%, or more than 95%.

FIG. 2G illustrates an example of a bi-static configuration of LIDAR system 100. The configuration of LIDAR system 100 in this figure is similar to the configuration shown in FIG. 2A. For example, both configurations include a scanning unit 104 for directing projected light in the outbound direction toward the field of view. But, in contrast to the embodiment of FIG. 2A, in this configuration, scanning unit 104 does not redirect the reflected light in the inbound direction. Instead the reflected light passes through second optical window 124B and enters sensor 116. The configuration depicted in FIG. 2G is considered to be a bi-static configuration because the optical paths of the projected light and the reflected light are substantially different from one another. The term "substantially different" in the context of the optical paths of the projected light and the reflected light means that the overlap between the two optical paths may be less than 10%, less than 5%, less than 1%, or less than 0.25%.

The Scanning Unit

Figure 3A:
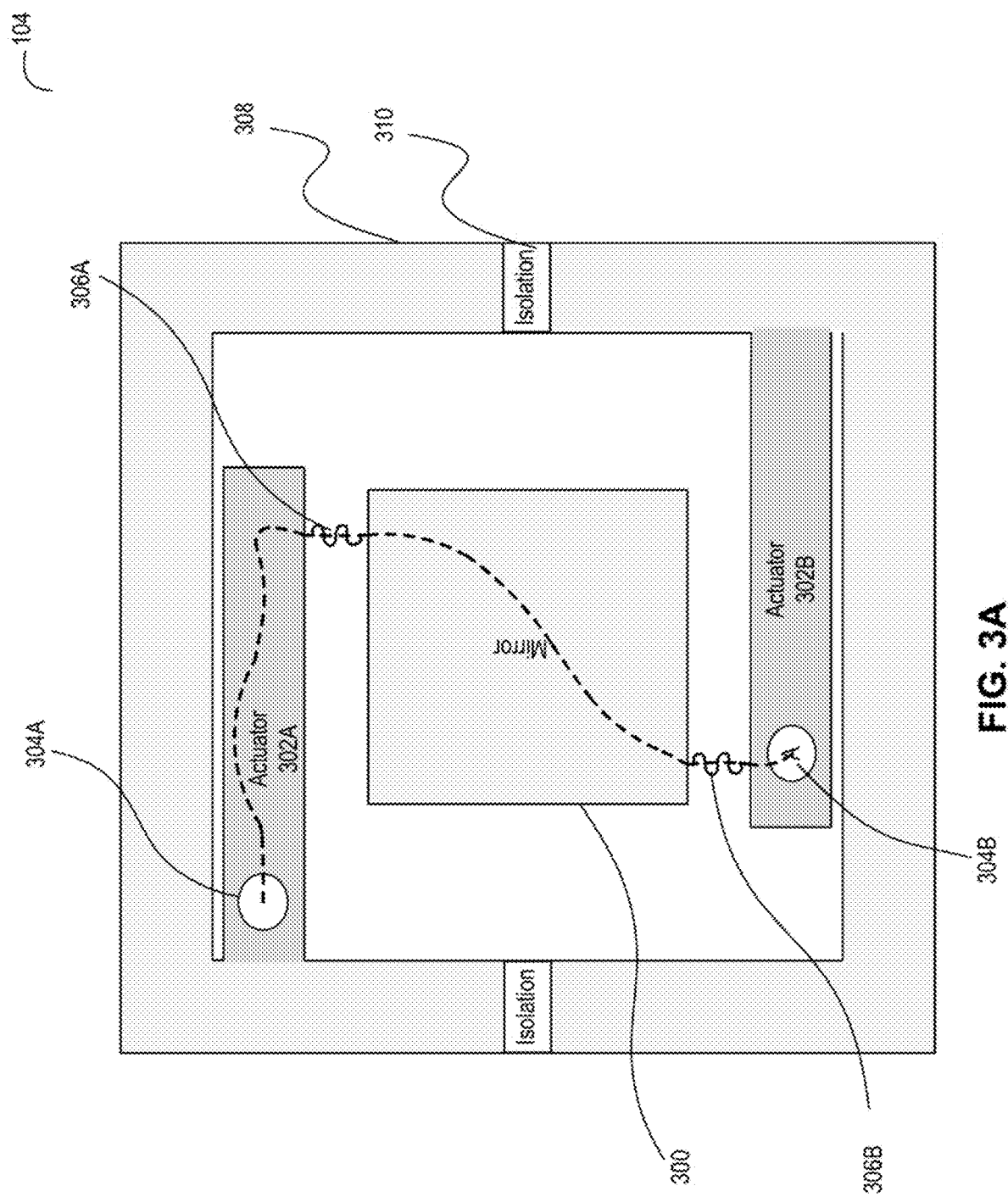
Figure 3B:
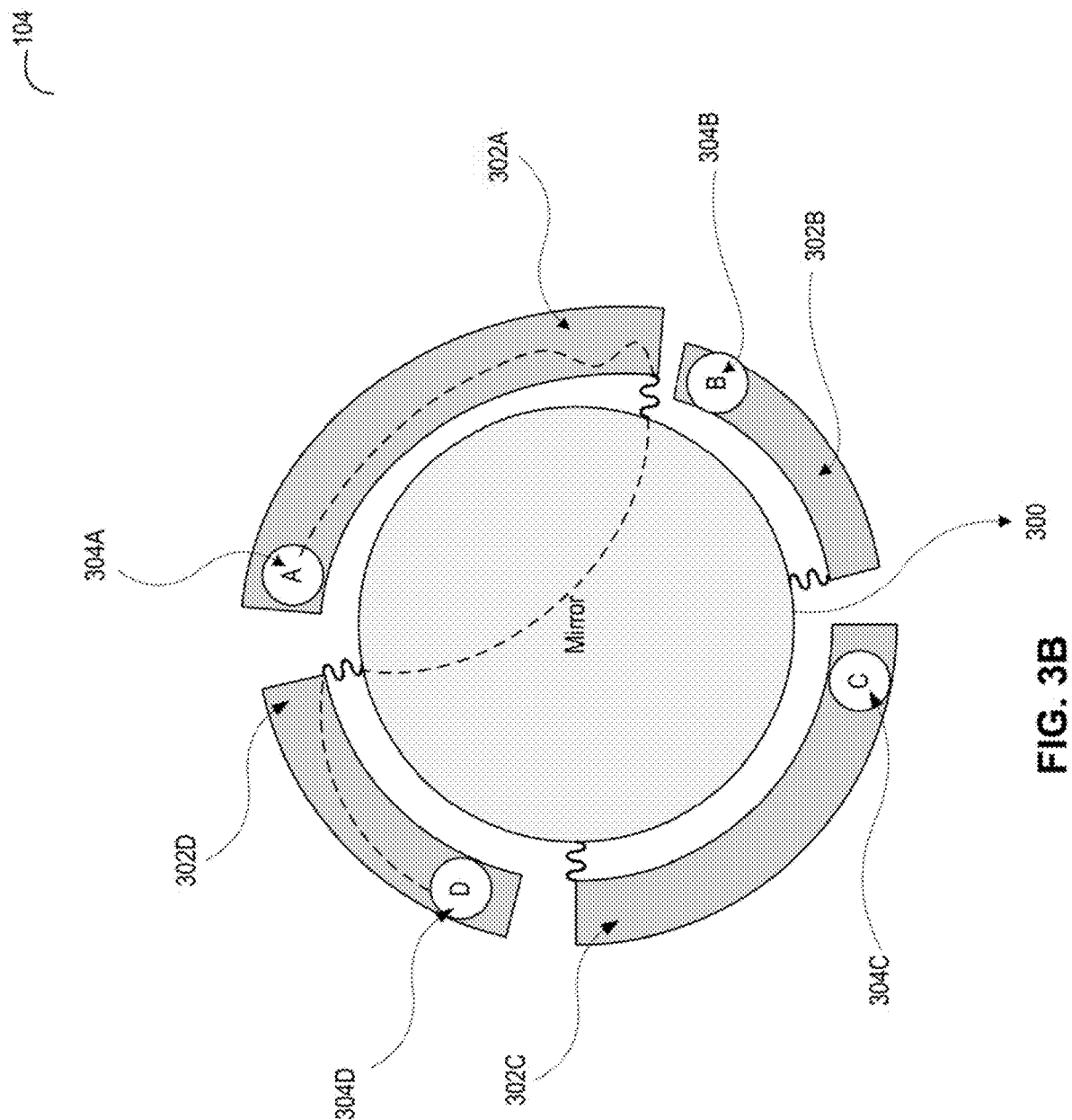
Figure 3C:
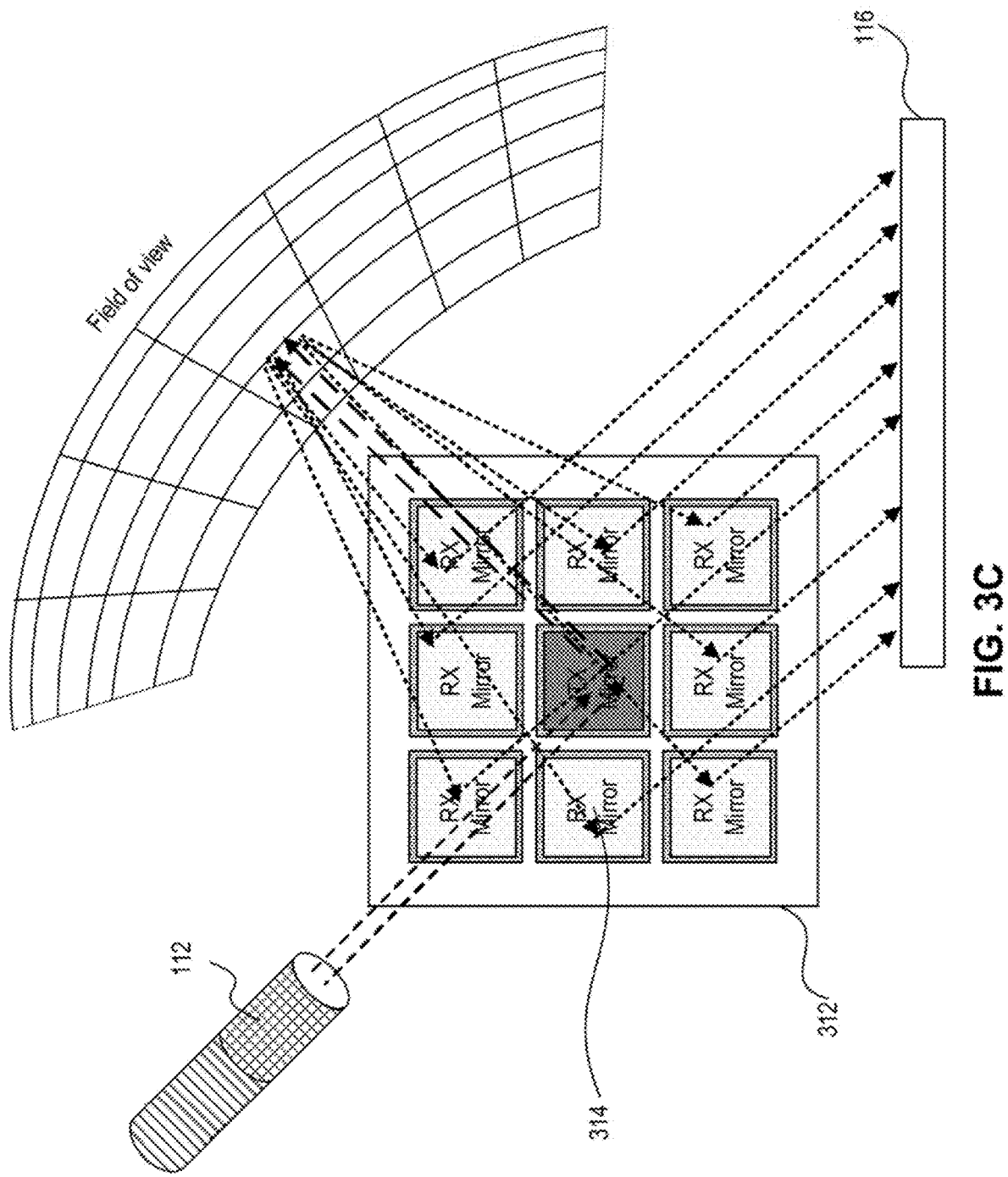

FIGS. 3A-3D depict various configurations of scanning unit 104 and its role in LIDAR system 100. Specifically, FIG. 3A is a diagram illustrating scanning unit 104 with a MEMS mirror (e.g., square shaped), FIG. 3B is a diagram illustrating another scanning unit 104 with a MEMS mirror (e.g., round shaped), FIG. 3C is a diagram illustrating scanning unit 104 with an array of reflectors used for monostatic scanning LIDAR system, and FIG. 3D is a diagram illustrating an example LIDAR system 100 that mechanically scans the environment around LIDAR system 100. One skilled in the art will appreciate that the depicted configurations of scanning unit 104 are exemplary only, and may have numerous variations and modifications within the scope of this disclosure.

FIG. 3A illustrates an example scanning unit 104 with a single axis square MEMS mirror 300. In this example MEMS mirror 300 functions as at least one deflector 114. As shown, scanning unit 104 may include one or more actuators 302 (specifically, 302A and 302B). In one embodiment, actuator 302 may be made of semiconductor (e.g., silicon) and includes a piezoelectric layer (e.g. PZT, Lead zirconate titanate, aluminum nitride), which changes its dimension in response to electric signals applied by an actuation controller, a semi conductive layer, and a base layer. In one embodiment, the physical properties of actuator 302 may determine the mechanical stresses that actuator 302 experiences when electrical current passes through it. When the piezoelectric material is activated it exerts force on actuator 302 and causes it to bend. In one embodiment, the resistivity of one or more actuators 302 may be measured in an active state (Ractive) when mirror 300 is deflected at a certain angular position and compared to the resistivity at a resting state (Rrest). Feedback including Ractive may provide information to determine the actual mirror deflection angle compared to an expected angle, and, if needed, mirror 300 deflection may be corrected. The difference between Rrest and Ractive may be correlated by a mirror drive into an angular deflection value that may serve to close the loop. This embodiment may be used for dynamic tracking of the actual mirror position and may optimize response, amplitude, deflection efficiency, and frequency for both linear mode and resonant mode MEMS mirror schemes. This embodiment is described in greater detail below with reference to FIGS. 32-34.

During scanning, current (represented in the figure as the dashed line) may flow from contact 304A to contact 304B (through actuator 302A, spring 306A, mirror 300, spring 306B, and actuator 302B). Isolation gaps in semiconducting frame 308 such as isolation gap 310 may cause actuator 302A and 302B to be two separate islands connected electrically through springs 306 and frame 308. The current flow, or any associated electrical parameter (voltage, current frequency, capacitance, relative dielectric constant, etc.), may be monitored by an associated position feedback. In case of a mechanical failure—where one of the components is damaged—the current flow through the structure would alter and change from its functional calibrated values. At an extreme situation (for example, when a spring is broken), the current would stop completely due to a circuit break in the electrical chain by means of a faulty element.

FIG. 3B illustrates another example scanning unit 104 with a dual axis round MEMS mirror 300. In this example MEMS mirror 300 functions as at least one deflector 114. In one embodiment, MEMS mirror 300 may have a diameter of between about 1 mm to about 5 mm. As shown, scanning unit 104 may include four actuators 302 (302A, 302B, 302C, and 302D) each may be at a differing length. In the illustrated example, the current (represented in the figure as the dashed line) flows from contact 304A to contact 304D, but in other cases current may flow from contact 304A to contact 304B, from contact 304A to contact 304C, from contact 304B to contact 304C, from contact 304B to contact 304D, or from contact 304C to contact 304D. Consistent with some embodiments, a dual axis MEMS mirror may be configured to deflect light in a horizontal direction and in a vertical direction. For example, the angles of deflection of a dual axis MEMS mirror may be between about 0° to 30° in the vertical direction and between about 0° to 50° in the horizontal direction. One skilled in the art will appreciate that the depicted configuration of mirror 300 may have numerous variations and modifications. In one example, at least of deflector 114 may have a dual axis square-shaped mirror or single axis round-shaped mirror. Examples of round and square mirror are depicted in FIGS. 3A and 3B as examples only. Any shape may be employed depending on system specifications. In one embodiment, actuators 302 may be incorporated as an integral part of at least of deflector 114, such that power to move MEMS mirror 300 is applied directly towards it. In addition, MEMS mirror 300 may be connected to frame 308 by one or more rigid supporting elements. In another embodiment, at least of deflector 114 may include an electrostatic or electromagnetic MEMS mirror.

As described above, a monostatic scanning LIDAR system utilizes at least a portion of the same optical path for emitting projected light 204 and for receiving reflected light 206. The light beam in the outbound path may be collimated and focused into a narrow beam while the reflections in the return path spread into a larger patch of light, due to dispersion. In one embodiment, scanning unit 104 may have a large reflection area in the return path and asymmetrical deflector 216 that redirects the reflections (i.e., reflected light 206) to sensor 116. In one embodiment, scanning unit 104 may include a MEMS mirror with a large reflection area and negligible impact on the field of view and the frame rate performance. Additional details about the asymmetrical deflector 216 are provided below with reference to FIG. 2D.

In some embodiments (e.g. as exemplified in FIG. 3C), scanning unit 104 may include a deflector array (e.g. a reflector array) with small light deflectors (e.g. mirrors). In one embodiment, implementing light deflector 114 as a group of smaller individual light deflectors working in synchronization may allow light deflector 114 to perform at a high scan rate with larger angles of deflection. The deflector array may essentially act as a large light deflector (e.g. a large mirror) in terms of effective area. The deflector array may be operated using a shared steering assembly configuration that allows sensor 116 to collect reflected photons from substantially the same portion of field of view 120 being concurrently illuminated by light source 112. The term "concurrently" means that the two selected functions occur during coincident or overlapping time periods, either where one begins and ends during the duration of the other, or where a later one starts before the completion of the other.

FIG. 3C illustrates an example of scanning unit 104 with a reflector array 312 having small mirrors. In this embodiment, reflector array 312 functions as at least one deflector 114. Reflector array 312 may include a plurality of reflector units 314 configured to pivot (individually or together) and steer light pulses toward field of view 120. For example, reflector array 312 may be a part of an outbound path of light projected from light source 112. Specifically, reflector array 312 may direct projected light 204 towards a portion of field of view 120. Reflector array 312 may also be part of a return path for light reflected from a surface of an object located within an illumined portion of field of view 120. Specifically, reflector array 312 may direct reflected light 206 towards sensor 116 or towards asymmetrical deflector 216. In one example, the area of reflector array 312 may be between about 75 to about 150 mm$^2$, where each reflector units 314 may have a width of about 10 μm and the supporting structure may be lower than 100 μm.

According to some embodiments, reflector array 312 may include one or more sub-groups of steerable deflectors. Each sub-group of electrically steerable deflectors may include one or more deflector units, such as reflector unit 314. For example, each steerable deflector unit 314 may include at least one of a MEMS mirror, a reflective surface assembly, and an electromechanical actuator. In one embodiment, each reflector unit 314 may be individually controlled by an individual processor (not shown), such that it may tilt towards a specific angle along each of one or two separate axes. Alternatively, reflector array 312 may be associated with a common controller (e.g., processor 118) configured to synchronously manage the movement of reflector units 314 such that at least part of them will pivot concurrently and point in approximately the same direction.

In addition, at least one processor 118 may select at least one reflector unit 314 for the outbound path (referred to hereinafter as "TX Mirror") and a group of reflector units 314 for the return path (referred to hereinafter as "RX Mirror"). Consistent with the present disclosure, increasing the number of TX Mirrors may increase a reflected photons beam spread. Additionally, decreasing the number of RX Mirrors may narrow the reception field and compensate for ambient light conditions (such as clouds, rain, fog, extreme heat, and other environmental conditions) and improve the signal to noise ratio. Also, as indicated above, the emitted light beam is typically narrower than the patch of reflected light, and therefore can be fully deflected by a small portion of the deflection array. Moreover, it is possible to block light reflected from the portion of the deflection array used for transmission (e.g. the TX mirror) from reaching sensor 116, thereby reducing an effect of internal reflections of the LIDAR system 100 on system operation. In addition, at least one processor 118 may pivot one or more reflector units 314 to overcome mechanical impairments and drifts due, for example, to thermal and gain effects. In an example, one or more reflector units 314 may move differently than intended (frequency, rate, speed etc.) and their movement may be compensated for by electrically controlling the deflectors appropriately.

FIG. 3D illustrates an exemplary LIDAR system 100 that mechanically scans the environment of LIDAR system 100. In this example, LIDAR system 100 may include a motor or other mechanisms for rotating housing 200 about the axis of the LIDAR system 100. Alternatively, the motor (or other mechanism) may mechanically rotate a rigid structure of LIDAR system 100 on which one or more light sources 112 and one or more sensors 116 are installed, thereby scanning the environment. As described above, projecting unit 102 may include at least one light source 112 configured to project light emission. The projected light emission may travel along an outbound path towards field of view 120. Specifically, the projected light emission may be reflected by deflector 114A through an exit aperture 314 when projected light 204 travel towards optional optical window 124. The reflected light emission may travel along a return path from object 208 towards sensing unit 106. For example, the reflected light 206 may be reflected by deflector 114B when reflected light 206 travels towards sensing unit 106. A person skilled in the art would appreciate that a LIDAR system with a rotation mechanism for synchronically rotating one or more light sources or one or more sensors, may use this synchronized rotation instead of (or in addition to) steering an internal light deflector.

In embodiments in which the scanning of field of view 120 is mechanical, the projected light emission may be directed to exit aperture 314 that is part of a wall 316 separating projecting unit 102 from other parts of LIDAR system 100. In some examples, wall 316 can be formed from a transparent material (e.g., glass) coated with a reflective material to form deflector 114B. In this example, exit aperture 314 may correspond to the portion of wall 316 that is not coated by the reflective material. Additionally or alternatively, exit aperture 314 may include a hole or cut-away in the wall 316. Reflected light 206 may be reflected by deflector 114B and directed towards an entrance aperture 318 of sensing unit 106. In some examples, an entrance aperture 318 may include a filtering window configured to allow wavelengths in a certain wavelength range to enter sensing unit 106 and attenuate other wavelengths. The reflections of object 208 from field of view 120 may be reflected by deflector 114B and hit sensor 116. By comparing several properties of reflected light 206 with projected light 204, at least one aspect of object 208 may be determined. For example, by comparing a time when projected light 204 was emitted by light source 112 and a time when sensor 116 received reflected light 206, a distance between object 208 and LIDAR system 100 may be determined. In some examples, other aspects of object 208, such as shape, color, material, etc. may also be determined.

In some examples, the LIDAR system 100 (or part thereof, including at least one light source 112 and at least one sensor 116) may be rotated about at least one axis to determine a three-dimensional map of the surroundings of the LIDAR system 100. For example, the LIDAR system 100 may be rotated about a substantially vertical axis as illustrated by arrow 320 in order to scan field of 120. Although FIG. 3D illustrates that the LIDAR system 100 is rotated clock-wise about the axis as illustrated by the arrow 320, additionally or alternatively, the LIDAR system 100 may be rotated in a counter clockwise direction. In some examples, the LIDAR system 100 may be rotated 360 degrees about the vertical axis. In other examples, the LIDAR system 100 may be rotated back and forth along a sector smaller than 360-degree of the LIDAR system 100. For example, the LIDAR system 100 may be mounted on a platform that wobbles back and forth about the axis without making a complete rotation.

The Sensing Unit

Figure 4A:
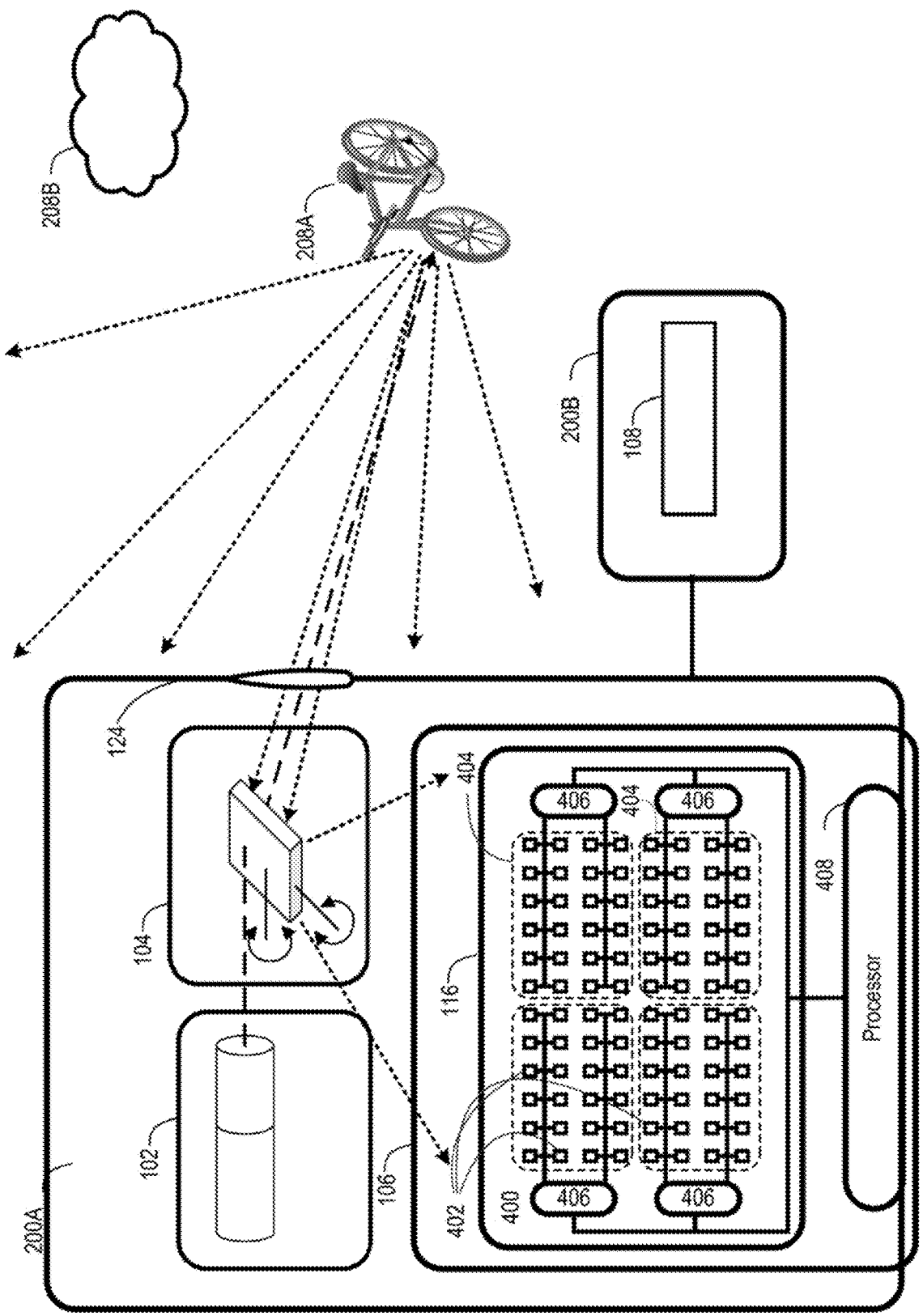
FIGS. 4A, 4B, 4C, 4D, and 4E are diagrams illustrating different configurations of sensing units in accordance with some embodiments of the present disclosure.
Figure 4B:
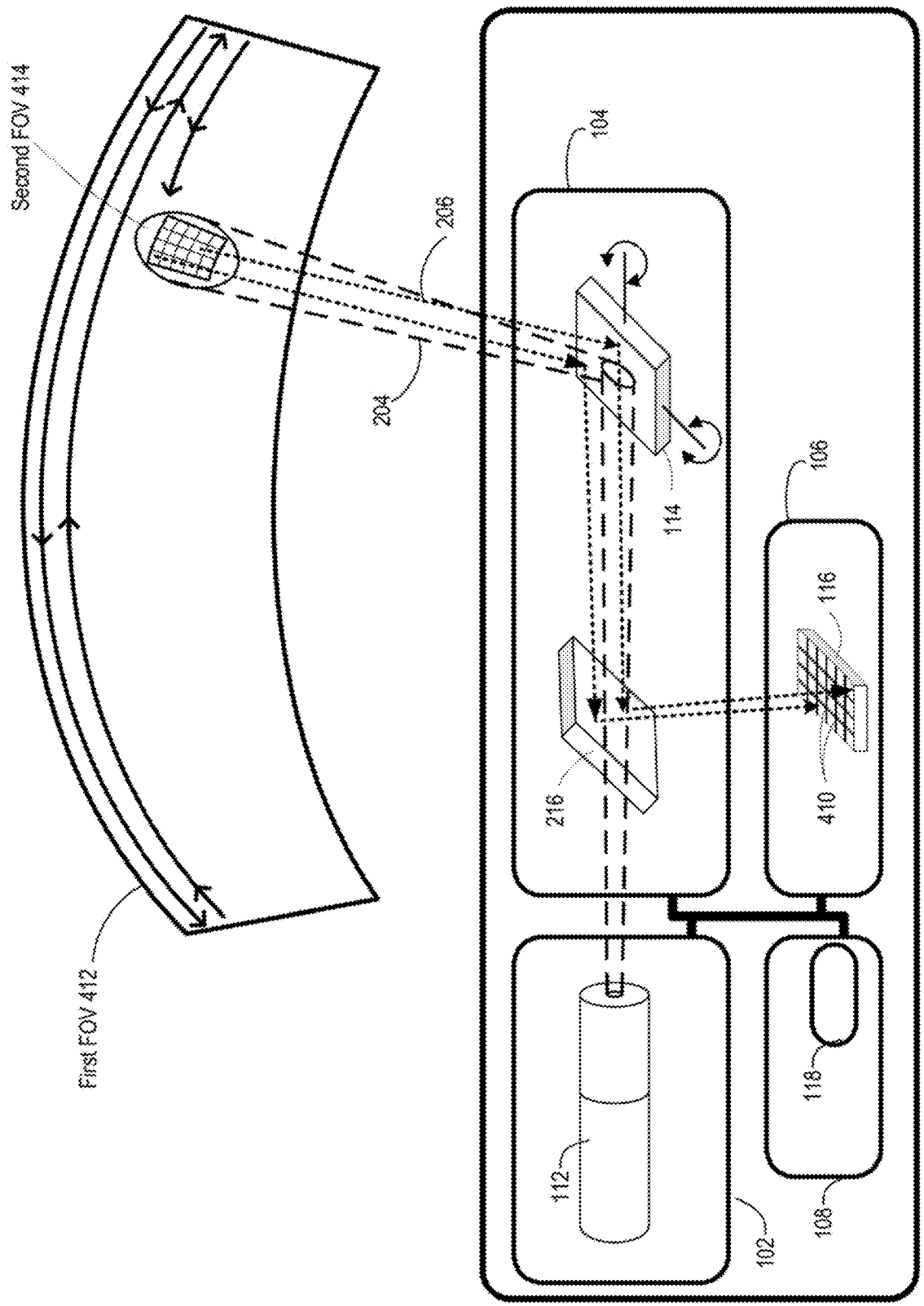
Figure 4C:
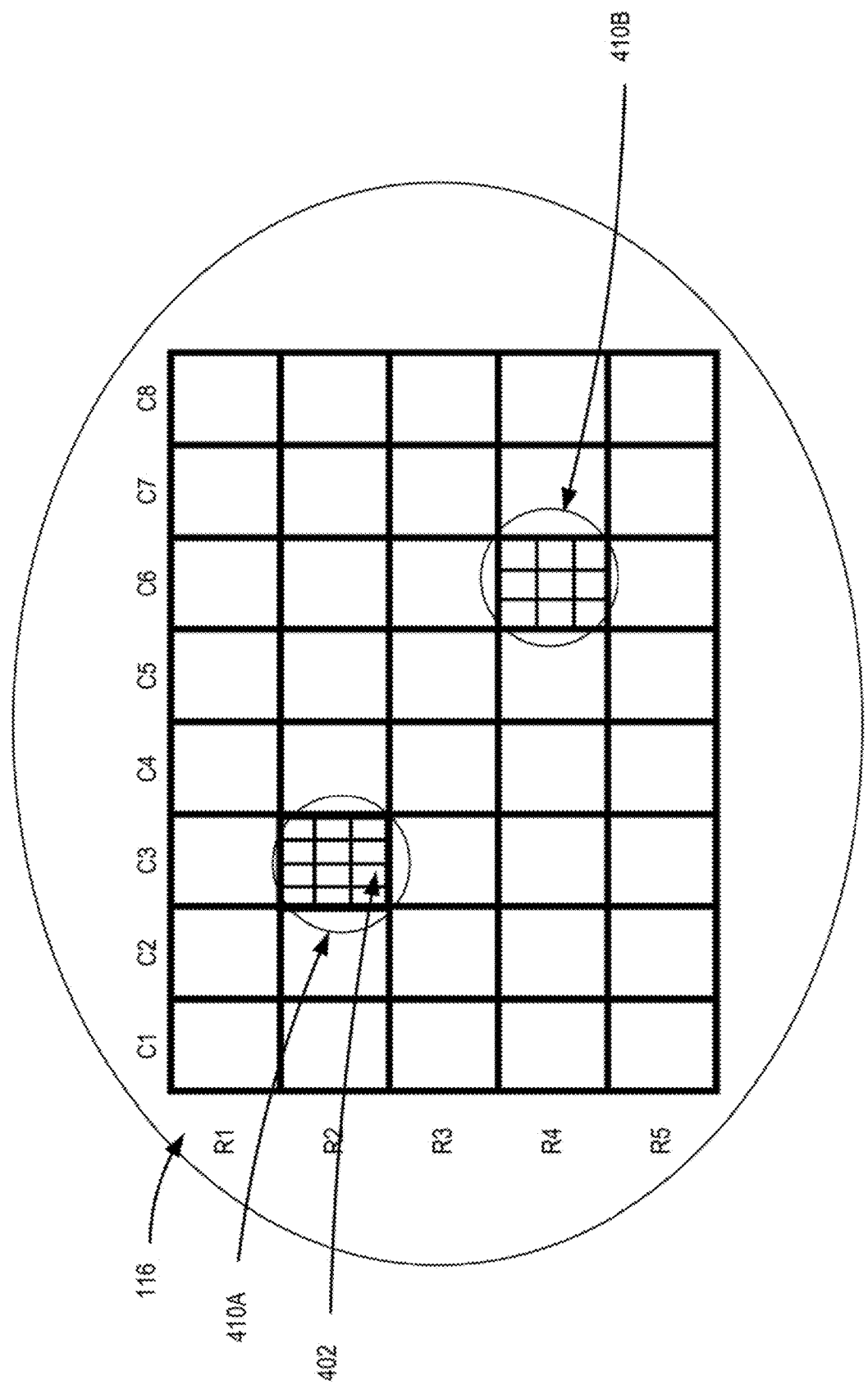
Figure 4D:
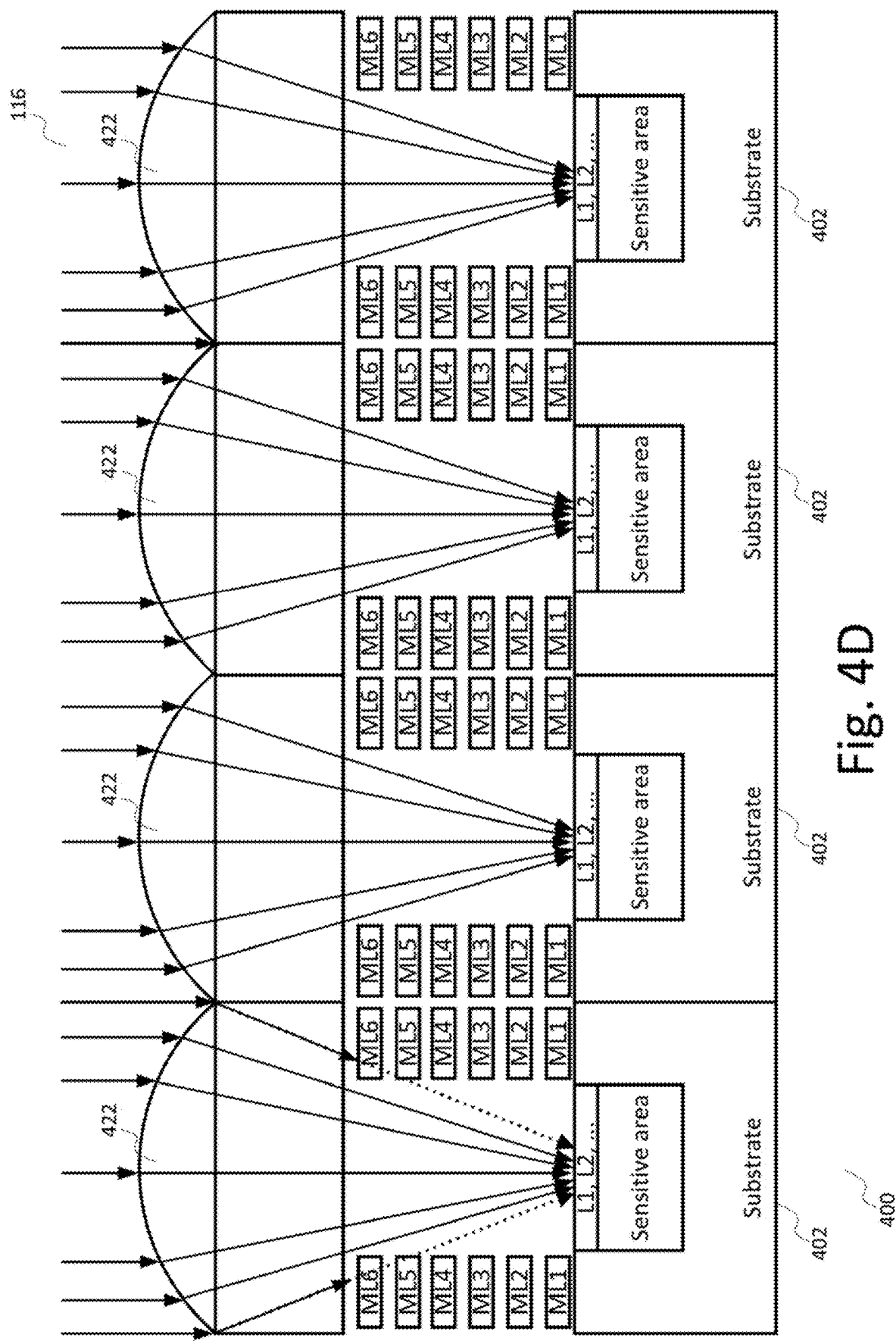

FIGS. 4A-4E depict various configurations of sensing unit 106 and its role in LIDAR system 100. Specifically, FIG. 4A is a diagram illustrating an example sensing unit 106 with a detector array, FIG. 4B is a diagram illustrating monostatic scanning using a two-dimensional sensor, FIG. 4C is a diagram illustrating an example of a two-dimensional sensor 116, FIG. 4D is a diagram illustrating a lens array associated with sensor 116, and FIG. 4E includes three diagram illustrating the lens structure. One skilled in the art will appreciate that the depicted configurations of sensing unit 106 are exemplary only and may have numerous alternative variations and modifications consistent with the principles of this disclosure.

FIG. 4A illustrates an example of sensing unit 106 with detector array 400. In this example, at least one sensor 116 includes detector array 400. LIDAR system 100 is configured to detect objects (e.g., bicycle 208A and cloud 208B) in field of view 120 located at different distances from LIDAR system 100 (could be meters or more). Objects 208 may be a solid object (e.g. a road, a tree, a car, a person), fluid object (e.g. fog, water, atmosphere particles), or object of another type (e.g. dust or a powdery illuminated object). When the photons emitted from light source 112 hit object 208 they either reflect, refract, or get absorbed. Typically, as shown in the figure, only a portion of the photons reflected from object 208A enters optional optical window 124. As each ~15 cm change in distance results in a travel time difference of 1 ns (since the photons travel at the speed of light to and from object 208), the time differences between the travel times of different photons hitting the different objects may be detectable by a time-of-flight sensor with sufficiently quick response.

Sensor 116 includes a plurality of detection elements 402 for detecting photons of a photonic pulse reflected back from field of view 120. The detection elements may all be included in detector array 400, which may have a rectangular arrangement (e.g. as shown) or any other arrangement. Detection elements 402 may operate concurrently or partially concurrently with each other. Specifically, each detection element 402 may issue detection information for every sampling duration (e.g. every 1 nanosecond). In one example, detector array 400 may be a SiPM (Silicon photomultipliers) which is a solid-state single-photon-sensitive device built from an array of single photon avalanche diodes (SPADs, serving as detection elements 402) on a common silicon substrate. Similar photomultipliers from other, non-silicon materials may also be used. Although a SiPM device works in digital/switching mode, the SiPM is an analog device because all the microcells are read in parallel, making it possible to generate signals within a dynamic range from a single photon to hundreds and thousands of photons detected by the different SPADs. As mentioned above, more than one type of sensor may be implemented (e.g. SiPM and APD). Possibly, sensing unit 106 may include at least one APD integrated into an SiPM array and/or at least one APD detector located next to a SiPM on a separate or common silicon substrate.

In one embodiment, detection elements 402 may be grouped into a plurality of regions 404. The regions are geometrical locations or environments within sensor 116 (e.g. within detector array 400)—and may be shaped in different shapes (e.g. rectangular as shown, squares, rings, and so on, or in any other shape). While not all of the individual detectors, which are included within the geometrical area of a region 404, necessarily belong to that region, in most cases they will not belong to other regions 404 covering other areas of the sensor 310—unless some overlap is desired in the seams between regions. As illustrated in FIG. 4A, the regions may be non-overlapping regions 404, but alternatively, they may overlap. Every region may be associated with a regional output circuitry 406 associated with that region. The regional output circuitry 406 may provide a region output signal of a corresponding group of detection elements 402. For example, the region of output circuitry 406 may be a summing circuit, but other forms of combined output of the individual detector into a unitary output (whether scalar, vector, or any other format) may be employed. Optionally, each region 404 is a single SiPM, but this is not necessarily so, and a region may be a sub-portion of a single SiPM, a group of several SiPMs, or even a combination of different types of detectors.

In the illustrated example, processing unit 108 is located at a separated housing 200B (within or outside) host 210 (e.g. within vehicle 110), and sensing unit 106 may include a dedicated processor 408 for analyzing the reflected light. Alternatively, processing unit 108 may be used for analyzing reflected light 206. It is noted that LIDAR system 100 may be implemented multiple housings in other ways than the illustrated example. For example, light deflector 114 may be located in a different housing than projecting unit 102 and/or sensing module 106. In one embodiment, LIDAR system 100 may include multiple housings connected to each other in different ways, such as: electric wire connection, wireless connection (e.g., RF connection), fiber optics cable, and any combination of the above.

In one embodiment, analyzing reflected light 206 may include determining a time of flight for reflected light 206, based on outputs of individual detectors of different regions. Optionally, processor 408 may be configured to determine the time of flight for reflected light 206 based on the plurality of regions of output signals. In addition to the time of flight, processing unit 108 may analyze reflected light 206 to determine the average power across an entire return pulse, and the photon distribution/signal may be determined over the return pulse period ("pulse shape"). In the illustrated example, the outputs of any detection elements 402 may not be transmitted directly to processor 408, but rather combined (e.g. summed) with signals of other detectors of the region 404 before being passed to processor 408. However, this is only an example and the circuitry of sensor 116 may transmit information from a detection element 402 to processor 408 via other routes (not via a region output circuitry 406).

FIG. 4B is a diagram illustrating LIDAR system 100 configured to scan the environment of LIDAR system 100 using a two-dimensional sensor 116. In the example of FIG. 4B, sensor 116 is a matrix of 4×6 detectors 410 (also referred to as "pixels"). In one embodiment, a pixel size may be about 1×1 mm. Sensor 116 is two-dimensional in the sense that it has more than one set (e.g. row, column) of detectors 410 in two non-parallel axes (e.g. orthogonal axes, as exemplified in the illustrated examples). The number of detectors 410 in sensor 116 may vary between differing implementations, e.g. depending on the desired resolution, signal to noise ratio (SNR), desired detection distance, and so on. For example, sensor 116 may have anywhere between 5 and 5,000 pixels. In another example (not shown in the figure) Also, sensor 116 may be a one-dimensional matrix (e.g. 1×8 pixels).

It is noted that each detector 410 may include a plurality of detection elements 402, such as Avalanche Photo Diodes (APD), Single Photon Avalanche Diodes (SPADs), combination of Avalanche Photo Diodes (APD) and Single Photon Avalanche Diodes (SPADs) or detecting elements that measure both the time of flight from a laser pulse transmission event to the reception event and the intensity of the received photons. For example, each detector 410 may include anywhere between 20 and 5,000 SPADs. The outputs of detection elements 402 in each detector 410 may be summed, averaged, or otherwise combined to provide a unified pixel output.

In the illustrated example, sensing unit 106 may include a two-dimensional sensor 116 (or a plurality of two-dimensional sensors 116), whose field of view is smaller than field of view 120 of LIDAR system 100. In this discussion, field of view 120 (the overall field of view which can be scanned by LIDAR system 100 without moving, rotating or rolling in any direction) is denoted "first FOV 412", and the smaller FOV of sensor 116 is denoted "second FOV 412" (interchangeably "instantaneous FOV"). The coverage area of second FOV 414 relative to the first FOV 412 may differ, depending on the specific use of LIDAR system 100, and may be, for example, between 0.5% and 50%. In one example, second FOV 412 may be between about 0.05° and 1° elongated in the vertical dimension. Even if LIDAR system 100 includes more than one two-dimensional sensor 116, the combined field of view of the sensors array may still be smaller than the first FOV 412, e.g. by a factor of at least 5, by a factor of at least 10, by a factor of at least 20, or by a factor of at least 50, for example.

In order to cover first FOV 412, scanning unit 106 may direct photons arriving from different parts of the environment to sensor 116 at different times. In the illustrated monostatic configuration, together with directing projected light 204 towards field of view 120 and when least one light deflector 114 is located in an instantaneous position, scanning unit 106 may also direct reflected light 206 to sensor 116. Typically, at every moment during the scanning of first FOV 412, the light beam emitted by LIDAR system 100 covers part of the environment which is larger than the second FOV 414 (in angular opening) and includes the part of the environment from which light is collected by scanning unit 104 and sensor 116.

FIG. 4C is a diagram illustrating an example of a two-dimensional sensor 116. In this embodiment, sensor 116 is a matrix of 8×5 detectors 410 and each detector 410 includes a plurality of detection elements 402. In one example, detector 410A is located in the second row (denoted "R2") and third column (denoted "C3") of sensor 116, which includes a matrix of 4×3 detection elements 402. In another example, detector 410B located in the fourth row (denoted "R4") and sixth column (denoted "C6") of sensor 116 includes a matrix of 3×3 detection elements 402. Accordingly, the number of detection elements 402 in each detector 410 may be constant, or may vary, and differing detectors 410 in a common array may have a different number of detection elements 402. The outputs of all detection elements 402 in each detector 410 may be summed, averaged, or otherwise combined to provide a single pixel-output value. It is noted that while detectors 410 in the example of FIG. 4C are arranged in a rectangular matrix (straight rows and straight columns), other arrangements may also be used, e.g. a circular arrangement or a honeycomb arrangement.

According to some embodiments, measurements from each detector 410 may enable determination of the time of flight from a light pulse emission event to the reception event and the intensity of the received photons. The reception event may be the result of the light pulse being reflected from object 208. The time of flight may be a timestamp value that represents the distance of the reflecting object to optional optical window 124. Time of flight values may be realized by photon detection and counting methods, such as Time Correlated Single Photon Counters (TCSPC), analog methods for photon detection such as signal integration and qualification (via analog to digital converters or plain comparators) or otherwise.

In some embodiments and with reference to FIG. 4B, during a scanning cycle, each instantaneous position of at least one light deflector 114 may be associated with a particular portion 122 of field of view 120. The design of sensor 116 enables an association between the reflected light from a single portion of field of view 120 and multiple detectors 410. Therefore, the scanning resolution of LIDAR system may be represented by the number of instantaneous positions (per scanning cycle) times the number of detectors 410 in sensor 116. The information from each detector 410 (i.e., each pixel) represents the basic data element that from which the captured field of view in the three-dimensional space is built. This may include, for example, the basic element of a point cloud representation, with a spatial position and an associated reflected intensity value. In one embodiment, the reflections from a single portion of field of view 120 that are detected by multiple detectors 410 may be returning from different objects located in the single portion of field of view 120. For example, the single portion of field of view 120 may be greater than 50×50 cm at the far field, which can easily include two, three, or more objects partly covered by each other.

FIG. 4D is a cross cut diagram of a part of sensor 116, in accordance with examples of the presently disclosed subject matter. The illustrated part of sensor 116 includes a part of a detector array 400 which includes four detection elements 402 (e.g., four SPADs, four APDs). Detector array 400 may be a photodetector sensor realized in complementary metal-oxide-semiconductor (CMOS). Each of the detection elements 402 has a sensitive area, which is positioned within a substrate surrounding. While not necessarily so, sensor 116 may be used in a monostatic LiDAR system having a narrow field of view (e.g., because scanning unit 104 scans different parts of the field of view at different times). The narrow field of view for the incoming light beam—if implemented—eliminates the problem of out-of-focus imaging. As exemplified in FIG. 4D, sensor 116 may include a plurality of lenses 422 (e.g., microlenses), each lens 422 may direct incident light toward a different detection element 402 (e.g., toward an active area of detection element 402), which may be usable when out-of-focus imaging is not an issue. Lenses 422 may be used for increasing an optical fill factor and sensitivity of detector array 400, because most of the light that reaches sensor 116 may be deflected toward the active areas of detection elements 402

Detector array 400, as exemplified in FIG. 4D, may include several layers built into the silicon substrate by various methods (e.g., implant) resulting in a sensitive area, contact elements to the metal layers and isolation elements (e.g., shallow trench implant STI, guard rings, optical trenches, etc.). The sensitive area may be a volumetric element in the CMOS detector that enables the optical conversion of incoming photons into a current flow given an adequate voltage bias is applied to the device. In the case of a APD/SPAD, the sensitive area would be a combination of an electrical field that pulls electrons created by photon absorption towards a multiplication area where a photon induced electron is amplified creating a breakdown avalanche of multiplied electrons.

A front side illuminated detector (e.g., as illustrated in FIG. 4D) has the input optical port at the same side as the metal layers residing on top of the semiconductor (Silicon). The metal layers are required to realize the electrical connections of each individual photodetector element (e.g., anode and cathode) with various elements such as: bias voltage, quenching/ballast elements, and other photodetectors in a common array. The optical port through which the photons impinge upon the detector sensitive area is comprised of a passage through the metal layer. It is noted that passage of light from some directions through this passage may be blocked by one or more metal layers (e.g., metal layer ML6, as illustrated for the leftmost detector elements 402 in FIG. 4D). Such blockage reduces the total optical light absorbing efficiency of the detector.

Figure 4E:
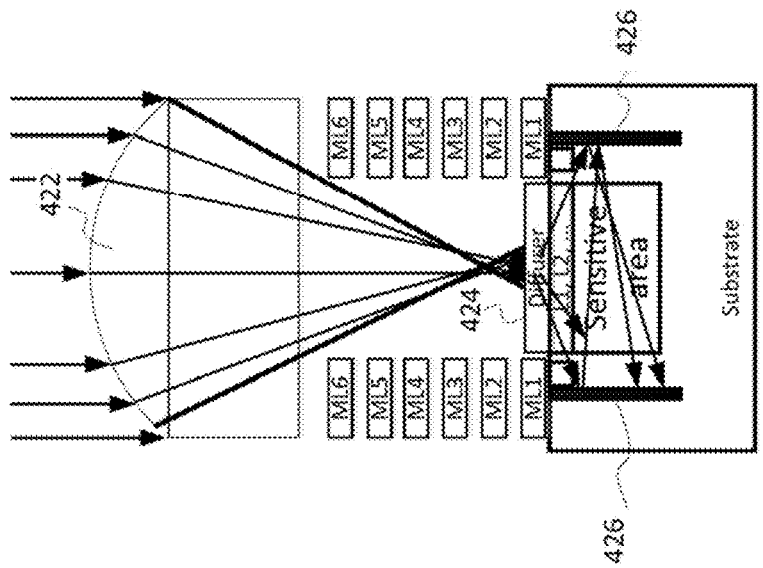
Figure 4E:
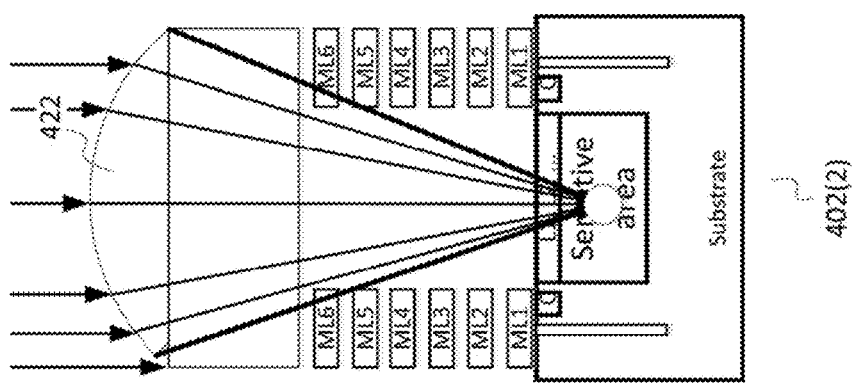
Figure 4E:
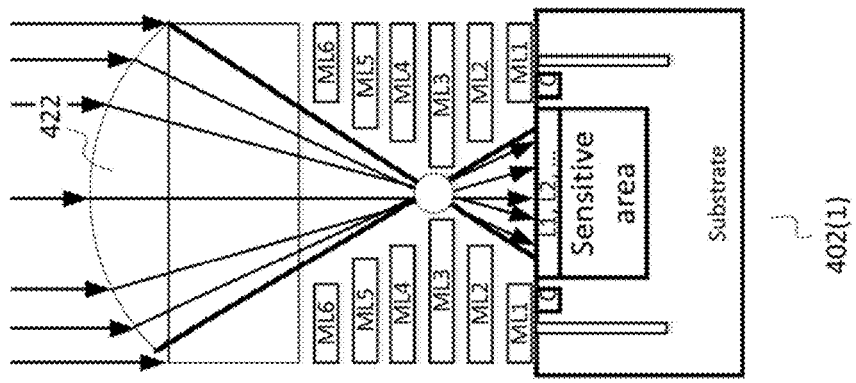

FIG. 4E illustrates three detection elements 402, each with an associated lens 422, in accordance with examples of the presenting disclosed subject matter. Each of the three detection elements of FIG. 4E, denoted 402(1), 402(2), and 402(3), illustrates a lens configuration which may be implemented in associated with one or more of the detecting elements 402 of sensor 116. It is noted that combinations of these lens configurations may also be implemented.

In the lens configuration illustrated with regards to detection element 402(1), a focal point of the associated lens 422 may be located above the semiconductor surface. Optionally, openings in different metal layers of the detection element may have different sizes aligned with the cone of focusing light generated by the associated lens 422. Such a structure may improve the signal-to-noise and resolution of the array 400 as a whole device. Large metal layers may be important for delivery of power and ground shielding. This approach may be useful, e.g., with a monostatic LiDAR design with a narrow field of view where the incoming light beam is comprised of parallel rays and the imaging focus does not have any consequence to the detected signal.

In the lens configuration illustrated with regards to detection element 402(2), an efficiency of photon detection by the detection elements 402 may be improved by identifying a sweet spot. Specifically, a photodetector implemented in CMOS may have a sweet spot in the sensitive volume area where the probability of a photon creating an avalanche effect is the highest. Therefore, a focal point of lens 422 may be positioned inside the sensitive volume area at the sweet spot location, as demonstrated by detection elements 402(2). The lens shape and distance from the focal point may take into account the refractive indices of all the elements the laser beam is passing along the way from the lens to the sensitive sweet spot location buried in the semiconductor material.

In the lens configuration illustrated with regards to the detection element on the right of FIG. 4E, an efficiency of photon absorption in the semiconductor material may be improved using a diffuser and reflective elements. Specifically, a near IR wavelength requires a significantly long path of silicon material in order to achieve a high probability of absorbing a photon that travels through. In a typical lens configuration, a photon may traverse the sensitive area and may not be absorbed into a detectable electron. A long absorption path that improves the probability for a photon to create an electron renders the size of the sensitive area towards less practical dimensions (tens of μm for example) for a CMOS device fabricated with typical foundry processes. The rightmost detector element in FIG. 4E demonstrates a technique for processing incoming photons. The associated lens 422 focuses the incoming light onto a diffuser element 424. In one embodiment, light sensor 116 may further include a diffuser located in the gap distant from the outer surface of at least some of the detectors. For example, diffuser 424 may steer the light beam sideways (e.g., as perpendicular as possible) towards the sensitive area and the reflective optical trenches 426. The diffuser is located at the focal point, above the focal point, or below the focal point. In this embodiment, the incoming light may be focused on a specific location where a diffuser element is located. Optionally, detector element 422 is designed to optically avoid the inactive areas where a photon induced electron may get lost and reduce the effective detection efficiency. Reflective optical trenches 426 (or other forms of optically reflective structures) cause the photons to bounce back and forth across the sensitive area, thus increasing the likelihood of detection. Ideally, the photons will get trapped in a cavity consisting of the sensitive area and the reflective trenches indefinitely until the photon is absorbed and creates an electron/hole pair.

Consistent with the present disclosure, a long path is created for the impinging photons to be absorbed and contribute to a higher probability of detection. Optical trenches may also be implemented in detecting element 422 for reducing cross talk effects of parasitic photons created during an avalanche that may leak to other detectors and cause false detection events. According to some embodiments, a photo detector array may be optimized so that a higher yield of the received signal is utilized, meaning, that as much of the received signal is received and less of the signal is lost to internal degradation of the signal. The photo detector array may be improved by: (a) moving the focal point at a location above the semiconductor surface, optionally by designing the metal layers above the substrate appropriately; (b) by steering the focal point to the most responsive/sensitive area (or "sweet spot") of the substrate and (c) adding a diffuser above the substrate to steer the signal toward the "sweet spot" and/or adding reflective material to the trenches so that deflected signals are reflected back to the "sweet spot."

While in some lens configurations, lens 422 may be positioned so that its focal point is above a center of the corresponding detection element 402, it is noted that this is not necessarily so. In other lens configuration, a position of the focal point of the lens 422 with respect to a center of the corresponding detection element 402 is shifted based on a distance of the respective detection element 402 from a center of the detection array 400. This may be useful in relatively larger detection arrays 400, in which detector elements further from the center receive light in angles which are increasingly off-axis. Shifting the location of the focal points (e.g., toward the center of detection array 400) allows correcting for the incidence angles. Specifically, shifting the location of the focal points (e.g., toward the center of detection array 400) allows correcting for the incidence angles while using substantially identical lenses 422 for all detection elements, which are positioned at the same angle with respect to a surface of the detector.

Adding an array of lenses 422 to an array of detection elements 402 may be useful when using a relatively small sensor 116 which covers only a small part of the field of view because in such a case, the reflection signals from the scene reach the detectors array 400 from substantially the same angle, and it is, therefore, easy to focus all the light onto individual detectors. It is also noted, that in one embodiment, lenses 422 may be used in LIDAR system 100 for favoring about increasing the overall probability of detection of the entire array 400 (preventing photons from being "wasted" in the dead area between detectors/sub-detectors) at the expense of spatial distinctiveness. This embodiment is in contrast to prior art implementations such as CMOS RGB camera, which prioritize spatial distinctiveness (i.e., light that propagates in the direction of detection element A is not allowed to be directed by the lens toward detection element B, that is, to "bleed" to another detection element of the array). Optionally, sensor 116 includes an array of lens 422, each being correlated to a corresponding detection element 402, while at least one of the lenses 422 deflects light which propagates to a first detection element 402 toward a second detection element 402 (thereby it may increase the overall probability of detection of the entire array).

Specifically, consistent with some embodiments of the present disclosure, light sensor 116 may include an array of light detectors (e.g., detector array 400), each light detector (e.g., detector 410) being configured to cause an electric current to flow when light passes through an outer surface of a respective detector. In addition, light sensor 116 may include at least one micro-lens configured to direct light toward the array of light detectors, the at least one micro-lens having a focal point. Light sensor 116 may further include at least one layer of conductive material interposed between the at least one micro-lens and the array of light detectors and having a gap therein to permit light to pass from the at least one micro-lens to the array, the at least one layer being sized to maintain a space between the at least one micro-lens and the array to cause the focal point (e.g., the focal point may be a plane) to be located in the gap, at a location spaced from the detecting surfaces of the array of light detectors.

In related embodiments, each detector may include a plurality of Single Photon Avalanche Diodes (SPADs) or a plurality of Avalanche Photo Diodes (APD). The conductive material may be a multi-layer metal constriction, and the at least one layer of conductive material may be electrically connected to detectors in the array. In one example, the at least one layer of conductive material includes a plurality of layers. In addition, the gap may be shaped to converge from the at least one micro-lens toward the focal point, and to diverge from a region of the focal point toward the array. In other embodiments, light sensor 116 may further include at least one reflector adjacent each photo detector. In one embodiment, a plurality of micro-lenses may be arranged in a lens array and the plurality of detectors may be arranged in a detector array. In another embodiment, the plurality of micro-lenses may include a single lens configured to project light to a plurality of detectors in the array.

Referring by way of a nonlimiting example to FIGS. 2E, 2F and 2G, it is noted that the one or more sensors 116 of system 100 may receive light from a scanning deflector 114 or directly from the FOV without scanning. Even if light from the entire FOV arrives to the at least one sensor 116 at the same time, in some implementations the one or more sensors 116 may sample only parts of the FOV for detection output at any given time. For example, if the illumination of projection unit 102 illuminates different parts of the FOV at different times (whether using a deflector 114 and/or by activating different light sources 112 at different times), light may arrive at all of the pixels or sensors 116 of sensing unit 106, and only pixels/sensors which are expected to detect the LIDAR illumination may be actively collecting data for detection outputs. This way, the rest of the pixels/sensors do not unnecessarily collect ambient noise. Referring to the scanning—in the outbound or in the inbound directions—it is noted that substantially different scales of scanning may be implemented. For example, in some implementations the scanned area may cover 1% or 0.1% of the FOV, while in other implementations the scanned area may cover 10% or 25% of the FOV. All other relative portions of the FOV values may also be implemented, of course.

The Processing Unit

Figure 5A:
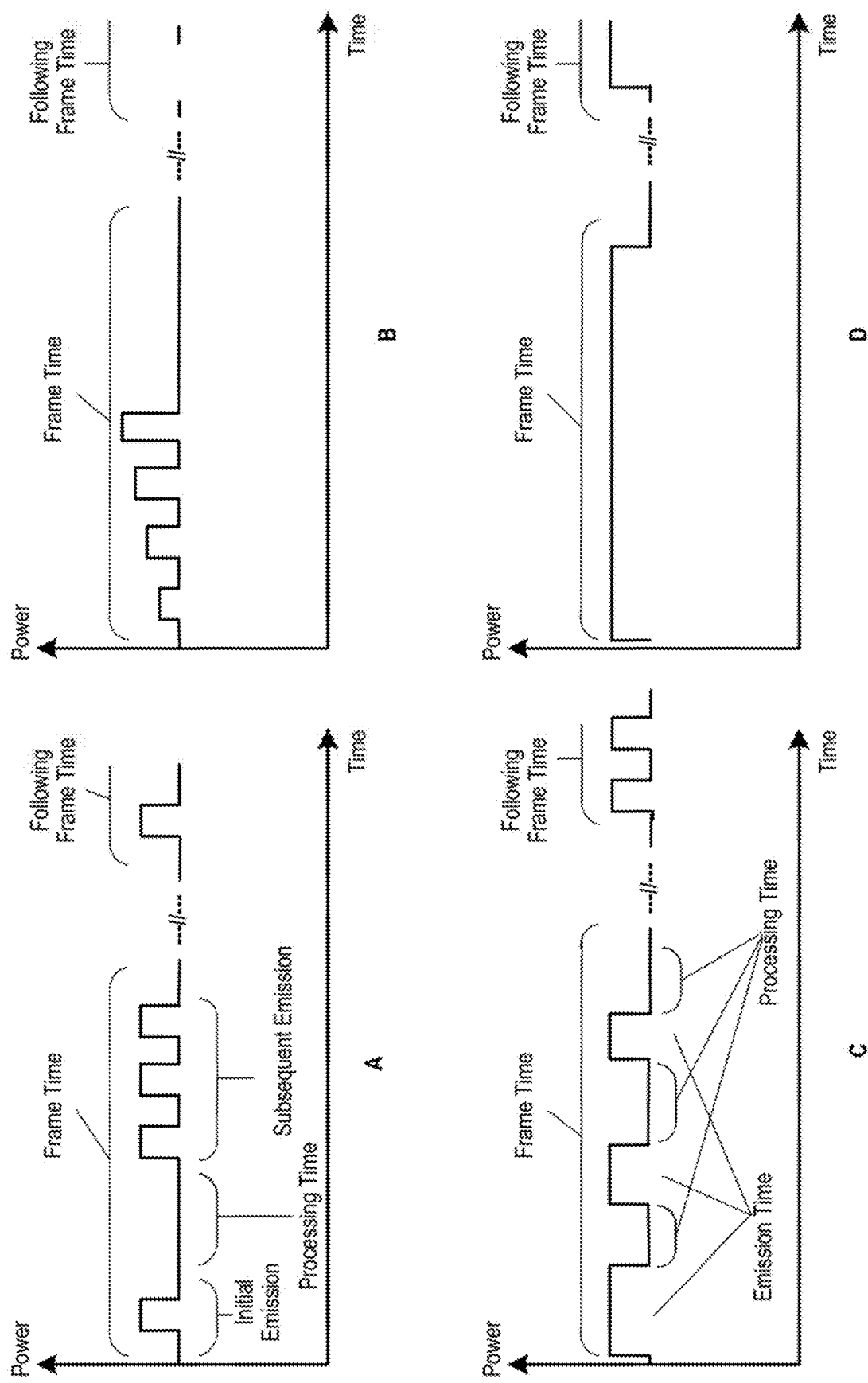
FIG. 5A includes four example diagrams illustrating emission patterns in a single frame-time for a single portion of the field of view.
Figure 5B:
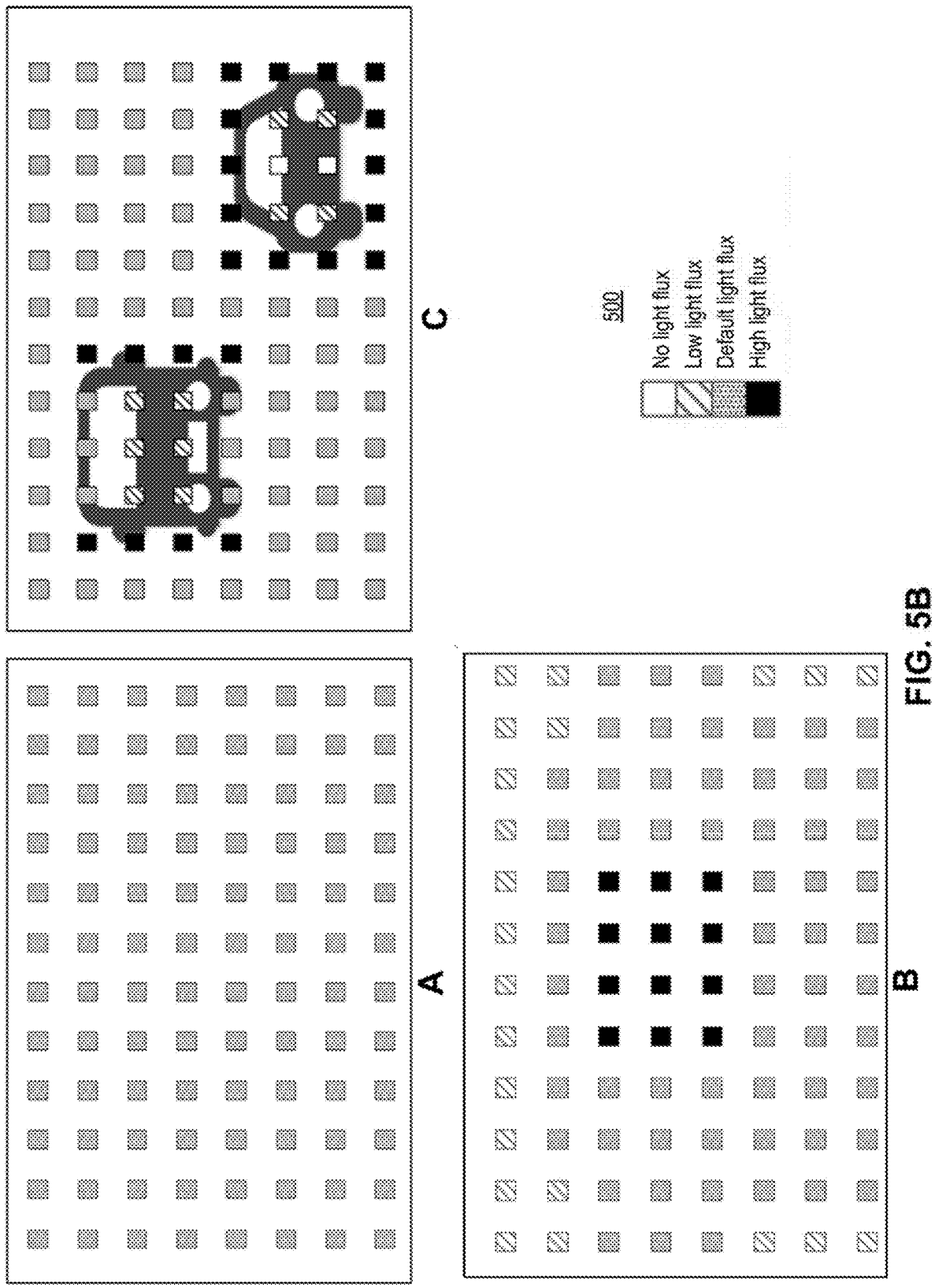
FIG. 5B includes three example diagrams illustrating emission scheme in a single frame-time for the whole field of view.
Figure 5C:
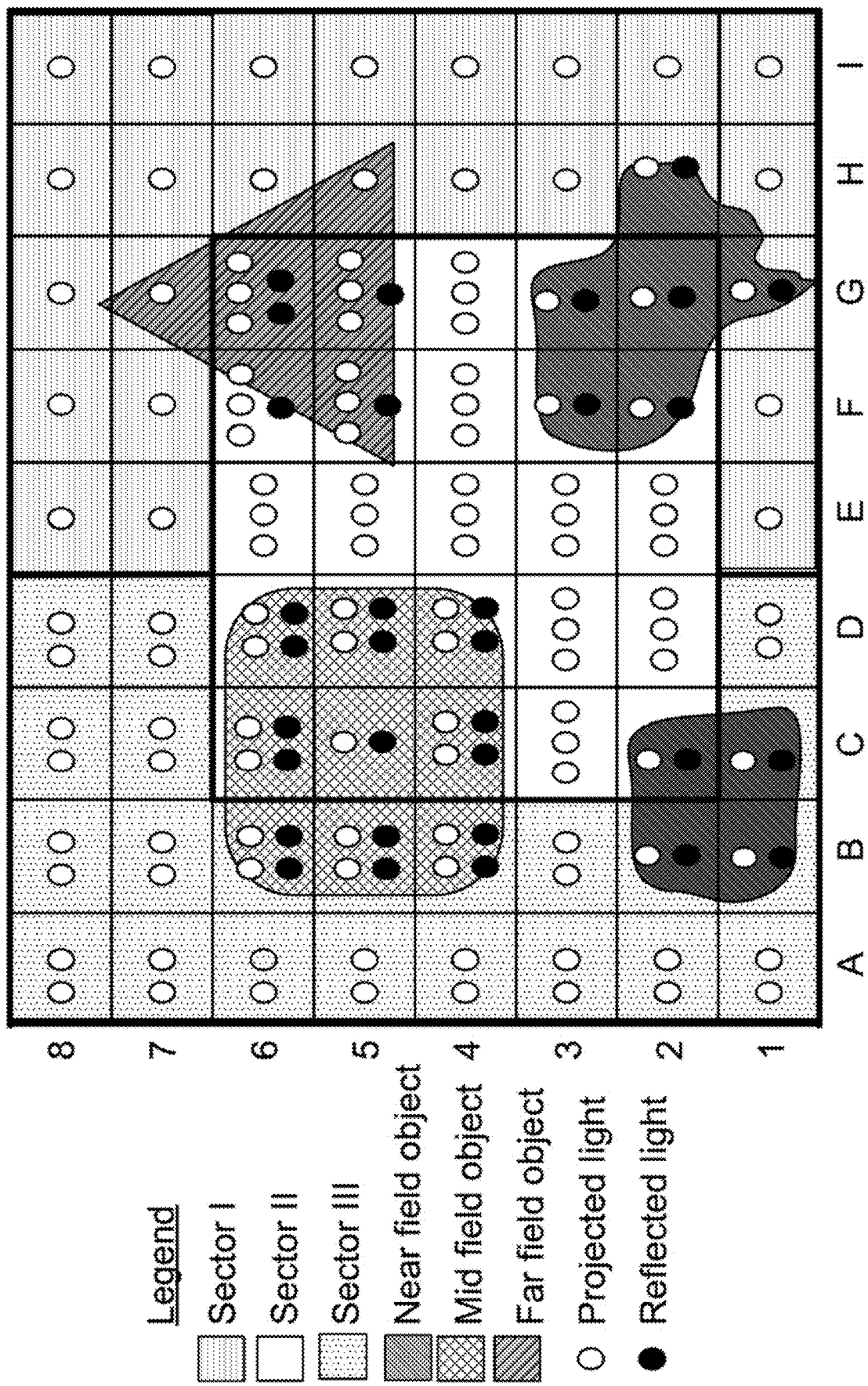
FIG. 5C is a diagram illustrating the actual light emission projected towards and reflections received during a single frame-time for the whole field of view.

FIGS. 5A-5C depict different functionalities of processing units 108 in accordance with some embodiments of the present disclosure. Specifically, FIG. 5A is a diagram illustrating emission patterns in a single frame-time for a single portion of the field of view, FIG. 5B is a diagram illustrating emission scheme in a single frame-time for the whole field of view, and. FIG. 5C is a diagram illustrating the actual light emission projected towards field of view during a single scanning cycle.

FIG. 5A illustrates four examples of emission patterns in a single frame-time for a single portion 122 of field of view 120 associated with an instantaneous position of at least one light deflector 114. Consistent with embodiments of the present disclosure, processing unit 108 may control at least one light source 112 and light deflector 114 (or coordinate the operation of at least one light source 112 and at least one light deflector 114) in a manner enabling light flux to vary over a scan of field of view 120. Consistent with other embodiments, processing unit 108 may control only at least one light source 112 and light deflector 114 may be moved or pivoted in a fixed predefined pattern.

Diagrams A-D in FIG. 5A depict the power of light emitted towards a single portion 122 of field of view 120 over time. In Diagram A, processor 118 may control the operation of light source 112 in a manner such that during scanning of field of view 120 an initial light emission is projected toward portion 122 of field of view 120. When projecting unit 102 includes a pulsed-light light source, the initial light emission may include one or more initial pulses (also referred to as "pilot pulses"). Processing unit 108 may receive from sensor 116 pilot information about reflections associated with the initial light emission. In one embodiment, the pilot information may be represented as a single signal based on the outputs of one or more detectors (e.g. one or more SPADs, one or more APDs, one or more SiPMs, etc.) or as a plurality of signals based on the outputs of multiple detectors. In one example, the pilot information may include analog and/or digital information. In another example, the pilot information may include a single value and/or a plurality of values (e.g. for different times and/or parts of the segment).

Based on information about reflections associated with the initial light emission, processing unit 108 may be configured to determine the type of subsequent light emission to be projected towards portion 122 of field of view 120. The determined subsequent light emission for the particular portion of field of view 120 may be made during the same scanning cycle (i.e., in the same frame) or in a subsequent scanning cycle (i.e., in a subsequent frame).

In Diagram B, processor 118 may control the operation of light source 112 in a manner such that during scanning of field of view 120 light pulses in different intensities are projected towards a single portion 122 of field of view 120. In one embodiment, LIDAR system 100 may be operable to generate depth maps of one or more different types, such as any one or more of the following types: point cloud model, polygon mesh, depth image (holding depth information for each pixel of an image or of a 2D array), or any other type of 3D model of a scene. The sequence of depth maps may be a temporal sequence, in which different depth maps are generated at a different time. Each depth map of the sequence associated with a scanning cycle (interchangeably "frame") may be generated within the duration of a corresponding subsequent frame-time. In one example, a typical frame-time may last less than a second. In some embodiments, LIDAR system 100 may have a fixed frame rate (e.g. 10 frames per second, 25 frames per second, 50 frames per second) or the frame rate may be dynamic. In other embodiments, the frame-times of different frames may not be identical across the sequence. For example, LIDAR system 100 may implement a 10 frames-per-second rate that includes generating a first depth map in 100 milliseconds (the average), a second frame in 92 milliseconds, a third frame at 142 milliseconds, and so on.

In Diagram C, processor 118 may control the operation of light source 112 in a manner such that during scanning of field of view 120 light pulses associated with different durations are projected towards a single portion 122 of field of view 120. In one embodiment, LIDAR system 100 may be operable to generate a different number of pulses in each frame. The number of pulses may vary between 0 to 32 pulses (e.g., 1, 5, 12, 28, or more pulses) and may be based on information derived from previous emissions. The time between light pulses may depend on desired detection range and can be between 500 ns and 5000 ns. In one example, processing unit 108 may receive from sensor 116 information about reflections associated with each light-pulse. Based on the information (or the lack of information), processing unit 108 may determine if additional light pulses are needed. It is noted that the durations of the processing times and the emission times in diagrams A-D are not in-scale. Specifically, the processing time may be substantially longer than the emission time. In diagram D, projecting unit 102 may include a continuous-wave light source. In one embodiment, the initial light emission may include a period of time where light is emitted and the subsequent emission may be a continuation of the initial emission, or there may be a discontinuity. In one embodiment, the intensity of the continuous emission may change over time.

Consistent with some embodiments of the present disclosure, the emission pattern may be determined per each portion of field of view 120. In other words, processor 118 may control the emission of light to allow differentiation in the illumination of different portions of field of view 120. In one example, processor 118 may determine the emission pattern for a single portion 122 of field of view 120, based on detection of reflected light from the same scanning cycle (e.g., the initial emission), which makes LIDAR system 100 extremely dynamic. In another example, processor 118 may determine the emission pattern for a single portion 122 of field of view 120, based on detection of reflected light from a previous scanning cycle. The differences in the patterns of the subsequent emissions may result from determining different values for light-source parameters for the subsequent emission, such as any one of the following:
a. Overall energy of the subsequent emission.
b. Energy profile of the subsequent emission.
c. A number of light-pulse-repetition per frame.
d. Light modulation characteristics such as duration, rate, peak, average power, and pulse shape.
e. Wave properties of the subsequent emission, such as polarization, wavelength, etc.

Consistent with the present disclosure, the differentiation in the subsequent emissions may be put to different uses. In one example, it is possible to limit emitted power levels in one portion of field of view 120 where safety is a consideration, while emitting higher power levels (thus improving signal-to-noise ratio and detection range) for other portions of field of view 120. This is relevant for eye safety, but may also be relevant for skin safety, safety of optical systems, safety of sensitive materials, and more. In another example, it is possible to direct more energy towards portions of field of view 120 where it will be of greater use (e.g. regions of interest, further distanced targets, low reflection targets, etc.) while limiting the lighting energy to other portions of field of view 120 based on detection results from the same frame or previous frame. It is noted that processing unit 108 may process detected signals from a single instantaneous field of view several times within a single scanning frame time; for example, subsequent emission may be determined upon after every pulse emitted, or after a number of pulses emitted.

FIG. 5B illustrates three examples of emission schemes in a single frame-time for field of view 120. Consistent with embodiments of the present disclosure, at least on processing unit 108 may use obtained information to dynamically adjust the operational mode of LIDAR system 100 and/or determine values of parameters of specific components of LIDAR system 100. The obtained information may be determined from processing data captured in field of view 120, or received (directly or indirectly) from host 210. Processing unit 108 may use the obtained information to determine a scanning scheme for scanning the different portions of field of view 120. The obtained information may include a current light condition, a current weather condition, a current driving environment of the host vehicle, a current location of the host vehicle, a current trajectory of the host vehicle, a current topography of road surrounding the host vehicle, or any other condition or object detectable through light reflection. In some embodiments, the determined scanning scheme may include at least one of the following: (a) a designation of portions within field of view 120 to be actively scanned as part of a scanning cycle, (b) a projecting plan for projecting unit 102 that defines the light emission profile at different portions of field of view 120; (c) a deflecting plan for scanning unit 104 that defines, for example, a deflection direction, frequency, and designating idle elements within a reflector array; and (d) a detection plan for sensing unit 106 that defines the detectors sensitivity or responsivity pattern.

In addition, processing unit 108 may determine the scanning scheme at least partially by obtaining an identification of at least one region of interest within the field of view 120 and at least one region of non-interest within the field of view 120. In some embodiments, processing unit 108 may determine the scanning scheme at least partially by obtaining an identification of at least one region of high interest within the field of view 120 and at least one region of lower-interest within the field of view 120. The identification of the at least one region of interest within the field of view 120 may be determined, for example, from processing data captured in field of view 120, based on data of another sensor (e.g. camera, GPS), received (directly or indirectly) from host 210, or any combination of the above. In some embodiments, the identification of at least one region of interest may include identification of portions, areas, sections, pixels, or objects within field of view 120 that are important to monitor. Examples of areas that may be identified as regions of interest may include, crosswalks, moving objects, people, nearby vehicles or any other environmental condition or object that may be helpful in vehicle navigation. Examples of areas that may be identified as regions of non-interest (or lower-interest) may be static (non-moving) far-away buildings, a skyline, an area above the horizon and objects in the field of view. Upon obtaining the identification of at least one region of interest within the field of view 120, processing unit 108 may determine the scanning scheme or change an existing scanning scheme. Further to determining or changing the light-source parameters (as described above), processing unit 108 may allocate detector resources based on the identification of the at least one region of interest. In one example, to reduce noise, processing unit 108 may activate detectors 410 where a region of interest is expected and disable detectors 410 where regions of non-interest are expected. In another example, processing unit 108 may change the detector sensitivity, e.g., increasing sensor sensitivity for long range detection where the reflected power is low.

Diagrams A-C in FIG. 5B depict examples of different scanning schemes for scanning field of view 120. Each square in field of view 120 represents a different portion 122 associated with an instantaneous position of at least one light deflector 114. Legend 500 details the level of light flux represented by the filling pattern of the squares. Diagram A depicts a first scanning scheme in which all of the portions have the same importance/priority and a default light flux is allocated to them. The first scanning scheme may be utilized in a start-up phase or periodically interleaved with another scanning scheme to monitor the whole field of view for unexpected/new objects. In one example, the light source parameters in the first scanning scheme may be configured to generate light pulses at constant amplitudes. Diagram B depicts a second scanning scheme in which a portion of field of view 120 is allocated with high light flux while the rest of field of view 120 is allocated with default light flux and low light flux. The portions of field of view 120 that are the least interesting may be allocated with low light flux.

Diagram C depicts a third scanning scheme in which a compact vehicle and a bus (see silhouettes) are identified in field of view 120. In this scanning scheme, the edges of the vehicle and bus may be tracked with high power and the central mass of the vehicle and bus may be allocated with less light flux (or no light flux). Such light flux allocation enables concentration of more of the optical budget on the edges of the identified objects and less on their center which have less importance.

FIG. 5C illustrating the emission of light towards field of view 120 during a single scanning cycle. In the depicted example, field of view 120 is represented by an 8×9 matrix, where each of the 72 cells corresponds to a separate portion 122 associated with a different instantaneous position of at least one light deflector 114. In this exemplary scanning cycle, each portion includes one or more white dots that represent the number of light pulses projected toward that portion, and some portions include black dots that represent reflected light from that portion detected by sensor 116. As shown, field of view 120 is divided into three sectors: sector I on the right side of field of view 120, sector II in the middle of field of view 120, and sector III on the left side of field of view 120. In this exemplary scanning cycle, sector I was initially allocated with a single light pulse per portion; sector II, previously identified as a region of interest, was initially allocated with three light pulses per portion; and sector III was initially allocated with two light pulses per portion. Also as shown, scanning of field of view 120 reveals four objects 208: two free-form objects in the near field (e.g., between 5 and 50 meters), a rounded-square object in the mid field (e.g., between 50 and 150 meters), and a triangle object in the far field (e.g., between 150 and 500 meters). While the discussion of FIG. 5C uses number of pulses as an example of light flux allocation, it is noted that light flux allocation to different parts of the field of view may also be implemented in other ways such as: pulse duration, pulse angular dispersion, wavelength, instantaneous power, photon density at different distances from light source 112, average power, pulse power intensity, pulse width, pulse repetition rate, pulse sequence, pulse duty cycle, wavelength, phase, polarization, and more. The illustration of the light emission as a single scanning cycle in FIG. 5C demonstrates different capabilities of LIDAR system 100. In a first embodiment, processor 118 is configured to use two light pulses to detect a first object (e.g., the rounded-square object) at a first distance, and to use three light pulses to detect a second object (e.g., the triangle object) at a second distance greater than the first distance. In a second embodiment, processor 118 is configured to allocate more light to portions of the field of view where a region of interest is identified. Specifically, in the present example, sector II was identified as a region of interest and accordingly it was allocated with three light pulses while the rest of field of view 120 was allocated with two or less light pulses. In a third embodiment, processor 118 is configured to control light source 112 in a manner such that only a single light pulse is projected toward to portions B1, B2, and C1 in FIG. 5C, although they are part of sector III that was initially allocated with two light pulses per portion. This occurs because the processing unit 108 detected an object in the near field based on the first light pulse. Allocation of less than maximal amount of pulses may also be a result of other considerations. For examples, in at least some regions, detection of object at a first distance (e.g. a near field object) may result in reducing an overall amount of light emitted to this portion of field of view 120.

Additional details and examples on different components of LIDAR system 100 and their associated functionalities are included in Applicant's U.S. patent application Ser. No. 15/391,916 filed Dec. 28, 2016; Applicant's U.S. patent application Ser. No. 15/393,749 filed Dec. 29, 2016; Applicant's U.S. patent application Ser. No. 15/393,285 filed Dec. 29, 2016; and Applicant's U.S. patent application Ser. No. 15/393,593 filed Dec. 29, 2016, which are incorporated herein by reference in their entirety.

Example Implementation: Vehicle

Figure 6C:
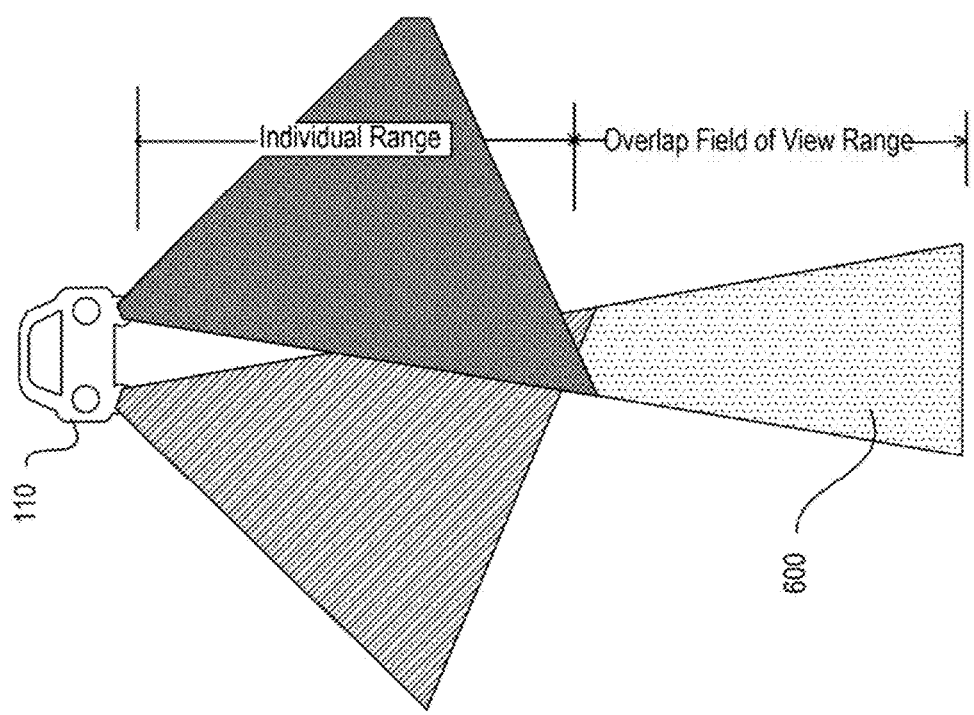
FIGS. 6A, 6B, and 6C are diagrams illustrating a first example implementation consistent with some embodiments of the present disclosure.
Figure 6A:
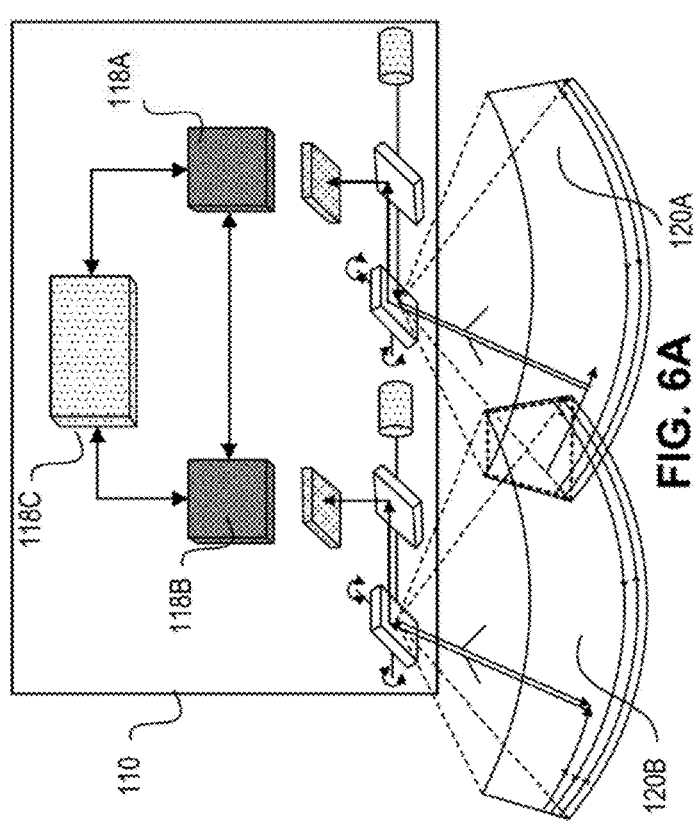
Figure 6B:
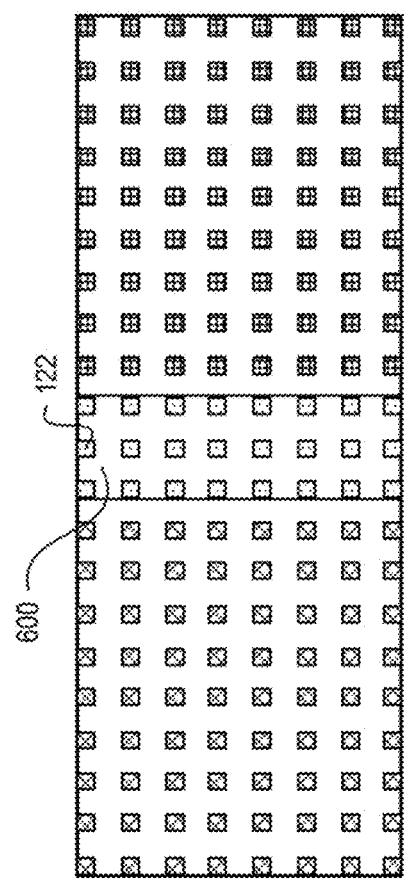

FIGS. 6A-6C illustrate the implementation of LIDAR system 100 in a vehicle (e.g., vehicle 110). Any of the aspects of LIDAR system 100 described above or below may be incorporated into vehicle 110 to provide a range-sensing vehicle. Specifically, in this example, LIDAR system 100 integrates multiple scanning units 104 and potentially multiple projecting units 102 in a single vehicle. In one embodiment, a vehicle may take advantage of such a LIDAR system to improve power, range and accuracy in the overlap zone and beyond it, as well as redundancy in sensitive parts of the FOV (e.g. the forward movement direction of the vehicle). As shown in FIG. 6A, vehicle 110 may include a first processor 118A for controlling the scanning of field of view 120A, a second processor 118B for controlling the scanning of field of view 120B, and a third processor 118C for controlling synchronization of scanning the two fields of view. In one example, processor 118C may be the vehicle controller and may have a shared interface between first processor 118A and second processor 118B. The shared interface may enable an exchanging of data at intermediate processing levels and a synchronization of scanning of the combined field of view in order to form an overlap in the temporal and/or spatial space. In one embodiment, the data exchanged using the shared interface may be: (a) time of flight of received signals associated with pixels in the overlapped field of view and/or in its vicinity; (b) laser steering position status; (c) detection status of objects in the field of view.

FIG. 6B illustrates overlap region 600 between field of view 120A and field of view 120B. In the depicted example, the overlap region is associated with 24 portions 122 from field of view 120A and 24 portions 122 from field of view 120B. Given that the overlap region is defined and known by processors 118A and 118B, each processor may be designed to limit the amount of light emitted in overlap region 600 in order to conform with an eye safety limit that spans multiple source lights, or for other reasons such as maintaining an optical budget. In addition, processors 118A and 118B may avoid interferences between the light emitted by the two light sources by loose synchronization between the scanning unit 104A and scanning unit 104B, and/or by control of the laser transmission timing, and/or the detection circuit enabling timing.

FIG. 6C illustrates how overlap region 600 between field of view 120A and field of view 120B may be used to increase the detection distance of vehicle 110. Consistent with the present disclosure, two or more light sources 112 projecting their nominal light emission into the overlap zone may be leveraged to increase the effective detection range. The term "detection range" may include an approximate distance from vehicle 110 at which LIDAR system 100 can clearly detect an object. In one embodiment, the maximum detection range of LIDAR system 100 is about 300 meters, about 400 meters, or about 500 meters. For example, for a detection range of 200 meters, LIDAR system 100 may detect an object located 200 meters (or less) from vehicle 110 at more than 95%, more than 99%, more than 99.5% of the times. Even when the object's reflectivity may be less than 50% (e.g., less than 20%, less than 10%, or less than 5%). In addition, LIDAR system 100 may have less than 1% false alarm rate. In one embodiment, light from projected from two light sources that are collocated in the temporal and spatial space can be utilized to improve SNR and therefore increase the range and/or quality of service for an object located in the overlap region. Processor 118C may extract high-level information from the reflected light in field of view 120A and 120B. The term "extracting information" may include any process by which information associated with objects, individuals, locations, events, etc., is identified in the captured image data by any means known to those of ordinary skill in the art. In addition, processors 118A and 118B may share the high-level information, such as objects (road delimiters, background, pedestrians, vehicles, etc.), and motion vectors, to enable each processor to become alert to the peripheral regions about to become regions of interest. For example, a moving object in field of view 120A may be determined to soon be entering field of view 120B.

Example Implementation: Surveillance System

Figure 6D:
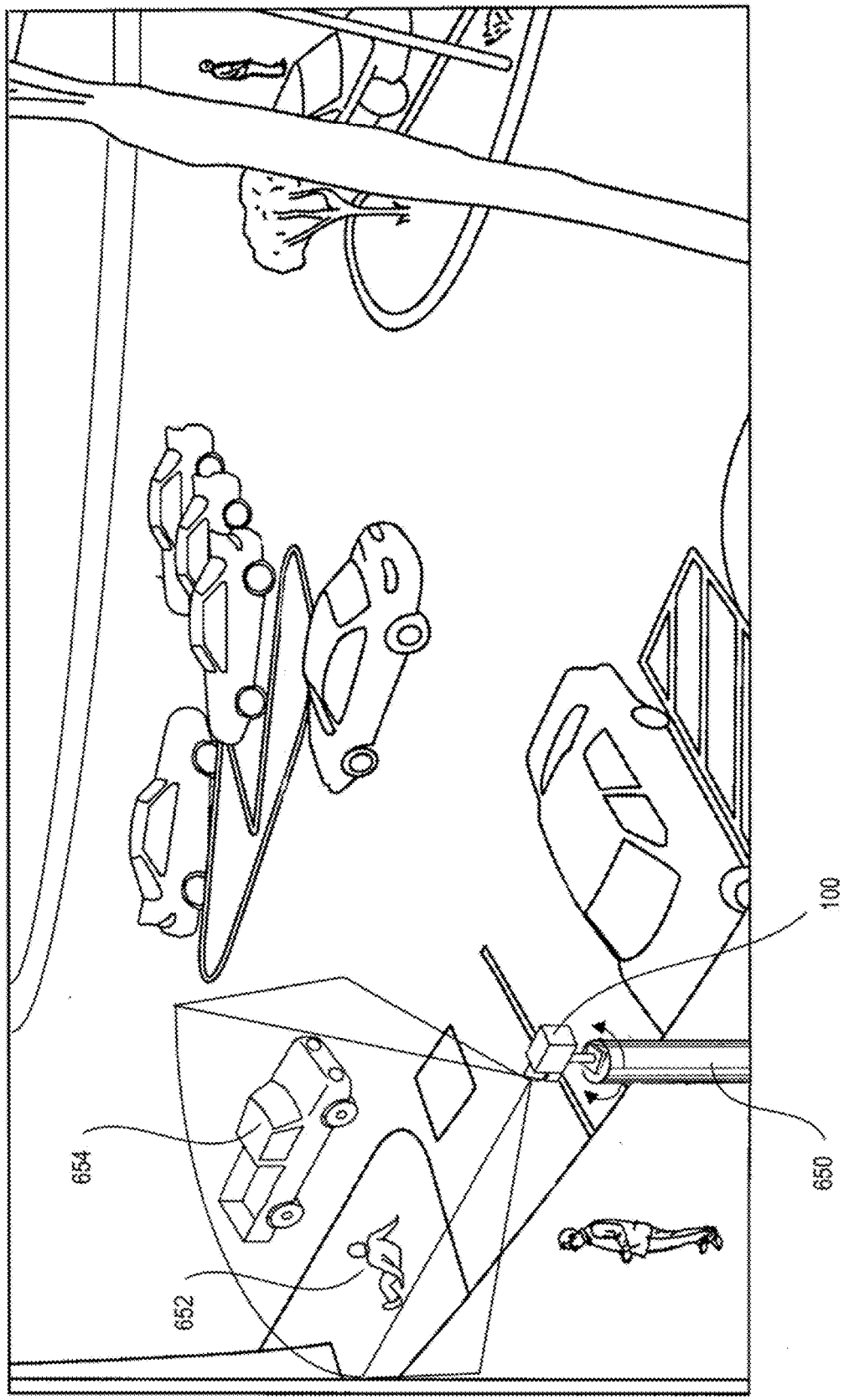
FIG. 6D is a diagram illustrating a second example implementation consistent with some embodiments of the present disclosure.

FIG. 6D illustrates the implementation of LIDAR system 100 in a surveillance system. As mentioned above, LIDAR system 100 may be fixed to a stationary object 650 that may include a motor or other mechanism for rotating the housing of the LIDAR system 100 to obtain a wider field of view. Alternatively, the surveillance system may include a plurality of LIDAR units. In the example depicted in FIG. 6D, the surveillance system may use a single rotatable LIDAR system 100 to obtain 3D data representing field of view 120 and to process the 3D data to detect people 652, vehicles 654, changes in the environment, or any other form of security-significant data.

Consistent with some embodiment of the present disclosure, the 3D data may be analyzed to monitor retail business processes. In one embodiment, the 3D data may be used in retail business processes involving physical security (e.g., detection of: an intrusion within a retail facility, an act of vandalism within or around a retail facility, unauthorized access to a secure area, and suspicious behavior around cars in a parking lot). In another embodiment, the 3D data may be used in public safety (e.g., detection of: people slipping and falling on store property, a dangerous liquid spill or obstruction on a store floor, an assault or abduction in a store parking lot, an obstruction of a fire exit, and crowding in a store area or outside of the store). In another embodiment, the 3D data may be used for business intelligence data gathering (e.g., tracking of people through store areas to determine, for example, how many people go through, where they dwell, how long they dwell, how their shopping habits compare to their purchasing habits).

Consistent with other embodiments of the present disclosure, the 3D data may be analyzed and used for traffic enforcement. Specifically, the 3D data may be used to identify vehicles traveling over the legal speed limit or some other road legal requirement. In one example, LIDAR system 100 may be used to detect vehicles that cross a stop line or designated stopping place while a red traffic light is showing. In another example, LIDAR system 100 may be used to identify vehicles traveling in lanes reserved for public transportation. In yet another example, LIDAR system 100 may be used to identify vehicles turning in intersections where specific turns are prohibited on red.

Virtual Protective Housing (VPH) for Bistatic LIDAR

In some instances, it may be desirable to detect objects at very close distances, which may be especially important for eye safety. In normal circumstances, the LIDAR system may be configured to detect objects, such as individuals, within an illuminated space and limit the light emitted by the LIDAR system to ensure that eye-safe levels are maintained for the object. In some instances, however, objects within the illuminated space may not be detected by the LIDAR system. For example, there may be a blind spot region in which an object is illuminated by the LIDAR system but is out of a detection area of the sensors of the LIDAR system. This may occur, for example, in LIDAR systems in which different optical windows and/or different optical paths are used for emission of light and for detecting of light reflections. Accordingly, additional means for detecting objects at a close range may be provided to limit unsafe light exposure levels.

Figure 7A:
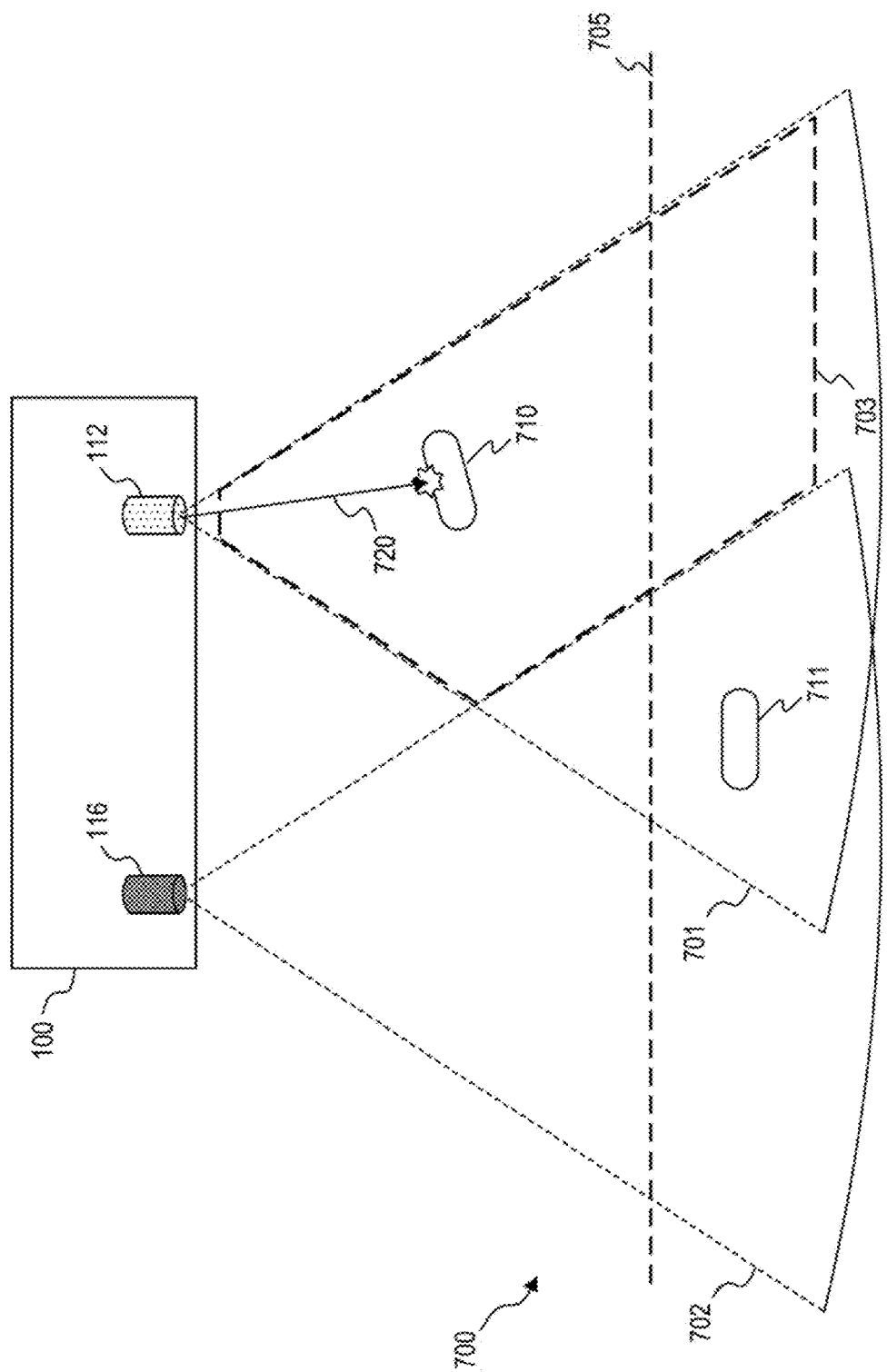
FIG. 7A is a diagram illustrating an example field of view of a LIDAR system consistent with some embodiments of the present disclosure.

FIG. 7A is a diagram illustrating an example field of view of a LIDAR system 100 consistent with some embodiments of the present disclosure. In the embodiment shown in FIG. 7A, LIDAR system 100 may be a bi-static system, as described above with respect to FIG. 2A. Accordingly, light emitted by LIDAR system 100 and reflected light entering LIDAR system 100 may pass through substantially different optical paths. The bi-static configuration of LIDAR system 100 may include light source 112 and sensor 116 (e.g., a "main sensor"), as shown.

In the bi-static configuration, the entire field of view of LIDAR system 100 may not be entirely covered by light source 112 and/or sensor 116. For example, LIDAR system 100 may be configured to detect objects in an environment 700 (which, may correspond to field of view 120, discussed above with respect to FIG. 1A). As illustrated in FIG. 7A, in some embodiments, light source 112 may project light only on a portion of environment 700 corresponding to illuminated space 701, and sensor 116 may detect light only from a field of view 702 of the sensor. Ideally, illuminated space 701 and field of view 702 would completely overlap (or overlap as much as possible), thus maximizing the instantaneous field of view of LIDAR system 100. However, due to the nature of bi-static configurations, portions 701 and 702 may not completely overlap, as shown in FIG. 7A. Accordingly, environment 700 may include a blind spot region 703 representing a region that is within illuminated space 701 but is outside of field of view 702. Accordingly, any light reflected by objects within blind spot region 703 may not be detectable by sensor 116 and thus may not be perceived by LIDAR system 100. It is to be understood that the field of view of LIDAR system 100 shown in FIG. 7A is provided by way of example only and the relative ranges of portions 701 and 702 may be exaggerated over scenarios that may exist in the real world for illustrative purposes. Further, FIG. 7A is a diagrammatic representation of LIDAR system 100 and, accordingly, LIDAR system 100 may include light deflectors, windows, and/or other components besides sensor 116 and light source 112, as described in greater detail above. Further, the present disclosure may also pertain to LIDAR systems other than the configuration shown in FIG. 7A.

As a result of the effect described above, additional means for detecting light reflected from within blind spot region 703 may be provided. For example, LIDAR system 100 may be configured to detect presence of objects within blind spot region 703 for the purposes of limiting or regulating the amount or intensity of light that is emitted by light source 112. This may be important, for example, to make LIDAR system 100 eye-safe and to comply with various safety regulations. Light source 112 may emit light within illuminated space 701 in a scanning pattern, as described above. In some embodiments, LIDAR system 100 may be configured to detect objects, such as object 711, within environment 700 and may adjust the intensity or illumination power of light source 112 based on the detected objects. For example, LIDAR system 100 may detect an individual or other object using sensor 116 that may be harmed by light emitted by light source 112 and may limit the amount or intensity of light transmitted in the direction of the object. If object 711 is an individual (e.g., a person), this may result in an eye-safe illumination level being directed towards the individual.

In this scenario, however, blind spot region 703 may present a heightened risk of eye damage. This may be especially true at close ranges (e.g., within a distance threshold 705) where illuminated space 701 and field of view 702 do not intersect. As shown in FIG. 7A, light source 112 may emit light 720 that is directed towards an object 710 (e.g., an individual) within blind spot region 703. Because light reflected by object 710 may not be detected by sensor 116 in the LIDAR system shown in FIG. 7A, LIDAR system 100 may not be able to adjust the intensity or illumination power of light source 112 and thus object 710 may be subjected to higher intensities of light than object 711 would be subjected to. Accordingly, object 710 may be at a higher risk of eye damage or other effects of the higher intensity light. Accordingly, LIDAR system 100 may include a supplementary sensor or other means for detecting objects within blind spot region 703. While a bi-static LIDAR system is discussed throughout the present disclosure, it is understood that the embodiments disclosed herein may be similarly applied in other types of LIDAR systems where not all of the illuminated region may be detected by a LIDAR sensor.

Figure 7B:
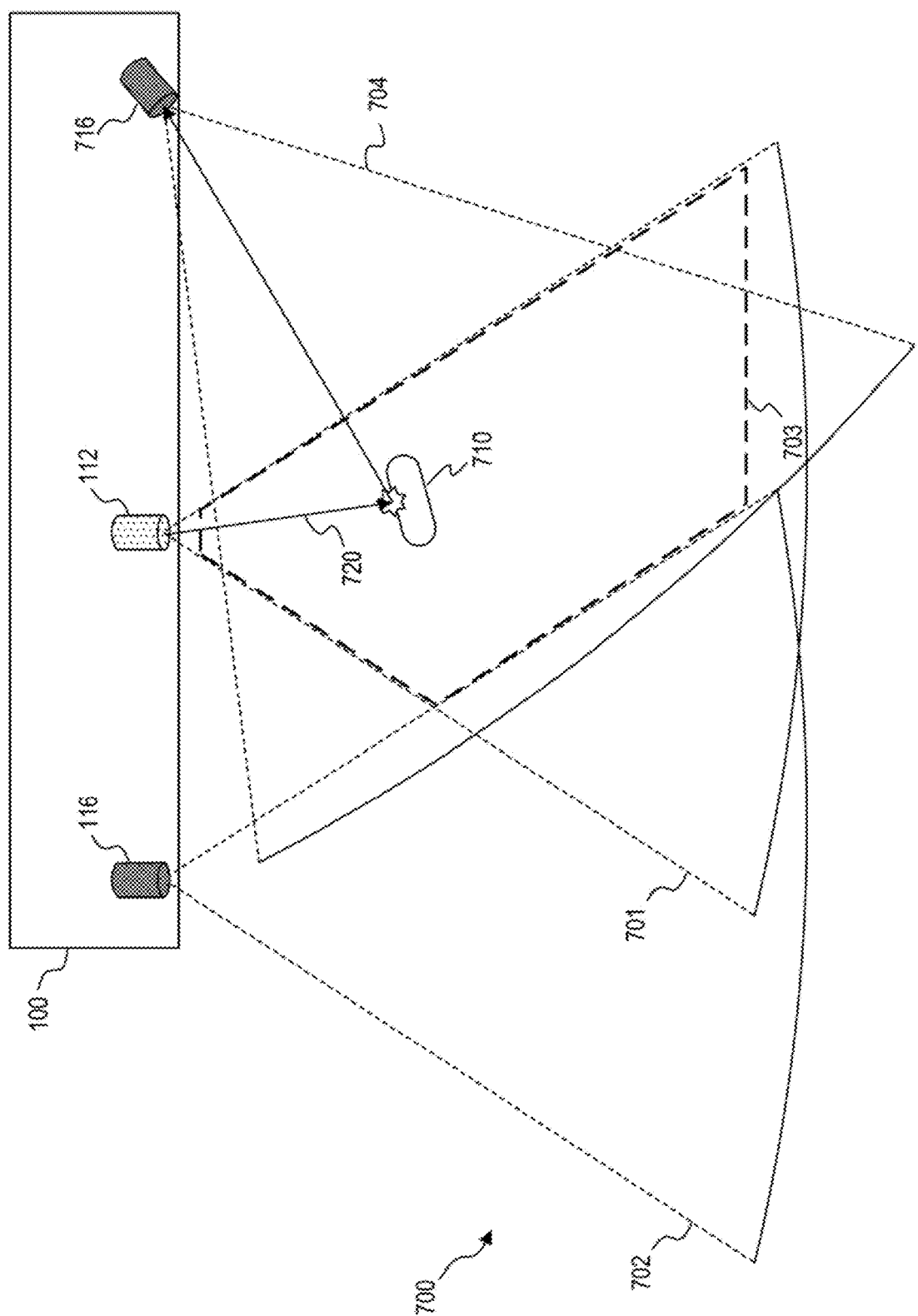
FIG. 7B is a diagram illustrating an example field of view of a LIDAR system that includes a supplementary sensor consistent with some embodiments of the present disclosure.

FIG. 7B is a diagram illustrating an example field of view of a LIDAR system 100 that includes a supplementary sensor 716 consistent with some embodiments of the present disclosure. Supplementary sensor 716 may be configured to detect light reflected from objects within blind spot region 703. Supplementary sensor 716 may be configured to detect light from within a supplementary sensor field of view 704. Supplementary sensor 716 may be configured such that supplementary sensor field of view 704 covers all or part of blind spot region 703 (or multiple blind spot regions 703). Accordingly, when light 720 emitted from light source 112 is directed towards object 710, light reflected by object 710 may be detected by supplementary sensor 716. LIDAR system 100 may therefore be capable of detecting object 710 and may adjust the intensity or amount of light directed towards object 710 accordingly. This may allow LIDAR system 100 to maintain a safe light exposure level within illuminated space 701 and may allow LIDAR system 100 to comply with one or more safety regulations. Accordingly, by including supplementary sensor 716, LIDAR system 100 may include a virtual "protective housing" to reduce safety risks associated with the LIDAR system.

Supplementary sensor 716 may be the same type or a similar type of sensor as sensor 116 and, accordingly, any features, characteristics, and/or embodiments of sensor 116 described above may also apply to supplementary sensor 716. For example, supplementary sensor 716 may include a plurality of detection elements for detecting photons of a photonic pulse reflected back from supplementary sensor field of view 704. The detection elements may all be included in a detector array (similar to detector array 400 described above. The detection elements may operate concurrently or partially concurrently with each other. In some embodiments, sensor 716 may include an array of be a SiPM (Silicon photomultipliers) and may comprise an array of single photon avalanche diodes (SPAD) serving as detection elements on a common silicon substrate. As described above, each SPAD may have a recovery time of between about 20 ns and about 100 ns. Similar photomultipliers from other, non-silicon materials may also be used. Further, as discussed above, more than one type of sensor may be implemented (e.g. SiPM and APD). Supplementary sensor 716 may include at least one APD integrated into an SiPM array and/or at least one APD detector located next to a SiPM on a separate or common silicon substrate. In some embodiments, supplementary sensor 716 may be different from sensor 116. Supplementary sensor 716 may advantageously be a cheaper form of sensor (e.g., a lower quality, lower complexity, etc.) as it may not be involved with time-of-flight analysis to reduce cost. Supplementary sensor 716 may advantageously be a less expensive form of sensor (e.g., a lower quality, lower complexity, etc.) as it may not detect very low intensity reflection levels (as reflections from nearby objects are expected to include a relatively large density of photons). Supplementary sensor 716 may be a camera or other form of sensor. In some embodiments, sensor 116 may comprise a first type of photodiode sensor and supplementary sensor 716 may include a second type of photodiode sensor. The second type of photo diode sensor may have a recovery time that is shorter than the recovery time of the first type of photodiode sensor.

Sensor 116, light source 112, and/or supplementary sensor 716 may be contained within a single housing or may be divided among a plurality of housings. For example, in some embodiments, sensor 116, light source 112, and supplementary sensor 716 may all be contained within housing 200, described above. In some embodiments, supplementary sensor 716 may be disposed external to housing 200. For example, in embodiments where LIDAR system 100 is used for navigation, housing 200 may be mounted on vehicle 110. Supplementary sensor 716 may be mounted to or incorporated into another part of vehicle 110, such as a bumper, a fender, a side panel, a spoiler, a roof, a headlight assembly, a taillight assembly, a rear-view mirror assembly, a hood, a trunk or any other suitable part of vehicle 110 and may include a separate housing. Accordingly, supplementary sensor 716 may be placed within a few centimeters from housing 200 (e.g., under 5 cm, 10 cm, 20 cm, etc.). In some embodiments, supplementary sensor 716 may be disposed at a different angle than sensor 116. For example, an optical axis of supplementary sensor 716 may be tilted (e.g., by at least 10°, 20°, 30°, 40°, 50°, 60°) with respect to an optical axis of the LIDAR sensor.

Figure 8A:
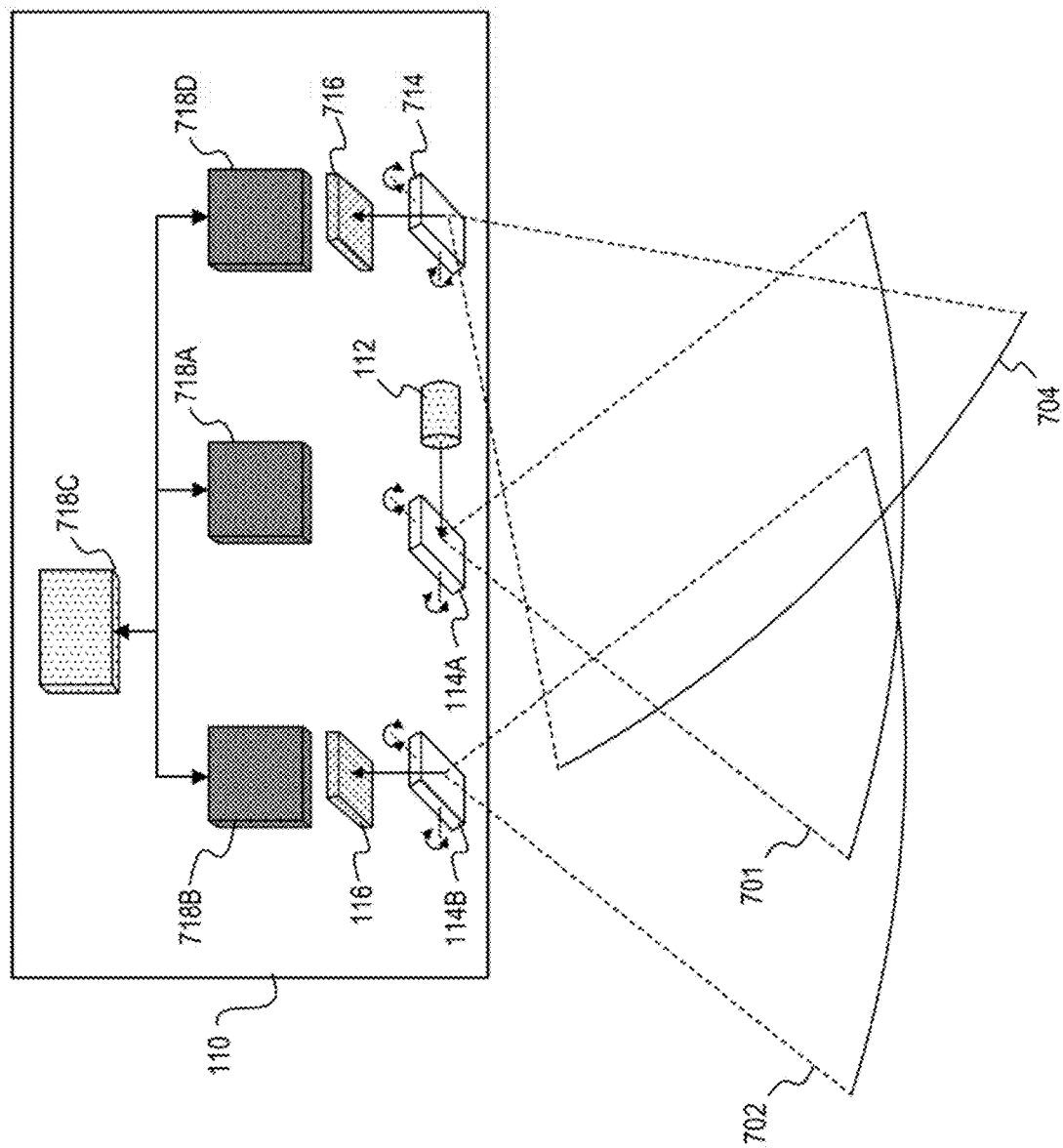
FIG. 8A-8C are diagrams illustrating example configurations of a LIDAR system including a supplementary sensor consistent with some embodiments of the present disclosure.

LIDAR system 100 may include one or more additional components associated with supplementary sensor 716 for mitigating risk of eye damage associated with the LIDAR system. FIG. 8A is a diagram illustrating an example configuration of LIDAR system 100 including a supplementary sensor 716 consistent with some embodiments of the present disclosure. As described above, in the embodiment shown in FIG. 8A, LIDAR system 100 may comprise a bi-static configuration. Accordingly, LIDAR system 100 may include light deflectors 114A and 114B associated with the main scanning and sensing functions. A first light deflector 114A may be configured to deflect outbound light from light source 112 and a second light deflector 114B may be configured to deflect inbound light towards sensor 112. It is understood, however, that he present disclosure may also apply to LIDAR systems without light deflectors (e.g., where the light source is not controllable). LIDAR system 100 may further include one or more processors. Similar to the embodiments described above, LIDAR system 100 may include a processor 718A for regulating operation of light source 112 and/or light deflector 114A and a processor 718B for regulating operation of sensor 116 and/or light deflector 114B. LIDAR system 100 may include additional processors, such as processor 718C which may coordinate various functions associated with light source 112 and/or sensor 116.

LIDAR system 100 may further include additional components associated with supplementary sensor 716, such as light deflector 714 and processor 718D. Light deflector 714 may be configured to deflect inbound light (e.g., light from supplementary sensor field of view 704) towards supplementary light sensor 716. Light deflector 714 (as with light deflectors 114A and 114B) may be a scanning light deflector (as described above) or may be a non-scanning light deflector. Processor 718D may be configured to control or regulate operation of sensor 716 and/or light deflector 714 and may be configured to perform one or more of the operations described herein (e.g., process 900). Processor 718D may be configured to communicate with processors 718A, 718B, and/or 718C and operation of supplementary sensor 716 and/or light deflector 714 may be coordinated with light source 112, sensor 116, light deflectors 114A and 114B, and/or other components of LIDAR system 100.

As described above with respect to FIG. 7B, supplementary sensor 716 may be configured to detect light reflected by objects within blind spot region 703. In some embodiments, the reflected light may be emitted by light source 112. In other embodiments, supplementary sensor 716 may be associated with a supplementary light source. The supplementary light source may be a more simplified light source than light source 112 (e.g., an LED, etc.) or may be similar to light source 112 (e.g., including a supplementary light deflector, etc.). Supplementary sensor 716 and the supplementary light source may be in a monostatic or bistatic configuration, as described above. In some embodiments, supplementary sensor 716 may be configured to determine distances to objects within blind spot region 703 using time-of-flight information, either based on light emitted from light source 112 or a supplementary light source. Addition object detection functionalities of supplementary sensor 716 are described below with respect to FIG. 8C.

In some embodiments, one or more of the components shown in FIG. 8A may be grouped together or associated with each other. For example, light deflectors 114A and 114B may be part of scanning unit 104, described above. Light deflector 714 may also be part of scanning unit 104, or may be separate. Similarly, supplementary sensor 716 may be part of sensing unit 106 and processor 718D may be part of processing unit 108. Processor 718C may further be configured to coordinate operation of supplementary sensor 716 and light deflector 714, as well as other components of LIDAR system 100.

In some embodiments, LIDAR system 100 may have more or fewer components than those shown in FIG. 8A. For example, the operations performed by one or more of processors 718A, 718B, 718C, and 718D may be performed by a single processor or may be split among additional processors. LIDAR system 100 may comprise a single processor configured to control each of projecting unit 102, scanning unit 104, and/or sensing unit 106, which may also include supplementary sensor 716 and/or light deflector 714.

LIDAR system 100 may further include one or more optical windows, such as optical window 124, described above. Light deflectors 114A, 114B, and 714 may all be associated with a single optical window, or may be associated with multiple optical windows. For example, deflectors 114A and 114B may be associated with a first optical window and light deflector 714 may be associated with a second optical window, etc. One skilled in the art will appreciate that the depicted configurations of LIDAR system 100 may have numerous variations and modifications.

Figure 8B:
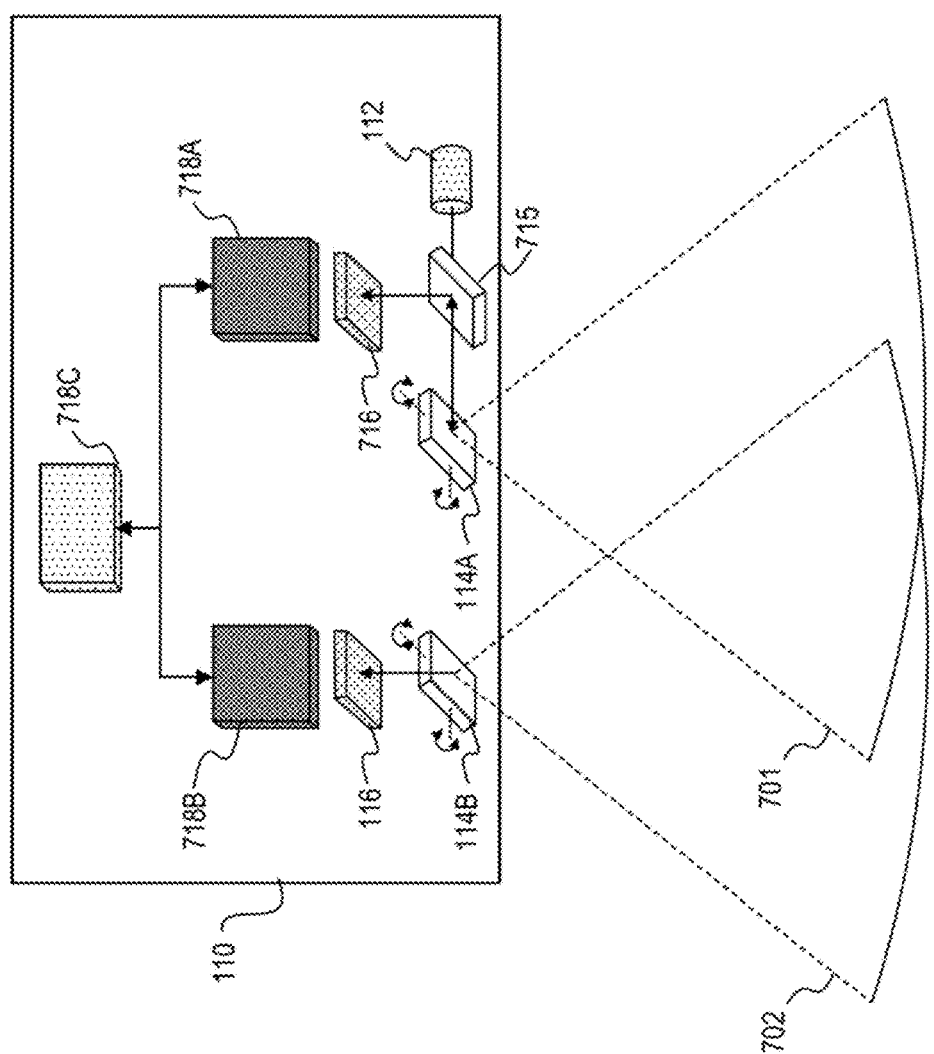

In some embodiments, supplementary sensor 716 may be configured to share an optical path with light source 112. FIG. 8B is a diagram illustrating another example configuration of LIDAR system 100 including a supplementary sensor 716 consistent with some embodiments of the present disclosure. In this embodiment, supplemental sensor 716 and light source 112 may both use a single light deflector (e.g., 114A). Accordingly, light deflector 114A may comprise an asymmetrical deflector, as described above. LIDAR system 100 may further comprise an asymmetrical deflector 715 configured to allow light from light source 112 to pass through to light deflector 114A but to deflect light received at light deflector 114A to sensor 716, as shown. In this configuration, illuminated space 701 and supplementary sensor field of view 704 may be the same, thereby ensuring that eye-safe levels are maintained throughout the scanning range of light source 112. In another embodiment, rather than including asymmetrical deflector 715, light deflector 114A may comprise a plurality of mirrors in an array. In this embodiment, a first mirror of the plurality of mirrors may be configured to direct light from the light source towards illuminated space 701 and at least a second mirror of the plurality of mirrors may be configured to direct reflection signals from the illuminated space toward supplementary sensor 716.

In some embodiments, supplementary sensor 716 may be limited to close- or short-range detection. In some embodiments, LIDAR system 100 may further include a filter to reduce the intensity of light received by supplementary sensor 716. Accordingly, light reflected off more distant targets will be diminished by the filter. LIDAR system 100 may use a light source of different parameters (e.g., wavelength, coding, etc.) with a low intensity. In other embodiments, LIDAR system 100 may limit the time after light is emitted by light source 112 in which supplementary sensor 716 measures reflected light. Therefore, based on the speed at which light travels, LIDAR system 100 may limit supplementary sensor 716 to close-range detection.

Figure 8C:
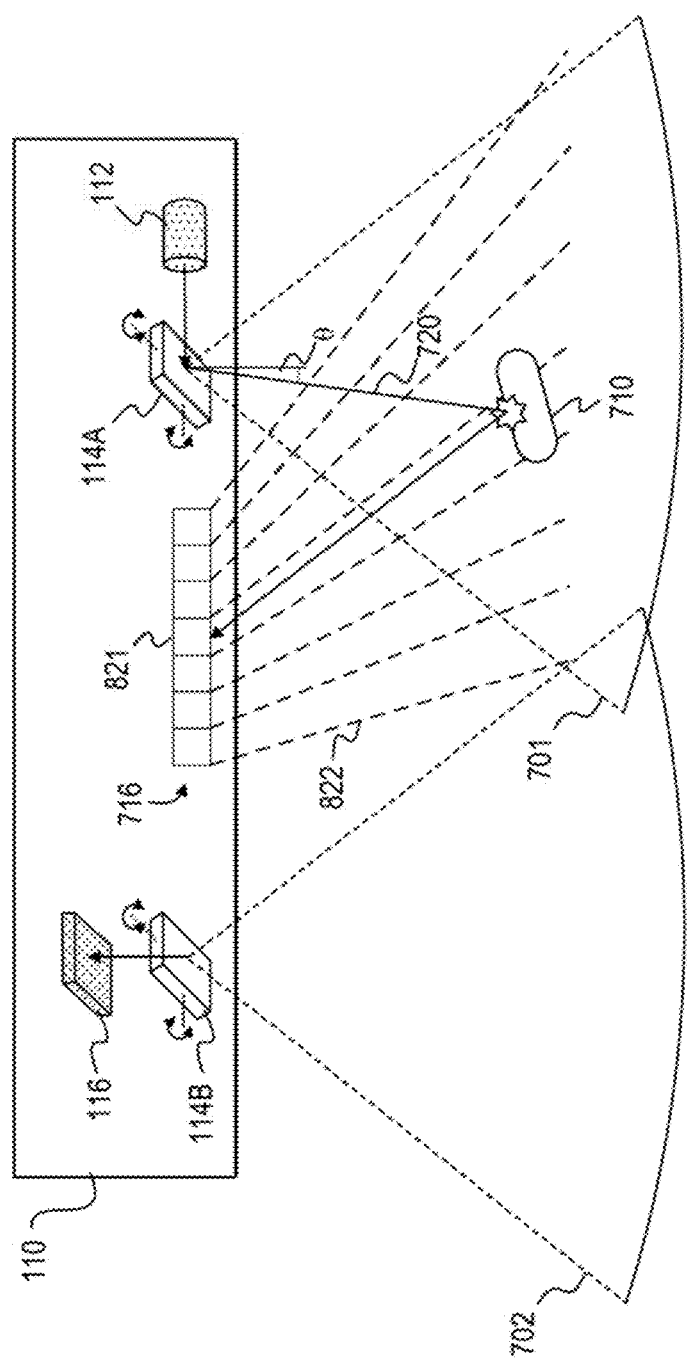

In other example embodiments, supplementary sensor 716 may be configured to determine a distance to object 710. FIG. 8C is a diagram illustrating another example configuration of LIDAR system 100 including a supplementary sensor 716 consistent with some embodiments of the present disclosure. In this embodiment, supplementary sensor 716 may comprise an array of detecting elements configured to receive light reflected from supplementary sensor field of view 704 (not shown). Each detecting element may be associated with a particular angle, as illustrated by dashed line 822. The detecting elements may be arranged such that the angles of the detecting elements cover blind spot region 703. Using this configuration, LIDAR system 100 may be able to detect objects within blind spot region and may further determine an approximate distance, position, size, shape, etc. of the objects. For example, light source 112 may emit light 720, which may be reflected off of object 710. Light 720 may be emitted at a known angle, θ, based on the position of light deflector 114A at the time light 720 is emitted. Based on which detecting element receives the light reflected by object 710, LIDAR system 100 may be configured to determine a distance to object 710 relative to LIDAR system 100. For example, if the reflected light is received at detecting element 821, based on the distance between detecting element 821 and light deflector 114A, the angle θ in which light 720 is transmitted, and the direction of an instantaneous field-of-view of detecting element 821, the distance to object 821 may be determined based on trigonometry (e.g., using a look-up table—LUT—or computation). An approximate size and shape of object 710 may also be determined based on the number of detecting elements of supplementary sensor 716 that detect light reflected by object 710. Such information may be useful in regulating light sensor 112 and/or light deflector 114A to reduce the intensity of light directed towards object 710. For example, LIDAR system 100 selectively regulate light intensity based on the position of object 710. In other words, LIDAR system 100 may be configured to reduce the intensity of light directed towards a region of illuminated space 701 where object 710 is positioned, but may maintain a normal operating intensity for all other regions.

Supplementary sensor 716 shown in FIG. 8C is simplified for illustrative purposes and may contain additional detecting elements at varying angles. In some embodiments, supplementary sensor may be a 2-D array with angles ranging horizontally (as shown in FIG. 8C) and/or vertically as well. Other configurations may also be used, such as a tilted or staggered 2-D array, a hexagonal array, or any other suitable arrangement. FIG. 8D is a diagram illustrating an example supplementary sensor 716 consistent with some embodiments of the present disclosure. As shown, supplementary sensor 716 may comprise a 2-D array of detecting elements 821. The detecting elements may each have an associated angle and may be arranged to cover blind spot region 703 in 3-D space. Using the techniques described above with respect to FIG. 8C, LIDAR system 100 may more accurately detect objects within blind spot region 703, especially at close distances. In some embodiments, sensor 116 and supplementary sensor 716 may be included on a single chip comprising a plurality of detecting elements, as shown in FIG. 8D. A portion of the detecting elements (illustrated by the bounded region associated with supplementary sensor 716) may be configured for detecting objects within blind spot region 703. The remaining detecting elements may be associated with normal time-of-flight object detection as described in detail above. It is understood that the present disclosure is not limited to the configuration of detecting elements shown in FIG. 8D. The detecting elements associated with supplementary sensor 716 may be arranged in any number of rows or columns, a grouping of detecting elements that does not include an entire row and/or column, a range of dispersed detecting elements, or any other suitable configuration.

In other example embodiments, LIDAR system 100 may include additional optical components configured to diffract light from environment 700 such that objects within blind spot region 703 may be detected. FIG. 8E is a diagram illustrating another example configuration of LIDAR system 100 including a supplementary sensor 716 consistent with some embodiments of the present disclosure. LIDAR system 100 may include an additional optical component 814 configured to diffract light. In some embodiments, optical component 814 may be configured to diffract light from a field of view 804 and direct it to supplementary sensor 716. Optical component 814 may be configured such that field of view 804 covers or includes blind spot region 703. Therefore, supplementary sensor 716 may detect objects within field of view 804 through optical component 814. In some embodiments, sensor 116 and supplementary sensor 716 may be disposed on the same chip. For example, sensor 116 may comprise an array of detecting elements and supplementary sensor 716 may comprise a subset of the detecting elements, as described above with respect to FIG. 8D.

Optical component 814 may be any optical component configured to receive light from field of view 804 and direct it towards supplementary sensor 716. For example, optical component 814 may be a lens configured to diffract light from environment 700. In some embodiments, optical component 814 may be a multi-faceted lens wherein one or more facets diffract light from field of view 804 towards supplementary sensor 716 and other facets diffract light from field of view 702 and diffract it towards sensor 116. Optical component 814 may be a window, a mirror, a prism, or any combination of these or similar components. In some embodiments, optical component 814 may be a scanning light deflector, such as light deflector 114A. The light deflector may be configured to scan in a direction of field of view 804. In some embodiments, optical component 814 may be applied selectively. For example, field of view 804 may only be scanned periodically to detect objects in blind spot region 703. Accordingly, optical component 814 may have motors or other actuators to selectively diffract light from field of view 804. In embodiments where optical component is applied selectively, sensor 116 and supplementary sensor 716 may be a single sensor configured to operate in different modes (e.g., time-of-flight detection associated with normal operation, and object detection within blind spot region 703 for eye safety purposes). In some embodiments, optical component 814 may be associated with light source 112 and may periodically redirect light for close-range detection of objects. In such embodiments, the redirected light may be transmitted before the main light source such that objects can be detected first and LIDAR system 100 can react to the detected objects.

LIDAR system 100 may be configured to regulate light source 112 and/or light deflector 114A to prevent an accumulated energy density from exceeding a maximum permissible exposure. For example, processor 718C may determine, based on reflection signals received from supplementary sensor 716 (and/or processor 718D) that object 710 is within a predetermined distance from light deflector 114A. Accordingly, processor 718C and/or processor 718D may determine a distance to object 710 using the methods described above or any suitable known methods.

The predetermined distance may be a predefined safety distance associated with operation of LIDAR system 100. For example, the predetermined distance may be associated with a maximum distance from light deflector 114A where eye safety may be a concern (e.g., based on the intensity of light source 112). For example, the predetermined distance may be greater when the intensity of light source 112 is increased. The predetermined distance may also be defined based on an applicable industry or governmental regulation or other predefined value.

Processor 718C (and/or processor 718A) may be configured to regulate light source 112 and/or light deflector 114A to prevent an accumulated energy density within the predetermined distance from exceeding a maximum permissible exposure. For example, processor 718C may regulate light source 112 by limiting the amount or intensity of light emitted by light source 112. Alternatively, or additionally, processor 718C may regulate light deflector 114A to direct light away from object 710 or otherwise reduce the energy density within the predetermined distance. The maximum permissible exposure may correspond to a maximum exposure level that is deemed safe for human eyes. In some embodiments, the maximum permissible exposure may be a predefined value within LIDAR system 100 (e.g., corresponding to a safety limit complying with eye safety regulations, etc.). The maximum permissible exposure may also be associated with the distance from light deflector 114A and/or an exposure time that is eye-safe at a given distance. For example, processor 718C may determine a distance to the at least one object and calculate the intensity of light at object 710. For example, the intensity at object 710 may be based on the light intensity emitted by light source 112 and a known or estimated amount of degradation or reduction of the light intensity at various distances. Processor 718C may regulate light source 112 and/or light deflector 114A by determining an exposure time that is eye-safe at the determined distance based on the determined light intensity at that distance. In some embodiments, the predetermined distance may comprise multiple predetermined distances, each with a corresponding maximum permissible exposure.

Figure 9:
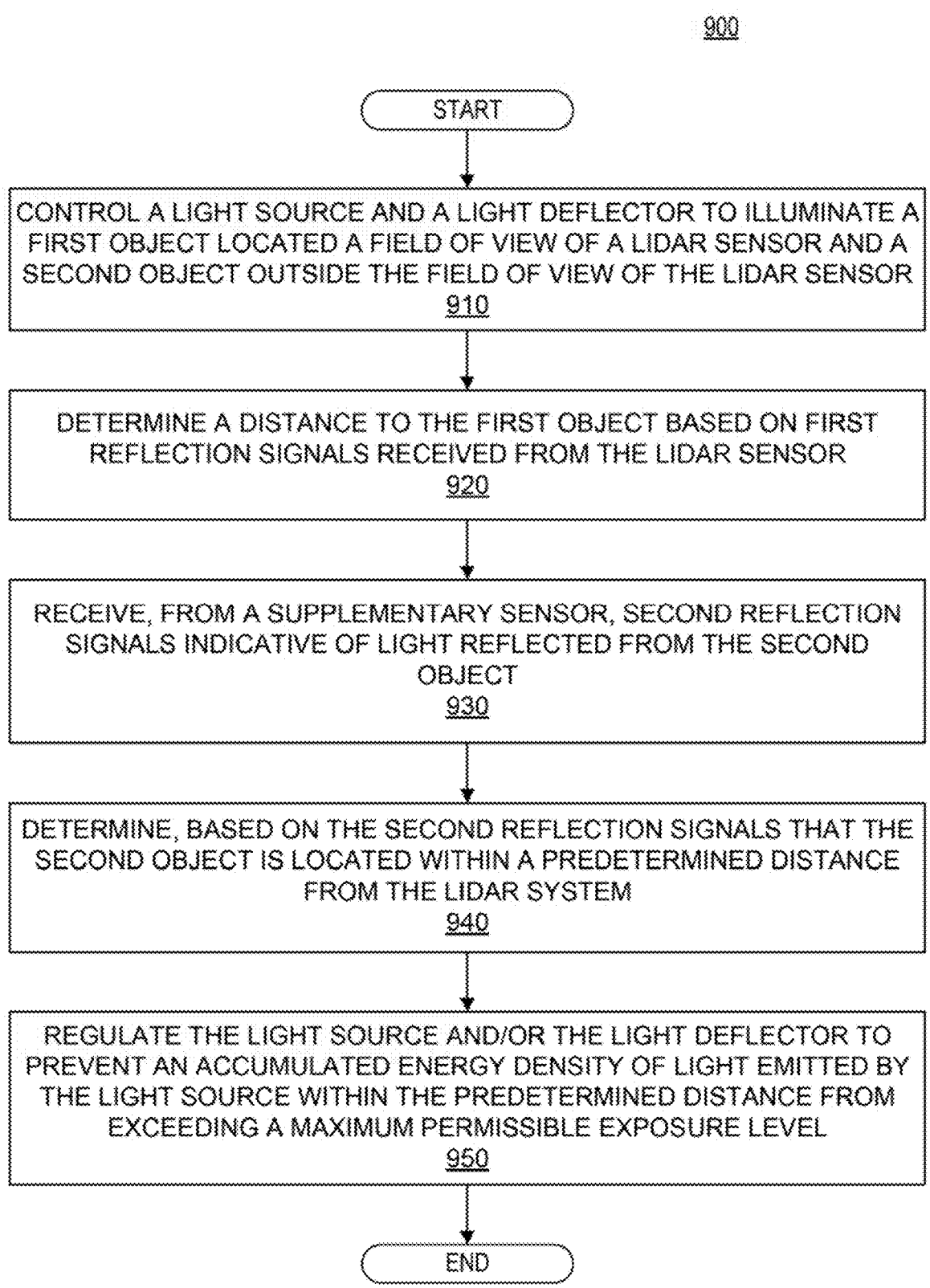
FIG. 9 is a flowchart showing an example process for detecting an object within a minimum predetermined distance of a LIDAR system consistent with disclosed embodiments.

FIG. 9 is a flowchart showing an example process 900 for detecting an object within a minimum predetermined distance of a LIDAR system 100 consistent with disclosed embodiments. Process 900 may be performed by one or more processors associated with LIDAR system 100, such as processor 718D. It is understood that one or more steps of process 900 may be performed by other processors associated with LIDAR system 100, including processors 718A, 718B, 718C, 118 and/or processing unit 108.

In step 910, process 900 may include controlling at least one of a light source and a light deflector to illuminate a first object and a second object located in a space being illuminated by the light source, wherein the first object is located within a field of view of a LIDAR sensor of the LIDAR system and the second object is outside the field of view of the LIDAR sensor. For example, step 910 may include controlling light source 112 and light deflector 114A to illuminate objects 710 and 711 within illuminated space 701. In some embodiments, the second object (e.g., object 710) may be located in a blind spot region (e.g., blind spot region 703). The blind spot region may comprise a portion of the illuminated space that is outside the field of view of the LIDAR system. Step 910 may include emitting light pulses towards illuminated space 701 to determine a distance to and/or a characteristic of objects within illuminated space 701. In some embodiments, the first object and the second object may be illuminated by the same light source. In other embodiments, however, different light sources may be used for each object, as discussed above.

In step 920, process 900 may include determining a distance to the first object based on first reflection signals received from the LIDAR sensor, wherein the first reflection signals are indicative of light reflected from the first object. For example, step 920 may include receiving reflection signals indicative of light reflected from object 711 within field of view 702 from sensor 116. The received reflection signals may be used to detect object 711 and/or additional objects in field of view 702 at different distances from LIDAR system 100.

In step 930, process 900 may include receiving, from a supplementary sensor, second reflection signals indicative of light reflected from the second object. For example, processor 718D may receive reflection signals from supplementary sensor 716, which may represent light reflected from object 710 located in illuminated space 701, but excluded from field of view 702 (e.g., within blind spot region 703). In some embodiments, the supplementary sensor may be configured to receive light from within the blind spot region. In some embodiments, the supplementary sensor may have an instantaneous pixel field-of-view that is larger (e.g., 2×-5×, 5×-10×, 10×-20×, 20×-50×, >50× larger) than an instantaneous pixel field-of-view of the LIDAR sensor.

In some embodiments, supplementary sensor may share an optical path with sensor 112. Accordingly, the light deflector (e.g., light deflector 114A) may include a plurality of mirrors wherein at least a first mirror of the array is configured to direct light from the light source towards the illuminated space and at least a second mirror of the array is configured to direct reflection signals from the illuminated space toward the supplementary sensor. In some embodiments, LIDAR system 100 may further comprise at least one asymmetrical deflector (e.g., asymmetrical deflector 715) configured to direct light from the light source into the illuminated space and to direct light reflected from the second object to the supplementary sensor. For example, light may be transmitted by the light source to the illuminated space and reflected from the illuminated space toward the supplementary sensor by an optical device.

The supplementary sensor may be the same or may be different from the main sensor, as described above. In some embodiments, the LIDAR sensor may include at least a first type of photodiode sensor and the supplementary sensor may include at least a second type of photodiode sensor. For example, the second type of photodiode sensor may have a recovery time shorter than a recovery time of the first type of photodiode sensor. In some embodiments, a range of the supplementary sensor may be shorter (e.g., 2, 3, 4, 5, 10, 20, 30, 40, 50, 100 times shorter) than a range of the LIDAR sensor. The second type of photodiode sensor may also have other characteristics or parameters that are different than the first type of photodiode sensor, such as a different dynamic range (e.g., representing the range of illuminance values detectable by the photodiode sensor), different maximum or minimum intensity values, different gains, etc. In some embodiments, the supplementary sensor may not be associated with time-of-flight object detection. For example, the second type of photodiode sensor may be configured to provide intensity information associated with the light reflected from the second object but not time information. In some embodiments, the LIDAR sensor and the supplementary may be included on a single chip comprising a plurality of detecting elements, the LIDAR sensor being associated with a first set of the plurality of detecting elements and the supplementary sensor being associated with a secondary set of the plurality of detecting elements.

In step 940, process 900 may include determining, based on the second reflection signals that the second object is located within a predetermined distance from the LIDAR system. For example, processor 718D may determine a distance between light deflector 114A and object 710, based on one or more characteristics of the light reflected by object 710. For example, process 900 may be performed by a LIDAR system mounted on a vehicle and process 900 may further comprise providing an indication of an existence of the second object within the predetermined distance. In some embodiments, the supplementary sensor may comprise a plurality of detecting elements and the at least one processor may further be configured to determine a distance to the second object based on which of the plurality of detecting elements receives the light reflected from the second object, as described above. Processor 718D may further determine whether the distance between light deflector 114A and object 710 is within a predetermined distance. The predetermined distance may correspond to a predetermined safety distance stored within LIDAR system 100. For example, the predetermined distance may correspond to a maximum range of LIDAR system 100 in which eye safety may be of concern (e.g., based on the intensity of light emitted by light source 112, the environment of LIDAR system 100, etc.). In other embodiments, the predetermined distance may be set by a government or industry regulation (e.g., a safety regulation for LIDAR systems, etc.). In some embodiments LIDAR system 100 may be mounted on a vehicle (e.g., vehicle 110) and the at least one processor may further be configured to provide an indication of an existence of the at least one object within the predetermined distance. In some embodiments, step 940 may further comprise confirming the determination that the at least one object is located within the predetermined distance using data received from the LIDAR sensor or an additional sensor. For example, if object 710 is within or moves into field of view 702 (or if LIDAR system 100 is adjusted or moved such that object 710 is within field of view 702), sensor 116 may be used to confirm the presence of object 710.

In step 950, process 900 may include regulating, based on the determination, at least one of the light source and the light deflector to prevent an accumulated energy density of light emitted from the light source within the predetermined distance from exceeding a maximum permissible exposure level. For example, step 950 may include controlling light source 112 and/or light deflector 114A (e.g., via processor 718A) to limit the intensity, amount and/or direction of light emitted by light source 112. In some embodiments, the regulating may comprise selectively limiting the intensity of light in a region of the second object but maintaining a normal operation of the light source and/or light deflector in other regions. For example, the regulating may further comprise regulating the at least one light source to prevent an accumulated energy density in a region of the illuminated space (and/or the blind spot region) associated with the second object from exceeding a predetermined level. In some embodiments, step 950 may include not regulating (or at least not regulating based on the determination that the second object is within the predetermined distance) the at least one light source with respect to a region of the illuminated space not associated with the second object. For example, the LIDAR system may regulate the light source only in the direction of the second object.

Step 950 may include one or more additional steps, such as determining a distance to the at least one object, calculating an intensity of light at the at least one object, and determining an exposure time that is eye-safe at the distance to the at least one object, as discussed above. The intensity of light at the least one object may be based on the intensity of light pulses emitted by light source 112 and a known property of light pulses emitted by light source 112. For example, processor 718D may calculate the light intensity at object 710 based on a known or estimated rate at which the intensity of the light pulses decreases over a given distance or time. The exposure time may vary depending on the intensity of intensity of light at object 710. For example, an eye-safe exposure time may be greater at lower light intensities than at higher light intensities. The correlation between the eye-safe exposure time and light intensity may be defined by the amount of light energy exposure a human eye can withstand before being damaged. In some embodiments, the correlation may be based on one or more industry or government regulations, such as an eye safety standard or regulation. In some embodiments, step 950 may further include determining a value associated with the maximum permissible exposure based on the determined distance to the at least one object. For example, the maximum permissible exposure may be based on the intensity of the light at the at least one object at the determined exposure time. Various other values associated with the maximum permissible exposure may also be determined.

In some embodiments, step 950 may include other remedial actions. For example, in some embodiments, illuminated space 701 may be intentionally wider than field of view 702 in order to increase resolution or frame-rate, or for any other reason. In such embodiments, the response to detecting object 710 may be to increase the range of field of view 702, decrease the range of illuminated space 701, or the like. Various other remedial actions may be implemented.

LIDAR System with Different Types of Sensors to Aid in Close-Range Detection

In some instances, it may be advantageous for a sensor of a LIDAR system to have multiple different types of detection elements. Using homogenous photodetectors may cause inaccuracies in detection or even missed detections of objects. The operating characteristics of a photodetector may allow it to perform effectively at certain dynamic ranges and/or at certain distances but not at others. As one example, when detecting objects at close range, the time interval between photon emission and detection can be within the recovery time of a detector. Accordingly, at close ranges, the LIDAR system may not be able to accurately detect objects due to the recovery time of the detector. Various other detector properties may also lead to inaccuracies. Accordingly, using multiple types of detectors (e.g., with differing recovery times) may improve detection, especially at different ranges.

Figure 10:
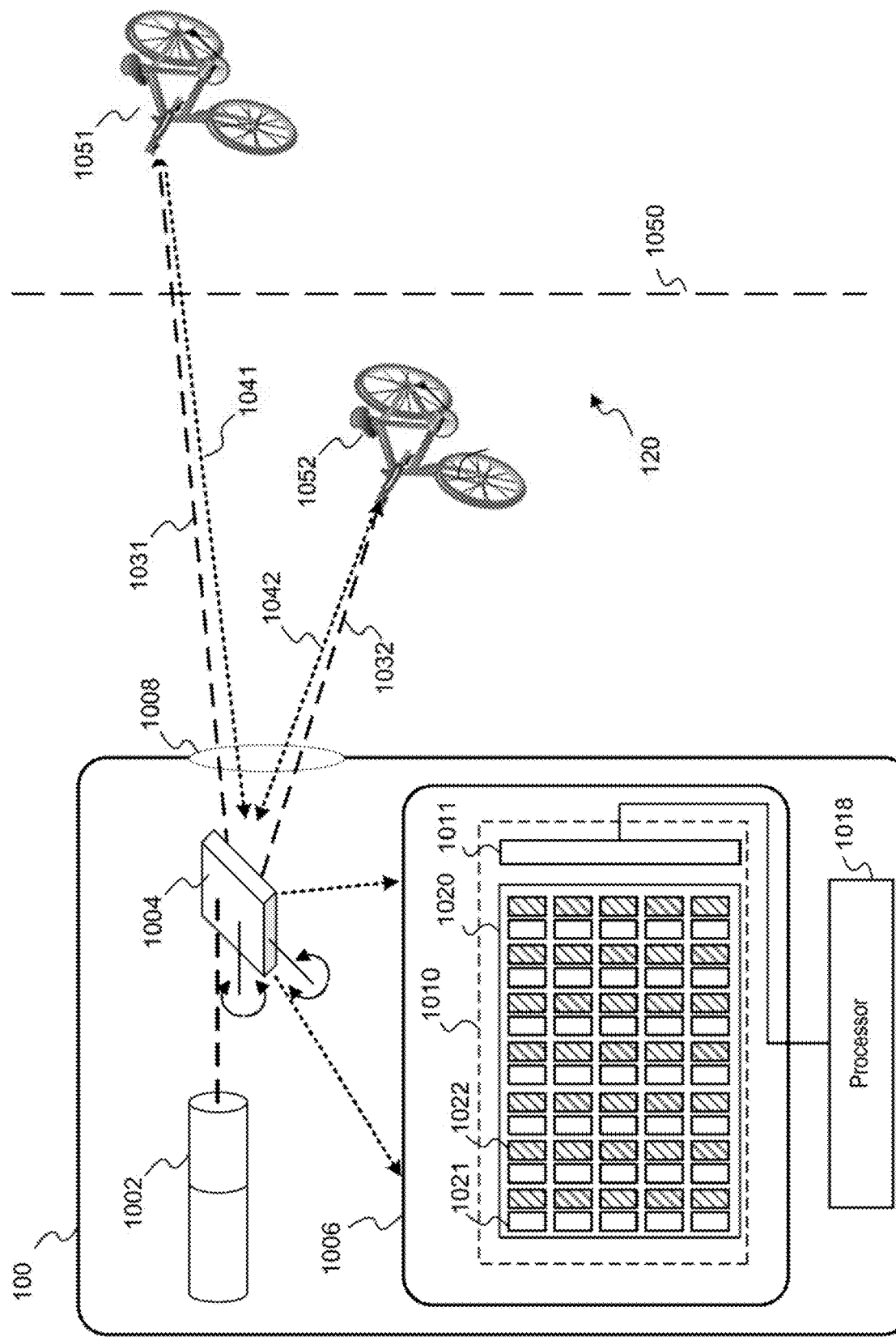
FIG. 10 is a diagram illustrating an example LIDAR system having a sensor with a photodetector array with multiple types of photodetectors consistent with some embodiments of the present disclosure.

FIG. 10 is a diagram illustrating an example LIDAR system 100 having a sensor with a photodetector array 1020 with multiple types of photodetectors consistent with some embodiments of the present disclosure. LIDAR system 100 may comprise a light source 1002, a light deflector 1004, and a photodetection sensor 1006. Light source 1002 may be configured to emit light towards a field of view 120 of LIDAR system 100. Light source 1002 may be a laser such as a solid-state laser, a laser diode, a high-power laser, or an alternative light source such as, a light emitting diode (LED)-based light source. Light source 1002 may correspond to light source 112 described above and accordingly, any descriptions, features, or embodiments of light source 112 may also apply to light source 1002. Light deflector 1004 may be configured to deflect light from light source 1002 in order to scan field of view 120. Light deflector 1004 may correspond to the various light deflectors described above (e.g., light deflector 114A) and, accordingly, any descriptions, features, or embodiments of these light deflectors may also apply to light deflector 1004. Light deflector 1004 may further be configured to direct light received from field of view 120 towards photodetection sensor 1006.

Photodetection sensor 1006 may be configured to detect one or more objects from within field of view 120. For example, light source 1002, via light deflector 1004, may transmit light 1031 and light 1032 into field of view 1020. Light 1041 may be reflected by object 1051 and light 1042 may be reflected by object 1052, as shown in FIG. 10. Object 1051 may be closer to LIDAR system 100 than object 1052, as shown. Light deflector 1004 may deflect light 1041 and 1042 towards photodetection sensor 1006, which may be configured to detect objects 1051 and 1052 based on the reflected light. Photodetection sensor 1006 may be configured to determine distances to objects 1051 and 1052 based on time-of-flight information in coordination with light source 1002. This time-of-flight detection is described in further detail above. In some embodiments, LIDAR system 100 may further comprise at least one optical component 1008 (e.g., a lens, filter, etc.) which may modify the light in some way before it reaches photodetection sensor 1006. While optical component 1008 is shown as the initial interface with light 1041 and 1042 as it is received by LIDAR system 100, optical component 1008 may modify the light immediately before it reaches photodetection sensor 1006, or in other configurations.

Photodetection sensor 1006 may include a plurality of detection elements for detecting photons of a photonic pulse reflected back from field of view 120. Photodetection sensor 1006 may correspond to sensor 116 described in detail above. Any combination of one or more variations, modes, embodiments and functionalities discussed above with respect to sensor 116 or parts thereof may be applicable to photodetection sensor 1006 or corresponding parts of it, even if not explicitly stated.

Photodetection sensor 1006 may comprise a semiconductor photodiode chip 1010, which may include different areas, such as a detection area (which includes photosensitive diodes and associated electronics), logic area, output circuitry area, and so on. Photodiode chip 1010 may further comprise a photodetector array 1020, which may be included in the detection area. Photodiode chip 1010 may comprise output circuitry 1011 configured to output one or more signals generated by photodetectors included in photodetector array 1020 based on light received at the photodetectors. In some embodiments, photodiode chip 1010 may comprise multiple output circuitry 1011 elements, each of which may correspond to a different group of photodetector elements (e.g., different regions, different types of photodetector, etc.). For example, output circuitry 1011 may correspond to output circuitry 406 as discussed above with respect to FIG. 4A. Output circuitry 1011 may provide output signals (also referred to as "detection signals") associated with the photodetector elements to processor 1018, which may analyze these output signals for object detection. For example, processor 1018 may determine a time-of-flight for reflected light 1041 and 1042, an average power, a photon distribution, or various other information, as discussed in detail above. In some embodiments, the outputs from individual photodetectors may be combined (e.g., summed) with signals of other detectors, or may be otherwise processed before being provided to processor 1018.

Processor 1018 may be any physical device having an electric circuit that performs a logic operation on input or inputs. Processor 1018 may include one or more integrated circuits (IC), including Application-specific integrated circuit (ASIC), microchips, microcontrollers, microprocessors, all or part of a central processing unit (CPU), graphics processing unit (GPU), digital signal processor (DSP), field-programmable gate array (FPGA), or other circuits suitable for executing instructions or performing logic operations. Processor 1018 may correspond to processor 118 described above and, accordingly, any of the descriptions, functions or other features of processor 118 discussed above may also apply to processor 1018.

FIGS. 11A-11G illustrate example configurations of photodetector array 1020 consistent with some embodiments of the present disclosure. Photodetector array 1020 may include a plurality of different types of photodetector elements. For example, photodetector array 1020 may include a first photodetector 1021 and a second photodetector 1022. Each of the photodetectors 1021 and 1022 may be of a different type and may have different characteristics. For example, first photodetector 1021 may have a first performance characteristic and second photodetector 1022 may have a second performance characteristic. The first performance characteristic may be different from the first performance characteristic. Photodetectors 1021 and 1022 may be configured to generate detection signals based on light received from field of view 120. First photodetector 1021 may be configured to generate a first detection signal based on light transmitted toward a plurality of target objects and reflected from at least a first object (e.g., object 1051) of the plurality of target objects to first photodetector 1021. Similarly, second photodetector 1022 may be configured to generate a second detection signal based on light transmitted toward the plurality of target objects and reflected from at least a second object (e.g., object 1052) of the plurality of target objects to second photodetector 1022. In some embodiments, the first object of the plurality of target objects and the second object of the plurality of target objects may be different. In other embodiments, the first object of the plurality of target objects and the second object of the plurality of target objects may be the same. In some embodiments, the first detection signal and/or the second detection signal may not be based on light reflected from objects. For example, the photodetectors may generate detection signals based on ambient light, or light from other sources in field of view 120. In some embodiments each photodetector may comprise a plurality of pixels, which may be operable to output detection data indicative of light impinging on an active area of the respective pixel.

Figure 11A:
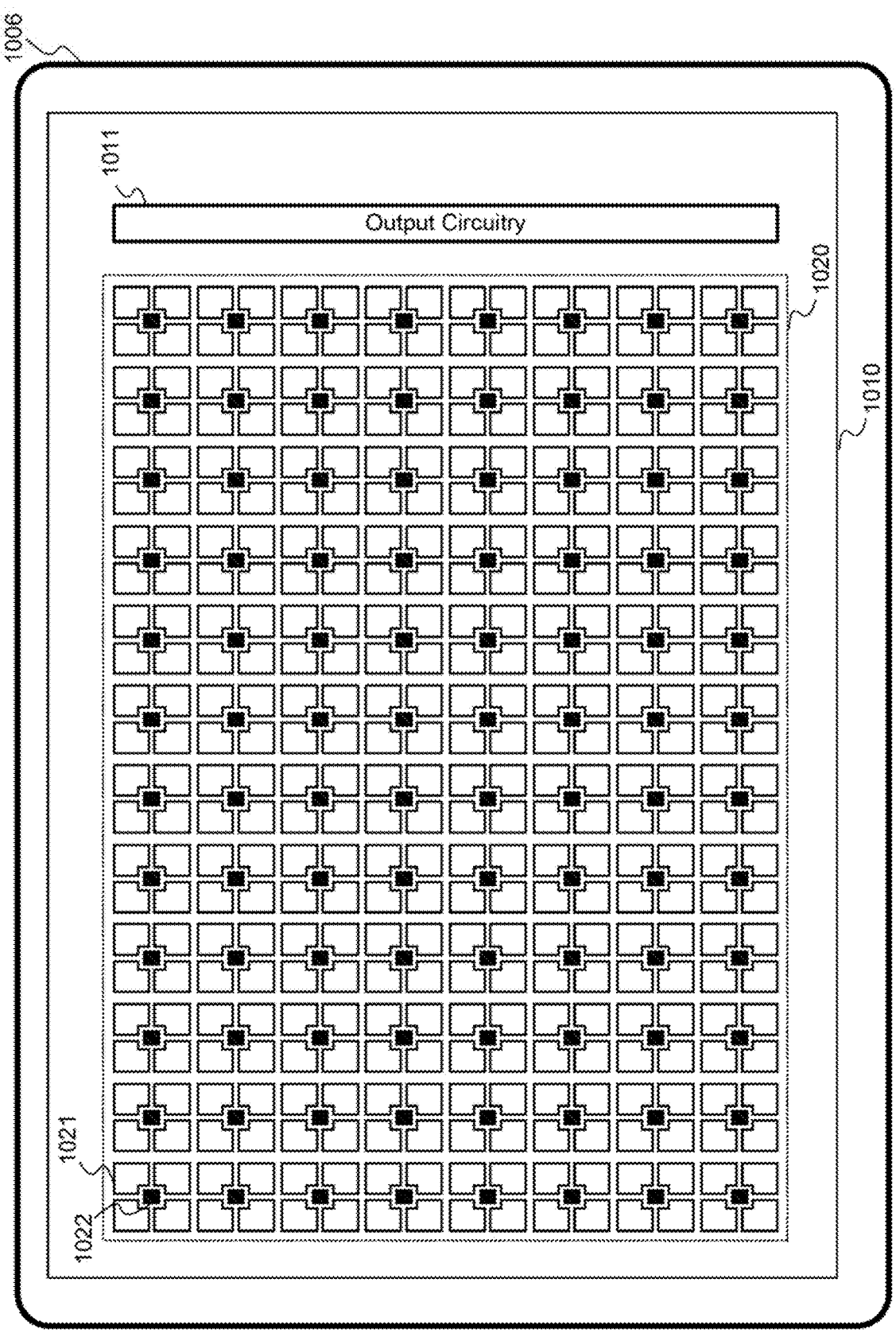
Figure 11B:
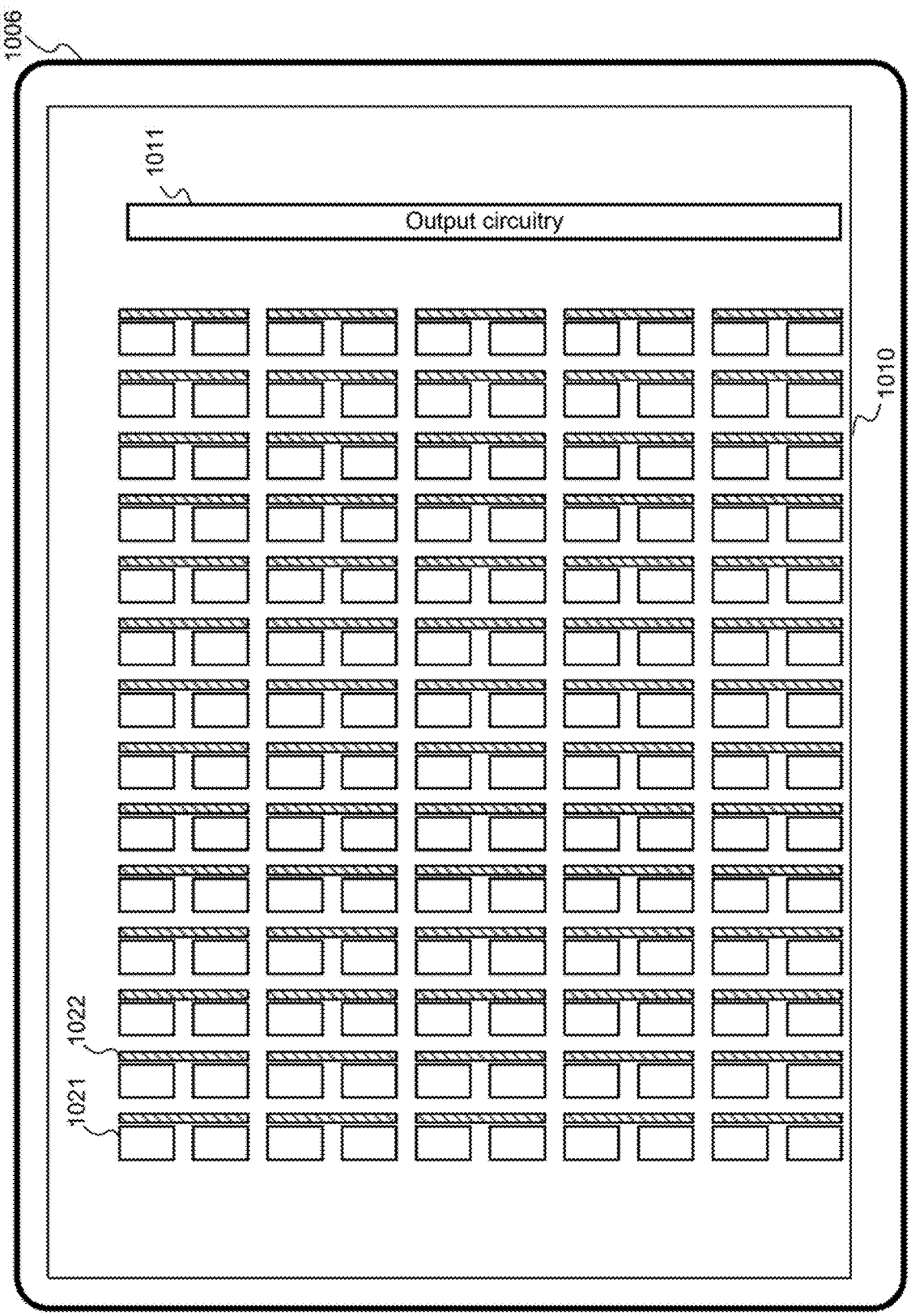

As shown in FIG. 11A, for example, each photodetector of one type may be contained between other photodetectors. For example, second photodetector 1022 may be surrounded by first photodetector 1021 or a plurality of first photodetectors 1021. In other embodiments, first photodetector 1021 may be surrounded by a one or more second photodetectors 1022. Another example arrangement is shown in FIG. 11B, in which at least a portion of the first photodetector is adjacent to the second photodetector. FIG. 11C illustrates another example configuration of photodetectors 1021 and 1022. As shown in FIG. 11C photodetection sensor 1006 may further comprise a plurality of connectors 1012 connecting photodetectors 1021 and 1022 to output circuitry 1011. Connectors 1012 may be any form of conductive connection between photodetectors and output circuitry 1011 (e.g., printed circuits, etc.) and may carry detection signals from the photodetectors to output circuitry 1011. In FIG. 11C, each photodetector is connected to the same output circuitry 1011. In other words, the first photodetector 1021 and the second photodetector 1022 are each connected to a common output circuitry 1011. As discussed above, there may be a plurality of output circuitry 1011 components, each connected to one or more photodetectors. For example, first photodetector 1021 may be connected to a first output circuitry and the second photodetector 1022 may connected to a second output circuitry. For example, all of first photodetectors 1021 may be connected to one or more first output circuitry elements whereas all of second photodetectors 1022 may be connected to one or more second output circuitry elements. In other embodiments, photodetectors may be grouped such that all of photodetectors 1021 and 1022 within a certain region are connected to one output circuitry 1011. It is to be understood that connectors 1012 may be included in other configurations shown in FIGS. 11A-11G, but have been omitted from the illustrations for simplicity.

In some embodiments, multiple first photodetectors 1021 may be associated with one second photodetector 1022. For example, FIG. 11D shows a configuration in which a plurality of first photodetectors 1021 are arranged adjacent to an elongated second photodetector 1022. FIG. 11D further shows an example cone of light 1110 that may be cast upon photodetector array 1020. As shown in FIG. 11D, not all of photodetectors 1021 and 1022 may be illuminated by the light hitting photodetector array 1020. For example, some of the photodetectors may only be partially lit and others may not be lit at all. In some embodiments, cone of light 1110 may be directed to target specific regions of array 1020 (e.g., specific photodetectors, etc.). For example, optical component 1008 may be configured to direct incoming light to specific regions.

FIG. 11E shows a configuration in which a plurality of first photodetectors 1021 surround an elongated second photodetector 1022. In some embodiments, each second photodetector 1022 may be surrounded by a first photodetector 1021 (or vice versa), as shown in FIG. 11F. For example, each of photodetectors 1021 and 1022 may comprise a plurality of pixels. Each of the pixels may be operable to output detection data indicative of light impinging on an active area of the respective pixel. In some embodiments, the pixels may be arranged such that first photodetector 1021 surrounds at least one pixel of second photodetector 1022, as shown. In some embodiments, photodetector array 1020 may comprise more than two types of photodetectors. For example, as shown in FIG. 11G, photodetector array 1020 may comprise a third photodetector 1023. Photodetector 1023 may have different performance characteristics than first photodetector 1021 and/or second photodetector 1022 and may be similarly utilized to detect objects at different ranges or from different regions, etc. In some embodiments first photodetectors 1021 may be included on one array and photodetectors 1022 may be included on a second array. LIDAR system 100 may further comprise an optical device (e.g., optical device 1008) such as a beam splitter that may split reflected light among multiple arrays. The configurations of photodetector array 1020 shown in FIGS. 11A-11G are provided by way of example. It is to be understood that the arrangements shown may be simplified for clarity. For example, the arrangements shown may be repeated multiple times across the same array. In some embodiments, photodetector array 1020 may comprise multiple arrays. The present disclosure is not limited to any particular configuration or arrangement of photodetectors, and it is understood that any suitable arrangement may be used.

As discussed above, first photodetector 1021 and second photodetector 1022 may have different performance characteristics. The different performance characteristics of first photodetector 1021 and second photodetector 1022 may allow each to perform different functions. First photodetector 1021 may be a time-of-flight photodetector that provides information of timings in which light of different light intensities is detected by the sensor, as described above. For example, first photodetector 1021 may be configured to transmit information indicative of the approximate number of photons absorbed by first photodetector 1021 over a given timeframe (e.g., 1 nanosecond, 10 nanoseconds, etc.) of a measurement period. First photodetector 1021 may also provide other information, for example information indicative of the first time that a detected light intensity crosses a threshold, a timing of a peak intensity, etc. Accordingly, the first detection signal may be indicative of a time-of-flight of the light transmitted toward the plurality of target objects and reflected from the at least first object of the plurality of target objects to first photodetector 1021. In some embodiments, second photodetector 1022 may also be a time-of-flight sensor such that the second detection signal is indicative of a time-of-flight of the light transmitted toward the plurality of target objects and reflected from at least the second object of the plurality of target objects to second photodetector 1022. In other embodiments, second photodetector 1022 may be a different type of sensor (e.g., a light intensity sensor), which may not perform time-of-flight functions.

In some embodiments, the different characteristics of photodetectors 1021 and 1022 may provide for detection of objects at different distances or ranges of distances. For example, due to various properties of the photodetector element, first photodetector 1021 may not be able to accurately or effectively detect objects (or detect objects at all) within a close range. Accordingly, the first performance characteristic of first photodetector 1021 may enable first photodetector 1021 to detect one or more of the plurality of target objects beyond a threshold distance 1050 (which may be a predetermined distance or a distance which is determined based on changing operational conditions). The second performance characteristic of second photodetector 1022 may enable second photodetector 1022 to detect one or more of the plurality of target objects within the threshold distance. It is noted that threshold distance 1050 may apply to targets objects and/or detection condition which qualify specific conditions (e.g., above a minimal reflectivity level, with ambient light below a predetermined noise level, etc.).

In one example, the performance characteristics of the photodetectors may be based on a recovery time (e.g., a time in which the photodiode recovers to its operating voltage, such as following a detection of light and a resulting electron avalanche). For example, the first performance characteristic of first photodetector 1021 may include a first recovery time of first photodetector 1021 and the second performance characteristic of second photodetector 1022 may include a second recovery time of second photodetector 1022, the second recovery time being different from the first recovery time. First photodetector 1021 may have a recovery time such that it may miss light reflected from within a close range of LIDAR system 100. The relatively longer recovery time of first photodetector 1021 may be useful to prevent oversaturation of first photodetector 1021 (e.g., from internal reflections, nearfield objects, highly reflective objects, etc.) but may compromise sensitivity at a close range. Accordingly, second photodetector 1022 may be provided with a shorter recovery time, which may allow for better detection within the close range.

The different characteristics of photodetectors 1021 and 1022 may not necessarily be tied to a "close range" and a "far range," as provided in the example above. In some embodiments, first photodetector 1021 may have a problematic range within the middle of a detection range (e.g., due to highly reflective target which may saturate the first photodetector) and second photodetectors 1022 may be configured to detect light within the problematic range. In some embodiments, second photodetector 1022 may be configured to detect light at a range of distances further than that of first photodetector 1021. In other embodiments, second photodetector may be configured to detect light at multiple ranges (e.g., 0-10 m, 10-20 m, etc.). Further, in some embodiments second photodetector 1022 may be configured to detect light within a particular region of field of view 120, not necessarily based on a range of distances. For example, second photodetector 1022 may be configured to detect light from within a blind spot region (e.g., blind spot region 703) in a virtual protective housing application. Accordingly, second photodetector 1022 may be associated with supplementary sensor 716, which may correspond to a subset of photodetector elements of a main LIDAR sensor (e.g., sensor 116). Such embodiments are discussed in further detail above, for example with respect to FIGS. 8D and 8E.

Further, various other performance characteristics of photodetectors 1021 and 1022 may be implemented other than recovery time. In some embodiments, photodetectors 1021 and 1022 may each have a different dynamic range. In other words, each photodetector may have a different range of illuminance levels (e.g., measured in lux, foot-candle, photons, etc.) of the received optical signal that can be detected by the photodiode. For example, second photodetector 1022 may have a dynamic range that is greater than that of first photodetector 1021 (e.g., 5×, 10×, 100×, 1,000×, 10,000× greater, or more). The range may be greater in terms of the minimal illuminance and/or maximum illuminance levels, the size of the range of illuminance levels, or both. Accordingly, the different performance characteristics may enable first photodetector 1021 to detect light intensities having a first dynamic range and may enable second photodetector 1022 to detect light intensities having a second dynamic range different from the first dynamic range. In some embodiments, the first dynamic range and the second dynamic range may partially overlap. In other embodiments, however, the first dynamic range and the second dynamic range do not overlap. In one example, objects detected from a close range may be associated higher illuminance values and thus may be detectable by second photodetector 1022 but may not be detected by first photodetector 1021.

There are numerous ways in which different dynamic ranges of photodetectors 1021 and 1022 (or other performance characteristics) may be achieved. For example, the different performance characteristics may be based on a type of the photodetectors. The first performance characteristic (associated with first photodetector 1021) may be based, at least in part, on a first type of first photodetector 1021. For example, first photodetector 1021 may be a Single Photon Avalanche Diode (SPAD), an Avalanche Photo Diode, (APD), or a p-i-n photodiode (PIN photodiode), or any other type of photodetector. The second performance characteristic (associated with second photodetector 1022) may be based, at least in part, on a second type of second photodetector 1022, which is different than the first type. Second photodetector 1022 may be of a type listed above, or may be of a different type than those listed. Different materials, quality, or other parameters may also produce different types photodetectors. Each type of photodetector may be associated with a different dynamic range.

In some embodiments, the performance characteristics may be based on different electrical operational parameters of the photodetectors. For example, first photodetector 1021 may have a first performance characteristic based at least in part on a first operational voltage and second photodetector 1022 may have a second performance characteristic based at least in part on a second operational voltage, which may be different from the first operational voltage. The different operational voltages may allow the photodetectors to detect different levels of illuminance, etc. In other embodiments, the performance characteristics may be based on capacitance. For example, first photodetector 1021 may have a first performance characteristic based at least in part on a first capacitance and second photodetector 1022 may have a second performance characteristic based at least in part on a second capacitance, which may be different from the first capacitance. Greater capacitance of the photodiode may be associated with lower photon detection levels. By varying capacitance, the dynamic range, or other characteristics of the photodetector may be adjusted. In some embodiments, the capacitance may be artificially adjusted to vary the performance characteristic, for example by adjusting other electrical properties of the photodetector. Other operational parameters, such as signal amplification parameters, the bias, or any other electrical properties of the photodetector, may also affect the performance characteristic.

In some embodiments, the performance characteristics may be based on different sizes of the photodetectors. For example, first photodetector 1021 may have a first performance characteristic based at least in part on a first photodetector size and second photodetector 1022 may have a second performance characteristic based at least in part on a second photodetector size, which may be different from the first photodetector size. The different sizes may allow the photodetectors to detect different levels of illuminance, etc. For example, as the size of the sensitive area of a photodetector increases, a greater number of photons will be detected by the photodetector. In embodiments where second photodetector 1022 is associated detecting objects in a range closer than first photodetector 1021, second photodetector 1022 may be smaller than first photodetector 1021 (e.g., 2×-5× smaller, 5×-10× smaller, 10×-20× smaller, 20×-50× smaller, 50×-100× smaller, 100×-100× smaller, and any combination of the above, etc.). High intensity light signals arriving from objects in the FOV have higher density of photons per cross-section area. A smaller size of second photodetector 1022 may prevent oversaturation of the photodetector by reducing the rate of photons which impinge on the photodiode. Conversely, the larger size of first photodetector 1021 may allow increased photon absorption, which may allow it to detect the relatively low levels of photons that reach the sensor from targets at a greater distance (e.g., 100 m) and from low reflectivity targets.

Similar to photodetector size, differentiating the number of photons that reach the first photodetector and the second photodetector may be achieved through filtering the light before it reaches at least one of the photodetectors. For example, photodetection sensor 1006 may further comprise at least one filter (e.g., optical component 1008) for filtering light received at the detection area (or part thereof). In some embodiments, light may be selectively filtered as it is directed to different photodetector elements. For example, one or more filters may be provided for filtering light directed to certain photodetector elements, or each photodetector element may have a dedicated filter (e.g., integral to the photodetector). Accordingly, the first performance characteristic of first photodetector 1021 may differ from the second performance characteristic of second photodetector 1022 based at least in part on differences in filtering of light received at the first photodetector and filtering of light received at the second photodetector. In some embodiments, the light reaching second photodetector 1022 may be more highly filtered than the light reaching first photodetector 1021. For example, filtration may reduce the light reaching second photodetector 1022 by 50%, 75%, 80%, 90%, 99%, or any other amount to effectively reduce the number of photos reaching the detector element. Similar to the effects of varying the size of the photodetector element, the decreased number of photons associated with second photodetector 1022 due to filtration may allow for better detection of objects at a close range, whereas the relatively higher number of photons reaching first photodetector 1021 may provide better detection of objects at a further range.

In some embodiments, the performance characteristic of the photodetectors may be based on a gain value. The gain may correspond to the strength of the electrical signal that is generated by the photodetector based on a given illuminance level. Accordingly, the first performance characteristic of first photodetector 1021 may include a first gain of the first detection signal, and the second performance characteristic of second photodetector 1022 may include a second gain of the second detection signal, the second gain being different from the first gain. Photodetectors with higher gain may allow a photodetector to detect objects closer to the photodetector as compared to a photodetector with a lower gain. Gain may be closely related to the dynamic range of a photodetector. Accordingly, the gain may be varied among photodetectors in the same or similar ways that the dynamic range may be varied, as discussed above. For example, the gain may be based on a type of photodiode (e.g., SiPM, APD, PIN, etc.), different types of electrical parameters (e.g., operational voltage, capacitance, etc.), different sizes of sensitive areas, different filtration, or various other means.

In some embodiments the performance characteristics may be associated with a timing of detection by the photodetector. For example, the first performance characteristic of first photodetector 1021 may enable first photodetector 1021 to detect one or more of the plurality of target objects during a first time period and the second performance characteristic of second photodetector 1022 may enable second photodetector 1022 to detect one or more of the plurality of target objects within a second time period. The timing of the photodetector elements may be set by "gating" the photodetectors to only detect light within a given time range after a light pulse is emitted by light source 1002. The photodetectors may be gated regardless of whether they are configured for time of flight detection. Based on the period of time in which the photodetector is measuring light, a photodetector may be associated with detecting objects within a certain range of distances. For example, light 1042 reflected by object 1052 (as shown in FIG. 10) may be received at photodiode array 1020 at an earlier time than light 1041 reflected by object 1051 due to the greater distance light must travel to reach object 1051. Accordingly, in embodiments where second photodetector 1022 is configured for close range detection, second photodetector 1022 may be associated with an earlier time period than first photodetector 1021.

In some embodiments, second photodetector 1022 may be configured to detect elements at a specified range (e.g., within a range of first photodetector 1021, etc.). In some embodiments, the specified range may be adjusted dynamically based on objects detected by first photodetector 1021, or various other information. In one example, LIDAR system 100 may be configured to temporarily reduce the sensitivity of first photodetector 1021 at a distance associated with an especially bright object (e.g., to prevent saturation). Accordingly, second photodetector 1022 (which may be of a different type or size than first photodetector 1021, may be filtered, etc.) may be configured to detect objects within that range, at least temporarily. Accordingly, the performance characteristics of second photodetector 1022 may be adjusted dynamically and independent of the performance characteristics of first photodetector 1021. Various other scenarios may also require selective detection within a certain range.

In some embodiments, the first time period (e.g., of first photodetector 1021) and the second time period (e.g., of second photodetector 1022) may partially overlap. In other embodiments, however, the first time period and the second time period may not overlap. In embodiments where the first time period and the second time period overlap, the first and second time periods may have the same starting time (e.g., may start measuring light at the same time or substantially the same time). In other embodiments, they may start at different times. For example, first photodetector 1021 may have a delayed start to avoid oversaturation due to higher intensity light being received by closer objects. In some embodiments, the length of the first and second time periods may be different. For example, second photodetector 1022 may start measuring at an earlier time (e.g., to detect closer objects) but may detect over a shorter time period to prevent oversaturation, etc. A single photodetector may be gated several time intervals associated with a single light pulse. For example, a photodetector may be gated to measure multiple time periods (e.g., on the order of 5-20 nanoseconds) within a measurement period. If a collected charge within a gated period exceeds a certain threshold, this may indicate the presence of an object within a distance range associated with the gated period.

While various example performance characteristics are provided, the present disclosure is not limited to any of these performance characteristics. One skilled in the art may appreciate that other performance characteristics or properties of the photodetectors may be varied, which may include a spectral response, a responsivity, a noise-equivalent power, a detectivity, a quantum efficiency, etc. Further, the present disclosure is not limited to any one performance characteristic and may include adjusting any combination of characteristics or properties discussed above. In some embodiments, the performance characteristics of different photodetectors may be changed dynamically or at different times. For example, LIDAR system 100 may change the gain of second photodetector 1022 to compensate for bright objects at a close range without changing the gain of first photodetector 1021. Further, in some embodiments, the performance characteristics may be changed selectively. For example, first photodetector 1021 and second photodetector 1022 may have the same properties and/or performance characteristics under normal operation of LIDAR system 100. LIDAR system 100 may be configured to selectively change one or more properties associated with some or all of the second photodetectors 1022 as needed (e.g., in virtual protective housing applications, based on detection of an object within a close range, etc.). Selective changes may occur dynamically or at predetermined times or intervals. Various other schemes for dynamically changing performance characteristics of one or more photodetectors may be implemented.

The use of the different photodetectors in LIDAR system 100 may be implemented in various ways. In some embodiments, first photodetector 1021 may be the main sensor used for time of flight operation of LIDAR system 100. Second photodetector 1022 may be used only for predetermined ranges (e.g., close range) or regions (e.g., blind spot detection, etc.). In some embodiments, second photodetector 1022 may be engaged periodically as required, for example, by a controller built on photodiode chip 1010 or by processor 1018. For example, first photodetector 1021 may be used to determine that one or more objects are located in a region associated with second photodetector 1022 and LIDAR system 100 may selectively engage second photodetector 1022. For example, first photodetector 1021 may be able to detect a presence of an object within a close range but may not be able to determine distances or other characteristics of object 1022 as accurately as second photodetector 1022. LIDAR system 100 may further disengage first photodetector 1021 for the range associated with second photodetector 1022 while second photodetector 1022 is engaged (e.g., by gating second photodetector 1022), which may prevent or reduce oversaturation of first photodetector 1021, etc.

In some embodiments, both first photodetector 1021 and second photodetector 1022 may both be used continuously. For example, each of first photodetector 1021 and second photodetector 1022 may be dedicated to a particular range or region of field of view 120. In some embodiments, LIDAR system 100 may be configured to determine a point cloud, as described in greater detail above. The point cloud may include one or more points that are detected by first photodetector 1021 and one or more points that are detected by second photodetector 1022. Accordingly, processor 1018 may process both the first signal from first photodetector 1021 and the second signal from second photodetector 1022 to generate the point cloud. Optionally, one or more points of the point cloud (or all of the points) may be determined by both first signals and second signals. For example, the first signal may be used for the first part of the measurement period and the second signal may be used for the following part of the measurement period, and the one or more highest intensities (after calibration/scaling) in the entire measurement period may be used to determine the presence and distance of objects in the FOV.

In some instances, either first photodetector 1021 or second photodetector 1022 may detect an object that is not detectable by the other photodetector. For example, the second detection signal (generated by second photodetector 1022) may be indicative of a presence of at least one of the plurality of target objects which is undetectable from the first detection signal (generated by first photodetector 1021). Conversely, the first detection signal may be indicative of a presence of at least one of the plurality of target objects which is undetectable from the first detection signal. Accordingly, LIDAR system 100 may engage the other photodetector, or take another form of remedial action. For example, second photodetector 1022 may be associated with the virtual protective housing described above. Based on objects detected by second photodetector 1022 LIDAR system 100 may be configured to perform a remedial action to prevent accumulated light intensities within a certain region from exceeding a threshold. For example, LIDAR system 100 may change one or more operational parameters (e.g., reducing light source emissions within a certain region, etc.) based on the detected objects.

Photodetector array 1020 is shown in FIG. 10 by way of example. Photodetectors 1021 and 1022 may have numerous other configurations. Further, there may not necessarily be a 1:1 ratio between the number of photodetectors 1021 and 1022. For example, there may be several times more first photodetectors 1021 than second photodetectors 1022 (e.g., by a multiple of 2, 4, 5, 10, 100, 1000, etc.) or vice versa. Further, in some embodiments at least one of first photodetector 1021 or second photodetector 1022 may comprise a plurality of detector elements (also referred to as "pixels"), each of which may be configured to detect light received from field of view 120. Accordingly, photodetectors 1021 and 1022 may be arranged in various shapes and/or patterns.

Figure 12A:
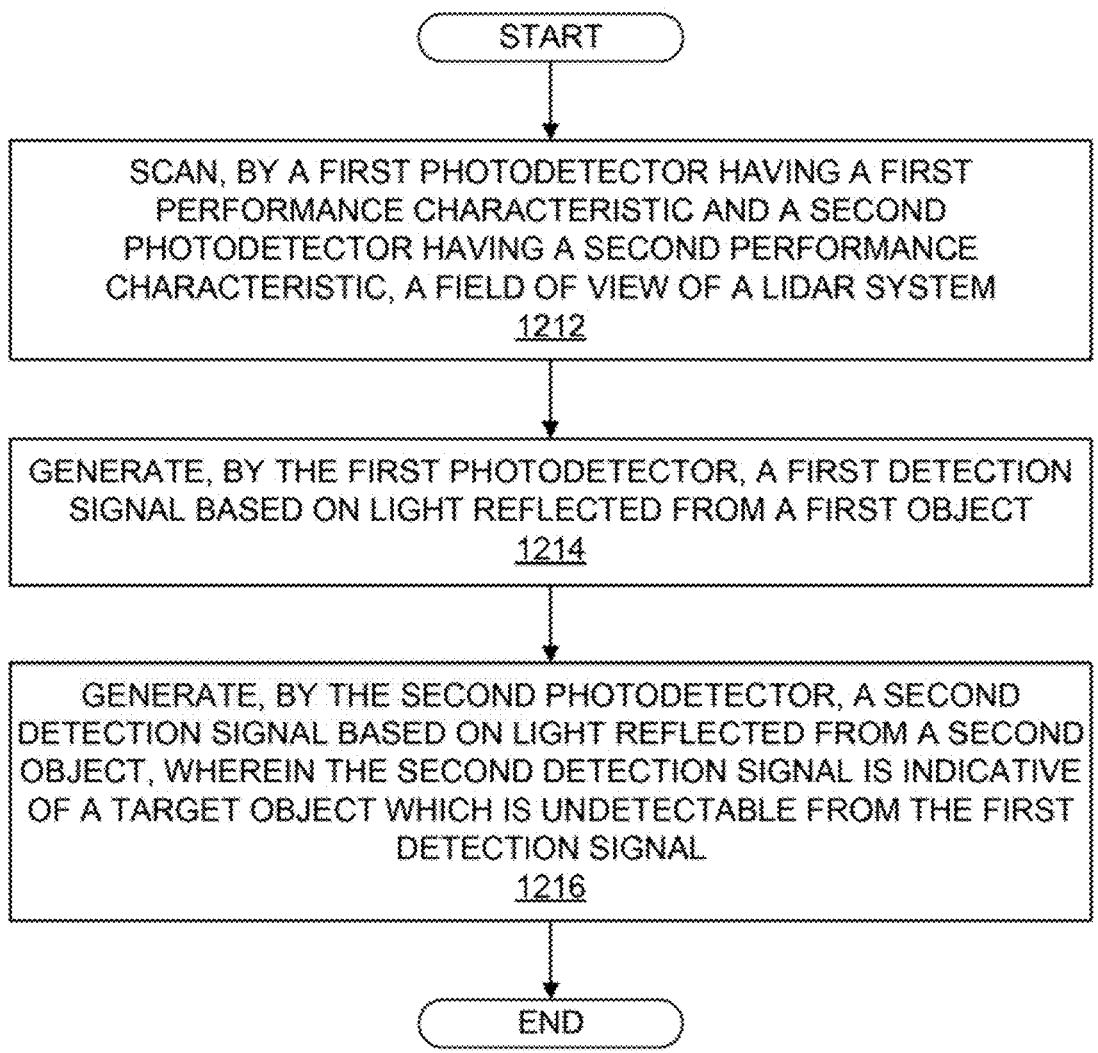
FIG. 12A is a flowchart showing an example process for detecting objects using a photodetection sensor with multiple performance characteristics consistent with disclosed embodiments.

FIG. 12A is a flowchart showing an example process 1210 for detecting objects using a photodetection sensor with multiple performance characteristics consistent with disclosed embodiments. Process 1210 may be performed, for example, by a LIDAR system, such as LIDAR system 100, described above.

In step 1212, process 1210 may include scanning, by a first photodetector having a first performance characteristic and a second photodetector having a second performance characteristic, a field of view of a LIDAR system. For example, the first photodetector may correspond to first photodetector 1021 and the second photodetector may correspond to second photodetector 1022. The first performance characteristic and the second characteristic may be any of the various performance characteristics described above (including dynamic range, gain, timing, response time, etc.). The first performance characteristic may be different than the second performance characteristic. In some embodiments, the first photodetector and the second photodetector may be included on the same photodetection chip (e.g., photodetection chip 1006).

In step 1214, process 1210 may include generating, by the first photodetector, a first detection signal based on light reflected from a first object. The first detection signal may be based on light transmitted toward a plurality of target objects and reflected from at least a first object of the plurality of target objects to the first photodetector. For example, light source 1002 may transmit light 1031 towards objects 1051 and 1052 and light 1041 reflected by object 1051 may be received by first photodetector 1021. The first detection signal may be indicative of a time-of-flight of the light transmitted toward the plurality of target objects and reflected from the first object of the plurality of target objects to the first photodetector.

In step 1216, process 1210 may include generating, by the second photodetector, a second detection signal based on the light transmitted toward the plurality of target objects and reflected from at least a second object of the plurality of target objects to the second photodetector. For example, second photodetector 1022 may generate the second detection signal based on light 1042 reflected from object 1052. The second detection signal may be indicative of a target object (e.g., object 1052) which is undetectable from the first detection signal. In some embodiments, process 1210 may include additional steps. For example, process 1210 may include determining, based on the first detection signal, a distance to the first object; and determining, based on the second detection signal, a distance to the second object.

Figure 12B:
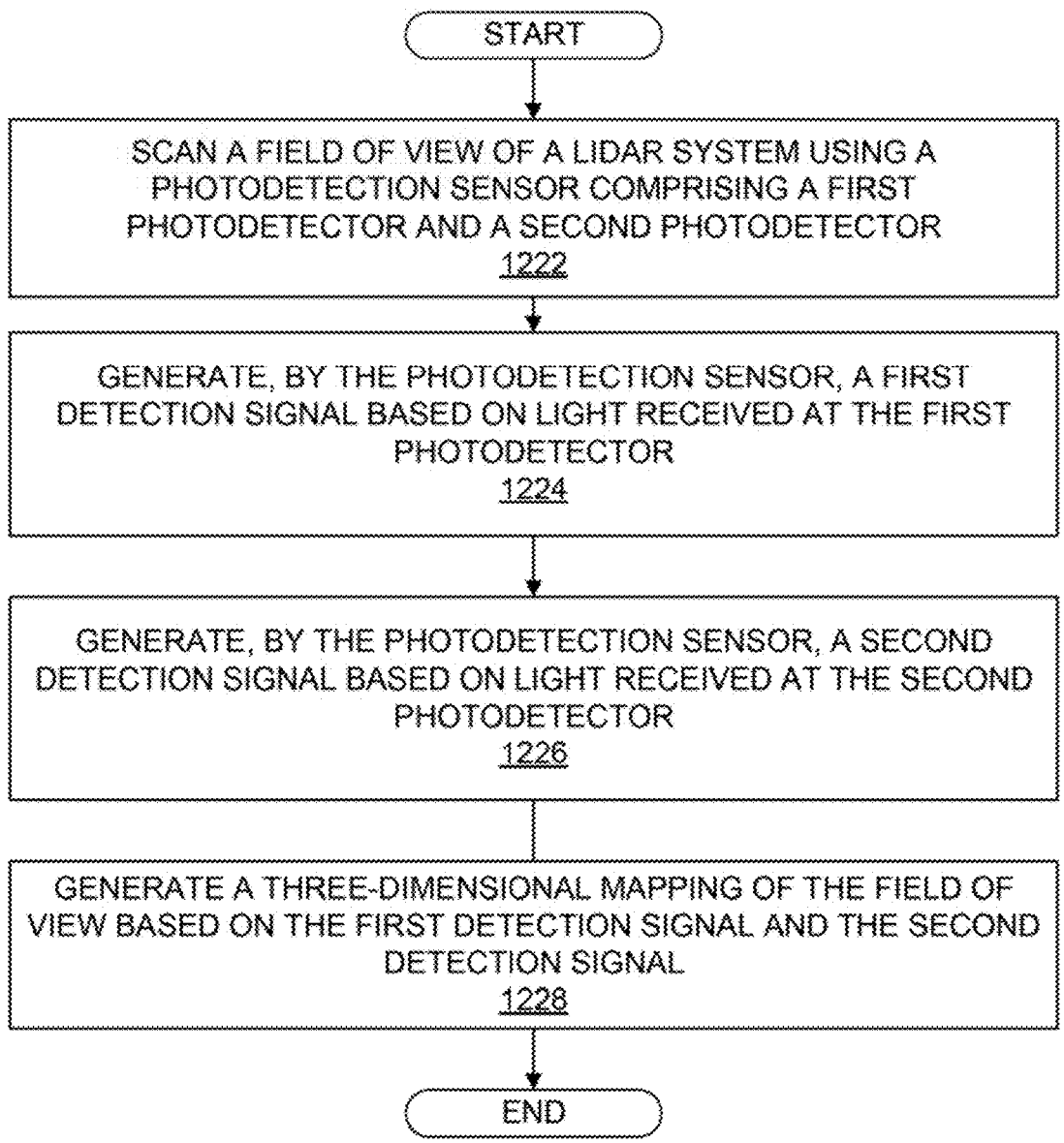
FIG. 12B is a flowchart showing an example process for operating a LIDAR system using a photodetection sensor with multiple performance characteristics consistent with disclosed embodiments.

FIG. 12B is a flowchart showing an example process 1220 for operating a LIDAR system using a photodetection sensor with multiple performance characteristics consistent with disclosed embodiments. Process 1220 may be performed, for example, by a LIDAR system, such as LIDAR system 100, described above.

In step 1222, process 1220 may include scanning a field of view of a LIDAR system using a photodetection sensor comprising a first photodetector and a second photodetector. For example, the photodetection sensor may correspond to photodetection sensor 1006. Accordingly, the first photodetection sensor may correspond to first photodetector 1021 and the second photodetector may correspond to second photodetector 1022. The first photodetection sensor and the second photodetection sensor may have different performance characteristics, which may be any of the various performance characteristics described above (including dynamic range, gain, timing, response time, etc.).

In step 1224, process 1220 may include generating, by the first photodetector, a first detection signal based on light received at the first photodetector. The first detection signal may be based on light transmitted toward a plurality of target objects and reflected from at least a first object of the plurality of target objects to the first photodetector. For example, light source 1002 may transmit light 1031 towards objects 1051 and 1052 and light 1041 reflected by object 1051 may be received by first photodetector 1021. In some embodiments, the first object may be beyond a threshold distance (e.g., threshold distance 1050). The first detection signal may be indicative of a time-of-flight of the light transmitted toward the plurality of target objects and reflected from the first object of the plurality of target objects to the first photodetector.

In step 1226, process 1220 may include generating, by the second photodetector, a second detection signal based on the light received at the second photodetector. Similar to the previous step, the light received at the second photodetector may be transmitted toward the plurality of target objects and reflected from at least a second object of the plurality of target objects to the second photodetector. For example, second photodetector 1022 may generate the second detection signal based on light 1042 reflected from object 1052. In some embodiments, the second object may be within a threshold distance 1050. The second detection signal may be indicative of a target object (e.g., object 1052) which is undetectable from the first detection signal. In some embodiments, the LIDAR system may be configured to generate the second detection signal only as needed (e.g., based on an indication of an object in a close range in the first detection signal, etc.).

In step 1226, process 1220 may include generating a three-dimensional mapping of the field of view based on the first detection signal and the second detection signal. In some embodiments, step 1226 may include determining a distance to the plurality of target objects. For example, step 1226 may include determining a first distance to the first object based on the first detection signal and/or a second distance to the second object based on the second detection signal. In some embodiments, step 1226 may include generating a point cloud, as discussed above. The point cloud may include one or more points that are detected by first photodetector and one or more points that are detected by second photodetector. Accordingly, the LIDAR system may process both the first detection signal and the second detection signal to generate the point cloud. Process 1220 may further include additional steps, such as performing at least one control action based on the first detection signal and/or the second detection signal. For example, the LIDAR system may provide information or instructions to a vehicle such that the vehicle can perform a navigation action. In other embodiments, the LIDAR system may use the second photodetector in a virtual protective housing application, as discussed above. Accordingly, the control action may include reducing a light intensity level of a light source, or various other safety control actions.

LIDAR Health Interface

To conform with safety regulations, and for operation of a LIDAR system generally, it may be helpful to determine if actual performance of sensors or other components of the LIDAR system deviates from an expected performance. For example, it may be important to determine whether a light detector of a LIDAR system is measuring the appropriate light intensity or other parameters for a given set of conditions. In another example, it may be important to determine whether a light source of a LIDAR system is emitting the appropriate intensity of light or other parameters for a given set of conditions. In order to monitor such performance, the health of a LIDAR system may be assessed based on the stability of its operating parameters over time. Accordingly, when a LIDAR system is checked (e.g., in a garage or by a system in a vehicle or another platform in which it is installed), it may be beneficial to check the system's status or health by comparing current operating parameters with historical operating parameters or other data.

Figure 13A:
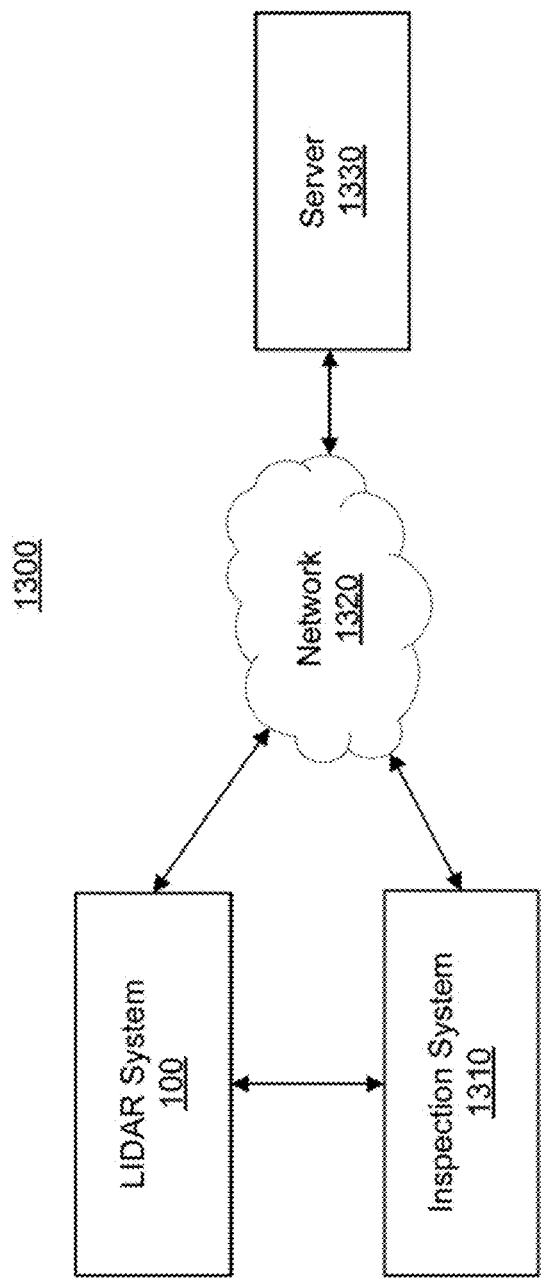
FIG. 13A is a diagram illustrating an example system for inspecting LIDAR systems consistent with some embodiments of the present disclosure.

FIG. 13A is a diagram illustrating an example system 1300 consistent with some embodiments of the present disclosure. As shown in FIG. 13A, system 1300 may include LIDAR system 100, an inspection system 1310, and a server 1330. As described above, LIDAR system 100 may be configured to detect a plurality of objects in an environment of the LIDAR system. LIDAR system 100 may include some or all of the features described in further detail above, including one or more light sources (e.g., light source 112), sensors (e.g., sensor 116), light deflectors, (e.g., light deflector 114), asymmetrical deflectors (e.g., asymmetrical deflector 216), optical components (e.g., optical window 124A), motors, or various other components associated with detecting objects. In some embodiments, LIDAR system 100 may be used in autonomous or semi-autonomous road-vehicles (for example, cars, buses, vans, trucks and any other terrestrial vehicle), however, LIDAR system 100 is not limited to such embodiments, as discussed above. Further, LIDAR system 100 is used throughout as an example LIDAR system. It is to be understood that the disclosed embodiments are not limited to any particular configuration or type of LIDAR system.

LIDAR system 100, inspection system 1310, and/or server 1330 may communicate with each other or with other components through a network 1320. Network 1320 may include various types of networks, such as the Internet, a wired Wide Area Network (WAN), a wired Local Area Network (LAN), a wireless WAN (e.g., WiMAX), a wireless LAN (e.g., IEEE 802.11, etc.), a mesh network, a mobile/cellular network, an enterprise or private data network, a storage area network, a virtual private network using a public network, a nearfield communications technique (e.g., Bluetooth, infrared, etc.), or various other types of network communications. In some embodiments, the communications may take place across two or more of these forms of networks and protocols.

Inspection system 1310 may be configured to monitor and/or assess the health or performance of LIDAR system 100. For example, inspection system 1310 may be configured to analyze outputs of LIDAR system 100 over time to determine decreases in performance of one or more components and/or subsystems of components (e.g., deterioration of a light source or light detector, mirror synchronization issues, etc.) while LIDAR system 100 is still operational. This may be useful in detecting and/or predicting failures before they occur and allowing for remedial action to be taken. This may also be useful in adjusting and/or calibrating other components of LIDAR system 100 to account for the decreases in performance (e.g., adjusting parameters associated with eye-safe light emission levels by the LIDAR system based on degradation in light sensor performance, etc.).

Inspection system 1310 may receive one or more operation parameters associated with various components of LIDAR system 100 and may compare the operation parameters to expected values (e.g., historical operation parameters) to evaluate the performance of LIDAR system 100. Based on the determined performance, inspection system 1310 may perform or initiate one or more remedial actions associated with LIDAR system 100. This process is described in further detail below, for example, with respect to FIGS. 14 and 15. Accordingly, inspection system 1310 may communicate with LIDAR system 100, either directly or indirectly (e.g., through a network connection such as network 1320). In some embodiments inspection system 1310 may communicate with a controller of LIDAR system 100 or vehicle 110 (not shown). For example, inspection system 1310 may provide instructions or other information which may be used by LIDAR system 100 and/or vehicle 110 for operation. It is noted that installation of LIDAR system 100 on vehicle 110 is used as a primary example below with respect to inspection system 1310 for reasons of convenience, the same systems, methods, computer program products and principles may also be implemented for stand-alone LIDAR systems or with other type of platform or managing system which is connected to LIDAR system (e.g., security, surveillance, scientific measurement, mapping, and so on.

While LIDAR system 100 and inspection system 1310 are shown separately in FIG. 13A, it is understood that in some embodiments, inspection system 1310 may be integrated with LIDAR system 100. For example, the operations performed by inspection system 1310 may be performed by a processing device of LIDAR system 100, such as processor 118 described above. Accordingly, the health of LIDAR system 100 may be monitored and/or analyzed in runtime by a processor of the LIDAR system. Alternatively, or in addition, the health of LIDAR system may be determined by the processor periodically (e.g., based on a set schedule, while a maintenance or inspection operation is being performed, based on a user or administrator request, in response to a command or inquiry, etc.).

In some embodiments, inspection system 1310 may be part of an auxiliary system or device configured to evaluate the performance of LIDAR system 100. For example, auxiliary processing may provide more powerful processing capabilities than may be available in LIDAR system 100 or may allow access to broader data sources than those available to LIDAR system 100. In such embodiments, inspection system 1310 may be part of a computing device separate from LIDAR system 100. For example, inspection system may be included on a laptop, a desktop computer, a remote server, a tablet, a smartphone, an internet of things (IoT) device, a smart watch, a handheld diagnostics device, a vehicle mounted computer, etc. The computing device may communicate with LIDAR system 100 through a wired or wireless connection. Determining a health of LIDAR system 100 (or various other steps performed by inspection system 1310) may be performed in real time (e.g., during operation of LIDAR system 100) or periodically.

In embodiments where LIDAR system 100 is implemented on a vehicle (e.g., vehicle 110), inspection of the health of the LIDAR system may be performed as part of a maintenance operation of the vehicle. For example, inspection system 1310 may be included on a computing device at a service station and may evaluate performance of LIDAR system 100 as part of a diagnostics check or general maintenance event. In such embodiments, inspection system 1310 may communicate with LIDAR system 100 through a communication port or other form of connection. For example, the service station may be equipped with a diagnostic tool for connecting to an onboard computer of the vehicle and may connect to an associated port (e.g., an OBD-II port) on the vehicle. Inspection system 1310 may also communicate directly with LIDAR system 100, which may have a dedicated port for communicating with inspection system 1310. Inspection system 1310 may also communicate with LIDAR system 100 (or vehicle 110) through other forms of wired connections or through a wireless connection (e.g., NFC, RFID, Bluetooth™, infrared, etc.). In some embodiments, inspection of LIDAR system 100 may be performed though an auxiliary device while vehicle 110 is not at a service station. For example, LIDAR system 110 may be configured to communicate with a mobile computing device, such as a laptop, tablet, mobile phone, vehicle-mounted computer, or other device located within or near vehicle 110. In some embodiments, inspection system 1310 may be integral to or associated with a processing device of the vehicle, such as an onboard computer of the vehicle, etc.

LIDAR system 100 and/or inspection system 1310 may also communicate with server 1330 through network 1320. Server 1330 may be any computing resource capable of communicating data or information associated with determining a health of LIDAR system 100. For example, server 1330 may include one or more databases comprising historical operation parameters and/or other stored data that may be relevant to determining a health of LIDAR system 100. Inspection system 1310 may compare data received from server 1330 with operational data received from LIDAR system 100 to detect a deterioration in performance of one or more components. Server 1330 may be associated with performing a resulting remedial action or various other operations performed by inspection system 1310.

Figure 13B:
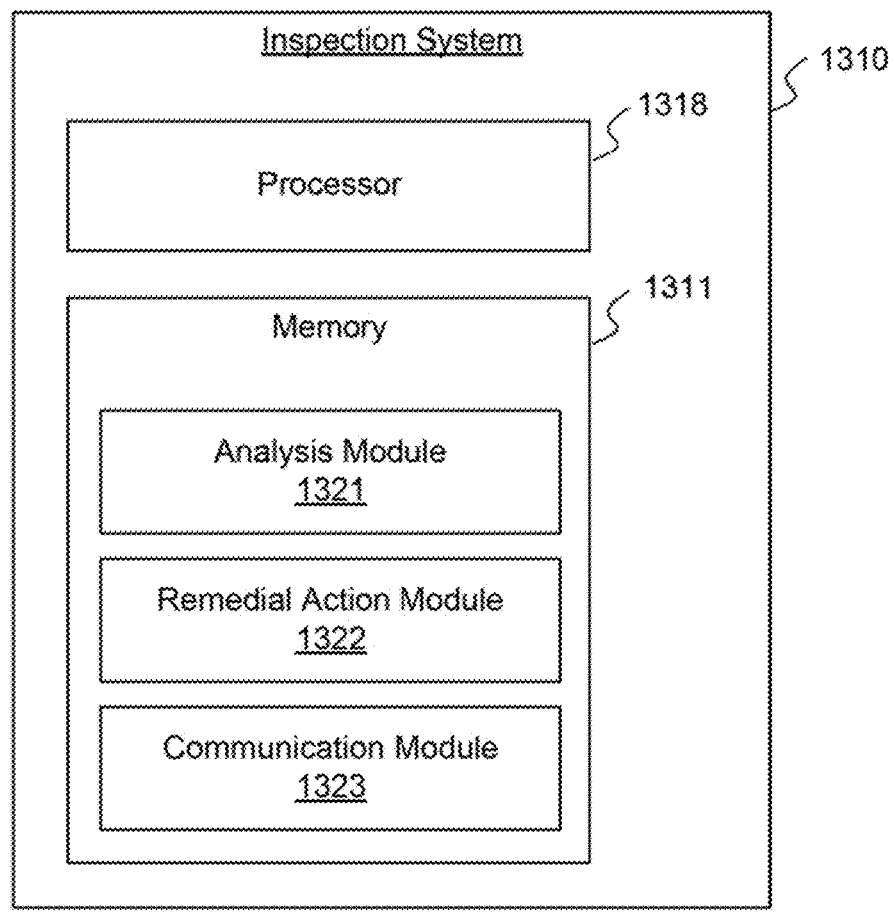
FIG. 13B is a diagram illustrating an example inspection system consistent with some embodiments of the present disclosure.

FIG. 13B is a diagram illustrating an example inspection system 1310 consistent with some embodiments of the present disclosure. Inspection system 1311 may include one or more memories 1311 and one or more processors 1318. Processor (or processors) 1318 may constitute any physical device having an electric circuit that performs a logic operation on input or inputs. For example, processor 1318 may take the form of, but is not limited to, one or more integrated circuits (IC), including Application-specific integrated circuit (ASIC), microchips, microcontrollers, microprocessors, all or part of a central processing unit (CPU), graphics processing unit (GPU), digital signal processor (DSP), field-programmable gate array (FPGA), system on a chip (SoC), or other circuits suitable for executing instructions or performing logic operations. According to some embodiments, processor 1318 may be from the family of processors manufactured by Intel®, AMO®, Qualcomm®, Apple®, NVIDIA®, or the like. The disclosed embodiments are not limited to any one type of processing unit of inspection system 1310. In some embodiments processor 1318 may be integrated into LIDAR system 100 and thus may correspond to processor 118. In other embodiments processor 1310 may be a separate processor of LIDAR system 100. Processor 1318 may be a processor associated with vehicle 110 or may be included in a separate computing device.

Processor 1318 may be configured to execute instructions stored in memory (or memories) 1311. The instructions may be integrated with or embedded into the controller or may be stored in a separate memory. Memory 1311 may comprise a Random Access Memory (RAM), a Read-Only Memory (ROM), a hard disk, an optical disk, a magnetic medium, a flash memory, other permanent, fixed, or volatile memory, or any other mechanism capable of storing instructions. In some embodiments memory 1311 may be integrated into LIDAR system 100 and thus may correspond to a memory associated with processor 118. In some embodiments, memory 1311 may store data associated with LIDAR system 100, including operational data of various components of LIDAR system 100. Memory 1311 may store other data including statistical information, historical operational data, predetermined data, simulated data, sensor data, or other stored data.

In some embodiments, memory 1311 may comprise one or more modules to provide functionality associated with inspection system 1310. As shown in FIG. 13B, for example, memory 1311 may comprise analysis module 1321, remedial action module 1322, and communication module 1323.

Analysis module 1321 may be configured to access and analyze one or more values associated with LIDAR system 100. For example, analysis module 1321 may receive recent operation parameters associated with LIDAR system 100 (e.g., a light intensity value, measured reflectivity of an object, etc.) and may compare the recent operation parameter to historical or statistical data. Such data may be stored locally in memory 1311 or may be accessed from an external source, such as server 1330. Analysis module 1321 may determine a health of LIDAR system 100 (e.g., a condition of LIDAR system 100, a degradation in performance of one or more components, etc.). Remedial action module 1322 may be configured to execute one or more actions based on the comparison performed by analysis module 1321. For example, analysis module 1321 may indicate that a certain component (e.g., sensor 116) has degraded beyond a certain threshold or other value. Communication module 1323 may be configured to communicate with other components of system 1300. For example, communication module may communicate with LIDAR system 100, vehicle 110, and server 1330 in order to receive and/or transmit data associated with determining a health of LIDAR system 100. Such communication may occur directly (e.g., through a wired or short-range wireless communication) or through a network, such as network 1320. The steps performed by analysis module 1321, remedial action module 1322, and communication module 1323 are described in greater detail below with respect to FIGS. 14 and 15. It is understood that some or all of the operations performed by inspection module 1310 may not be associated with dedicated modules. In some embodiments, memory 1311 may not have any specific computing modules, or may have additional, fewer, or alternative modules than those shown in FIG. 13B.

Figure 14:
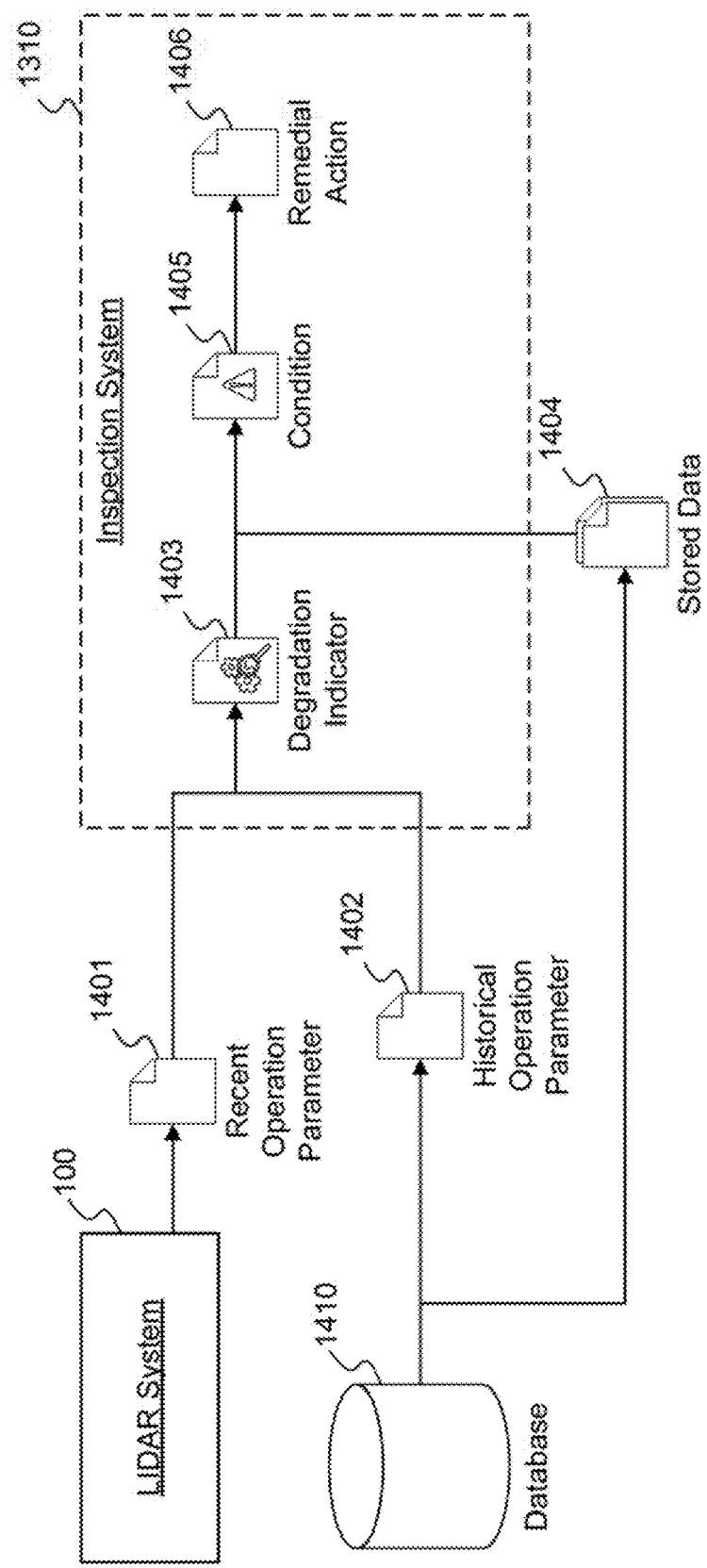
FIG. 14 is a block diagram illustrating an example process for inspecting LIDAR systems consistent with some embodiments of the present disclosure.

FIG. 14 is a block diagram illustrating an example process for inspecting LIDAR systems, consistent with some embodiments of the present disclosure. While the process shown in FIG. 14 is described with respect to a vehicle-mounted LIDAR system, it is understood that the same or a similar process may be applied for other forms of LIDAR systems. Inspection system 1310 may be configured to receive one or more recent operation parameters 1401 of LIDAR system 100. The one or more recent operation parameters may be received directly from LIDAR system 100 or from at least one other system (e.g., a sensor manager which controls various types of sensors in vehicle 110). As discussed above, inspection system 1310 may be integrated with LIDAR system 100 and the operations performed by inspection system 1310 may be performed by a processor of LIDAR system 100 (e.g., processor 118). Accordingly, inspection system 1310 may receive recent operation parameter 1401 in real time as LIDAR system 100 (and/or vehicle 110) is being operated. In some embodiments, recent operation parameter 1401 may be stored at least temporarily, for example in memory 1311, and may be accessed by inspection system 1310. In some embodiments, inspection system 1310 may comprise a processor included in vehicle 110 but independent of LIDAR system 100. For example, inspection system 1310 may be included in an onboard computer of vehicle 110 and may access recent operation parameter 1401 by communicating with LIDAR system 100 through a wired or wireless connection. In some embodiments, inspection system 1310 may be included in an off-vehicle computing device. The computing device may communicate with LIDAR system 100 through a short range wired or wireless communication, for example, when vehicle 110 is in a service station, parked in a garage, connected to a charging port, stopped at a refueling station, etc. The computing device may also communicate with LIDAR system 100 through a network (e.g., network 1320) and may be configured to monitor LIDAR system 100 in real time or at intervals between maintenance operations (e.g., every second, every minute, hourly, daily, monthly, etc.).

Recent operation parameter 1401 may represent any value associated with the various functions performed by LIDAR system 100. In some embodiments, recent operation parameter 1401 may be associated with the object-detection operations of LIDAR system 100. For example, recent operation parameter 1401 may include a light intensity measured by sensor 116. The light intensity may be based on ambient light measured from the environment of LIDAR system 100 or may be based on reflections of the light from light source 112. Recent operation parameter 1401 may represent a detected reflectivity of an object within the field of view of LIDAR system 100. In some embodiments, recent operation parameter 1401 may represent a distance to an object, a size of an object, a position or orientation of an object, a time value (e.g., time between transmission and detection of light, etc.) or other any other values measured or determined by LIDAR system 100. Recent operation parameter 1401 may correspond to values associated with a specified timeframe. For example, recent operation parameter 1401 may correspond to values recorded by LIDAR system 100 over seconds, minutes, hours, days, weeks, etc.

In some embodiments, recent operation parameter 1401 may be a value that is not directly associated with detection of an object but that is otherwise associated with the functioning of LIDAR system 100. For example, recent operation parameter 1401 may include a voltage required to operate various components of LIDAR system 100. For example, recent operation parameter 1401 may represent a voltage required to operate a light source (e.g., light source 112), a voltage required to operate a scanner (e.g., light deflector 114), a voltage required to operate a sensor (e.g., sensor 116, a camera, etc.), an overall voltage draw of the system, or various other values. Recent operation parameter 1401 may include other parameters including a time required to operate a component, a temperature, a sound or noise volume, a vibration level, a resistance, a current, an impedance, or any other parameters.

In some embodiments, recent operation parameter 1401 may be a compiled or computed value based on one or more determined and/or measured values. For example, recent operation parameter may represent value over a given time period (e.g., an average, a running average, a percent change, etc.). Recent operation parameter 1401 may be a relationship between two or more values (e.g., light reflectivity per detection element, etc.) or various other compiled values. These compiled or calculated values may be determined by processor 118 or may be determined by processor 1318 based on information received from LIDAR system 100. In some embodiments, recent operation parameter 1401 may comprise a plurality of recent operation parameters, which may be any combination of the recent operation parameters described above (e.g., parameters associated with detecting objects, parameters indirectly associated with operation of the LIDAR system, calculated values, etc.).

Inspection system 1310 may receive at least one historical operation parameter 1402. In some embodiments, historical operation parameter 1402 may be received from a database 1410. Database 1410 may be any storage device capable of storing data or parameters associated with LIDAR system 100. In some embodiments, database 1410 may be included on server 1330 and inspection system 1310 may receive historical operation parameter 1402 over network 1320. In other embodiments, database 1410 may be included in a memory of LIDAR system 100, inspection system 1310 (e.g., memory 1311), or vehicle 110. In some embodiments, historical operation parameter 1402 may be provided from database 1410 to LIDAR system 100 and inspection system 1310 may receive historical operation parameter 1402 from LIDAR system 100. Further, database 1410 may not be limited to any one location and may comprise a plurality of locations. For example, some data or parameters may be stored in at least one server 1330 while others may be stored in memory 1311. The present disclosure is not limited to any particular configuration of database 1410.

Historical operation parameter may be any value that may serve as a reference point to determine a health of LIDAR system 100 when taken together with recent operation parameter 1401. In some embodiments, historical operation parameter may be associated with LIDAR systems other than LIDAR system 100. For example, historical operation parameter may represent statistical information compiled from multiple vehicles equipped with LIDAR systems. The statistical information may be general statistical information associated with an operation parameter, such as an average voltage required to actuate a light deflector, etc. The statistical information may be specific to a particular object, location, time, etc. For example, historical operation parameter may represent an average distance at which a certain building (or other notable object or anchor) is detected, a reflectivity, size, or orientation of the building, a measured ambient light intensity at a given location and/or time of day, or other situation-specific parameters. In some embodiments, the statistical information may be filtered or selected based on the type of vehicle, the type of LIDAR system 100, the type of components included in LIDAR system 100, or any other variables that may make that statistical information more relevant.

In some embodiments, historical operation parameter 1402 may be based on historical or statistical information of the same vehicle or LIDAR system (e.g., LIDAR system 100). Historical operation parameter 1402 may represent data collected by LIDAR system 100 over a given time span (e.g., hours, days, months, years, the lifetime of the vehicle, the lifetime of the LIDAR system, etc.). Similar to the statistical data from other LIDAR systems, statistical data of LIDAR system 100 may also be specific to a particular situation. For example, the statistical data may represent operation parameters recorded when vehicle 110 has traversed the same location in the past, at the same time of day, at the same time of year, in similar weather conditions, or other situational data. Historical operation parameter 1402 may represent relatively recent parameters, for example, other measurements of recent operation parameter 1401 during the same drive or segment of a drive. For example, inspection system 1310 may track recent operation parameter 1401 as vehicle 110 approaches an object and determine whether recent operation parameter 1401 changes as expected. Accordingly, inspection system 1310 may be configured to store recent operation parameter 1401 at least temporarily, within memory 1311 or other storage locations.

Historical operation parameter 1402 may represent other data that is not collected from a specific LIDAR system or group of LIDAR systems. For example, historical operation parameter 1402 may represent a predetermined or expected value for recent operation parameter 1401. Historical operation parameter 1402 may be a value set within LIDAR system 100 or a value received from server 1330, etc. Historical operation parameter 1402 may also represent a simulated operation parameter or data. For example, historical operation parameter may be based on a simulated value for recent operation parameter 1401 based on similar conditions (e.g., time of day, weather conditions, location of vehicle 110, lifecycle of a component, etc.). The simulation data may be generated in real time (e.g., by server 1330, processor 118, processor 1318, etc.) or may be previously simulated data that is stored in database 1410. However, in some embodiments, the one or more historical operation parameters 1402 used may be non-simulated historical data derived from actual systems. In some embodiments, historical operation parameter 1402 may comprise data that is acquired in real time by another sensor of LIDAR system 100 (e.g., an auxiliary light sensor, a camera, etc.). Historical operation parameter may be a calculated or compiled value based on any of the above. In some embodiments, historical operation parameter 1402 may comprise a plurality of historical operation parameters, which may be any combination of the parameters described above (e.g., parameters associated with LIDAR system 100, parameters of other LIDAR systems, simulated data, predetermined data, etc.).

Inspection system 1310 may analyze recent operation parameter 1401 and historical operation parameter 1402 to determine a degradation indicator 1403. For example, recent operation parameter 1401 and historical operation parameter 1402 may be compared (or otherwise analyzed) using analysis module 1321. Degradation indicator 1403 may comprise any indicator of performance of LIDAR system 100 (or a component or subset of components thereof) based on an ideal or expected value. For example, degradation indicator 1403 may represent the degradation in performance of a light source, a sensor, a light deflector, an optical component (e.g., a mirror, a lens, a window, a beam splitter, etc.), a motor, a mechanical component, a battery, a camera, LIDAR system 100 as a whole, or the like. Degradation indicator 1403 may be represented as a value relative to an ideal performance value, such as a performance value when the component or LIDAR system 100 is new or is performing at a desired efficiency. Accordingly, degradation indicator 1403 may be represented as a ratio, a percentage, a fraction or other similar value. Degradation indicator 1403 may also be represented as an empirical or absolute value, a predefined status (e.g., "excellent," "good," "poor," "beginning to degrade," etc.), a scaled value (e.g., 1-100, 1-10, 1-5), or various other formats.

Inspection system 1310 may be configured to determine a condition 1405 of LIDAR system 100 based on degradation indicator 1403. Condition 1405 may be any representation of an unacceptable or undesired condition of vehicle 110 or LIDAR system 100. For example, based on degradation indicator 1403, inspection system 1310 may determine a likelihood that a component of LIDAR system 100 will fail. For example, the degradation in performance of a particular sensor may indicate that it is nearing a failure. Similarly, an increase in voltage required to drive a light deflector or other component may indicate that the component (or associated components, such as gears, bearings, cams, pistons, motors, etc.) are worn, dirty, and/or about to fail. A decrease in voltage required to drive the component may similarly indicate that a component is about to fail, for example, if the component is beginning to bend, fracture, or otherwise deform. Condition 1405 may indicate that the failure likelihood fails to meet a certain quality criterion. The failure likelihood may be represented as a percentage of occurrence or any other measure of probability. The threshold may be defined based on an acceptable failure likelihood (e.g., 10%, 20%, 30%, 40%, 50%, etc.). In some embodiments, the failure likelihood may be based on a given time frame. For example, inspection system 1310 may determine that a likelihood of failure before a next scheduled service of vehicle 110 or LIDAR system 100 fails to meet a certain threshold or other criterion. Accordingly, inspection system 1310 may be configured to obtain a value indicative of a time to a next maintenance event, for example, from LIDAR system 100, vehicle 110, database 1410, server 1330, or any other source.

In some embodiments, "failure" may not necessarily be defined as a complete failure of the component. For example, a failure may be defined as an unacceptable level of degradation of a component of LIDAR system 100. If the intensity of light that a light source is able to produce falls below a given quality criterion (e.g., 50% of an original or ideal value), this may be indicated by condition 1405. Accordingly, condition 1405 may not be based on a likelihood of failure but may be based on degradation indicator 1403 surpassing given quality or decision criteria. The failure may be defined as any unacceptable level of performance of LIDAR system 100 or a component thereof. Further, in some embodiments, degradation indicator 1403 and or condition 1405 may not necessarily identify any particular components or subsystems of components associated with a failure or decrease in performance, but may nonetheless identify that it has occurred.

In some embodiments, inspection system 1310 may access stored data 1404 and compare stored data 1404 with degradation indicator 1403 to determine condition 1405. Stored data 1404 may be accessed from database 1410 as shown in FIG. 14. Similar to historical operation parameter 1403, stored data 1404 may also be stored in a memory of inspection system 1310 (e.g., memory 1311), a memory of LIDAR system 100, and/or a memory of vehicle 110. Stored data 1404 may be any data, such as data that is nonspecific to vehicle 110 and/or LIDAR system 100, that may inform whether condition 1405 has been met. Stored data that is non-specific to the particular vehicle may include data that is applicable to a plurality of other vehicles and/or LIDAR systems. This data may be used to determine a condition (e.g., a health condition, a deterioration) of other LIDAR systems on other vehicles. In some embodiments, the nonspecific data may include data that is based on data collected from the specific LIDAR system and/or specific vehicle (e.g., if they are part of a large collection of systems which collect statistics). In such cases the data of the specific system may be a small part of the data used for compiling the stored data. The nonspecific stored data may be used in the same way for diagnosis of many different LIDAR systems by one or more inspection systems 1310.

In some embodiments, stored data 1404 may be a factor or other value used to calibrate or adjust degradation indicator 1403. For example, if degradation indicator 1403 is based on a measured light intensity of a sensor, weather data may indicate that a perceived degradation in performance is at least partially attributable to weather (e.g., rain, fog, snow, temperature, etc.) and inspection system 1310 may apply an adjustment or correction to degradation indicator 1403 based on the weather data.

In embodiments where a failure likelihood is determined, stored data 1404 may be statistical or other historical data that may be used to predict a likelihood or time of failure. For example, stored data 1404 may be used to correlate a determined degradation indicator to historical failure data and determine the likelihood of failure based on the historical data. In some embodiments, stored data 1404 may be implemented as a machine learning algorithm. For example, stored data 1404 may correspond to a failure prediction model that was trained using data from other LIDAR systems to correlate a determined degradation indicator to a particular likelihood of failure. Determining the likelihood of failure may comprise inputting degradation indicator 1403 into the trained failure prediction model. These forms of stored data 1410 are provided by way of example only, and various other forms of stored data 1404 and/or machine learning may be implemented.

In one example, inspection system 1310 may determine degradation indicator 1403 by tracking data over a runtime of LIDAR system 100. For example, inspection system 1310 may analyze one or more operation parameters (e.g., reflectivity, shape, pattern, size, etc.) associated with detecting a particular object over time. Inspection system 1310 may compare the operation parameters associated with the object recorded by LIDAR system 100 at a distance to the same operation parameters recorded as LIDAR system 100 becomes closer to the object. As LIDAR system 100 becomes closer to the object inspection system 1310 may have sufficient data to assess what the operation parameters should have been at a greater distance. For example, recent operation parameter 1401 may correspond to a detected size of an object at a close range and historical operation parameter 1402 may correspond to a detected size of the same object at a greater distance (or vice versa). Degradation indicator 1403 may be determined based on the difference between recent operation parameter 1401 and historical operation parameter 1402. Stored data 1404 may comprise data indicating how accurately other LIDAR systems are able to detect object size at the same distance. Based on degradation indicator 1310 and stored data 1404, inspection system 1310 may determine whether LIDAR system 1310 (or a specific sensor, etc.) is performing sufficiently.

Similarly, inspection system 1310 may track a reflectivity of a target object over time, which may be expected to remain constant (e.g., at a center of a target) at various distances. For example, a target which has a reflectivity of 20% from 100 meters away may be expected to have the same reflectivity at 10 meters away. Variations in reflectivity over time may indicate degradation of light source 112, sensor 116 or other components in the optical path (e.g., lenses, windows, etc.). By comparing the reflectivity at a close distance (recent operation parameter 1401) to reflectivity at a greater distance (historical operation parameter 1402), inspection system 1301 may assess the performance of LIDAR system 100 or its components to determine degradation indicator 1403. Further, degradation indicator 1403 may be compared to (or otherwise analyzed with respect to) historical or statistical data of other LIDAR systems (stored data 1404) to determine a likelihood of failure of LIDAR system 100.

Other operation parameters associated with a target may be expected to change as distance to the target varies. For example, even where reflectivity of a target object is not known, the signal intensity associated with light reflected from the target object that is determined by sensor 116 may be expected to vary based on distance according to a certain relationship or formula (e.g., polynomially, exponentially, etc.). If the intensity changes in a way that varies significantly from this relationship or formula, such changes may indicate a degradation in performance of LIDAR system 100. In this example, recent operation parameter 1401 and historical operation parameter 1402 may correspond to measured intensities at varying distances and inspection system 1310 may compare them according to the formula to determine degradation factor 1310. Alternatively, recent operation parameter 1401 may represent a factor other indicator of the relationship between distance and the measured intensity and historical operation parameter 1402 may represent an expected factor (e.g., based on a mathematical formula, historical data of LIDAR system 100, historical data from other LIDAR systems, etc.). In any of these scenarios, other factors, such as weather may also be considered (e.g., through stored data 1404, etc.) to determine whether the decreased performance may be due to other causes.

In some embodiments, inspection system 1310 may rely on data from other sensors of LIDAR system 100 and/or from other sensors of vehicle 110 to determine degradation indicator 1403. For example, inspection system 1310 may access sensor data from a camera of vehicle 110 (which may correspond to historical operation parameter 1402) and may compare it to data received from sensor 116. In one particular example, LIDAR system 100 may be temporarily operating in a "passive mode" in which light source 112 is not emitting light and sensor 116 is detecting light based on ambient illumination. Characteristics of the environment detected by sensor 116 (e.g., light intensity, object size, object shape, etc.) may correspond to recent operation parameter 1401. Characteristics of the environment determined by the camera may be compared to the sensor data to determine whether sensor 116 has any degradation in performance. In a similar manner, RADAR and other types of sensors may also be used to evaluate whether distances to objects are being determined by LIDAR system 100 accurately, whether the locations and/or dimensions of objects are being determined by LIDAR system 100 accurately, etc.

In yet another example, recent operation parameter may represent a statistical analysis of data collected by LIDAR system 100 over time. For example, the reflectivity of each detector element in sensor 116 may be analyzed over a given time period. A statistical distribution (e.g., a histogram) of the reflectivity measured by the detector elements may be generated. The number of elements with an average reflectivity measured over an hour may be totaled for various ranges of reflectivity (e.g., 0-5%, 5%-10%, 10%-15%, etc. or various other distributions). Other statistical information, such as an average reflectivity, a standard deviation, etc. may also be determined, which may correspond to recent operation parameter 1401. Historical operation parameter 1402 may represent an expected statistical value (e.g., based on factory settings of LIDAR system 100, historical data of LIDAR system 100, data from other LIDAR systems, etc.). If reflectivity measured by the detector elements is expected to have a normal distribution (or other expected distribution) with specific attributes (e.g., mean, standard deviation), variations in the distribution may indicate a degradation in performance of sensor 116. Histograms and statistical data may also be determined for other sensor data or parameters, including distances measured to targets, average distances measured throughout the field of view (e.g., a histogram of distances measured by all detector elements), noise levels measured (e.g., in target-free areas of the field of view, such as the sky), or any other parameters. It is understood that these examples are not limiting of the present disclosure. Various other uses or embodiments of the disclosed processes may be implemented.

Based on condition 1405 being satisfied, inspection system 1310 may trigger one or more remedial actions 1406. Remedial action 1406 may be triggered by remedial action module 1322, as discussed above. Remedial action 1406 may be any action taken in response to determining degradation indicator 1403 and/or condition 1405. In some embodiments, remedial action 1406 may comprise generating and/or transmitting an alert. The alert may indicate that a component or equipment of LIDAR system 100 needs to be repaired or replaced. The alert may also include the likelihood of failure of a component, an indication of when a component or equipment may fail, a diagnosis of the failure or degradation (e.g., dirty lens, worn sensor or light source, or any other information that may be considered pertinent to the health of LIDAR system 100). In some embodiments, the alert may be transmitted to a device included within vehicle 110. For example, vehicle 110 may include a display configured to present an alert or notification to a driver or user of vehicle 110. In other embodiments, the alert may be transmitted to an external source (e.g., through network 1320), such as a mobile computing device (e.g., a phone, tablet, watch, etc. of a user), a remote server, a fleet manager, a vehicle tracking system, etc. In some embodiments, remedial action 1406 may comprise scheduling a maintenance event for vehicle 110 or LIDAR system 100. Remedial action may include performing a maintenance action or providing instructions to perform the maintenance action. For example, remedial action 1406 may include having LIDAR system 100 calibrate, reset, reboot, or otherwise reconfigure one or more components in LIDAR system 100. Remedial action 1406 may comprise implementing a safety measure based on the determined condition 1405. For example, LIDAR system 100 may determine that sensor 116 is unable to perceive a full amount of light intensity and may reduce the intensity of light source 112 accordingly to ensure that eye-safe light levels are met. Remedial action 1406 may comprise shutting down one or more components, reducing or increasing power to one or more components, transmitting a navigational command to vehicle 110, etc.

In some embodiments, the remedial action may include providing data to LIDAR system 100 and/or other nearby LIDAR systems to improve navigation and detection. This may be true even when a decrease in performance identified by degradation indicator 1403 does not arise from deterioration of LIDAR system 100, but based on weather, location (e.g., passing through a tunnel, under a bridge, etc.) or other factors. For example, inspection system 1310 may analyze a histogram or associated statistical information based on reflectivity measured by each detector element, as described above. The remedial action may include notifying vehicle 110 of a decrease in performance detected based on an analysis of the statistical information so that vehicle 110 can adjust various navigational or operational parameters. Similarly, the remedial action may include informing other LIDAR systems within the area (e.g., vehicles within a certain range (1 mile, 10 miles, etc.), vehicles navigating the same route, etc.) of a potential degradation in performance associated with the location of vehicle 110. In some embodiments, the remedial action may be carried out by a system or device other than LIDAR system 100. For example, the remedial action may be performed by vehicle 110. Based on information provided by inspection system 1310 and/or LIDAR system 100, vehicle 110 may stop, limit the maximum speed of the vehicle, perform a navigation action, etc. In some embodiments the remedial action may be performed by other LIDAR systems or vehicles. For example, if it is determined that LIDAR system 100 malfunctions in a particular geographical area or under certain conditions, the remedial action may include changing operational parameters of other LIDAR systems and/or vehicles in those geographical areas or under those conditions. It is understood that various other remedial actions may be performed, and the present disclosure is not limited to any particular action.

Figure 15:
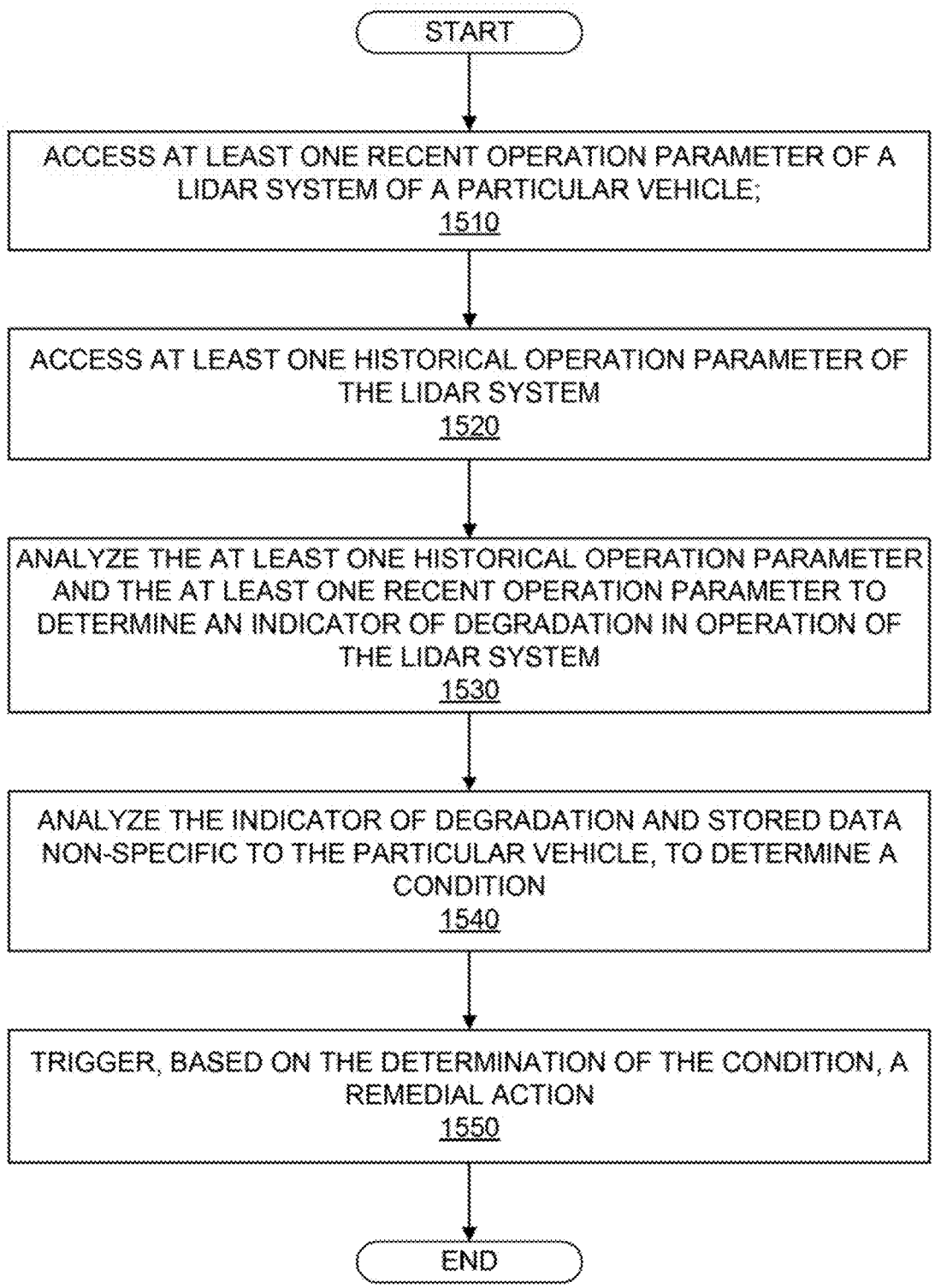
FIG. 15 is a flowchart showing an example process for inspecting LIDAR systems consistent with disclosed embodiments.

FIG. 15 is a flowchart showing an example process 1500 for inspecting road vehicles equipped with LIDAR consistent with disclosed embodiments. Process 1500 may be performed by one or more processors associated with inspection system 1310 (e.g., processor 1318). As discussed above, some or all of the operations associated with process 1500 may be performed by other processing devices, such as a processor of LIDAR system 100 (e.g., processor 118), a processor mounted in or otherwise included in vehicle 110, a processor of an auxiliary device, etc. Process 1500 may correspond to the process depicted in FIG. 14 and, accordingly, any of the descriptions or features discussed with respect to FIG. 14 may also apply to process 1500, and vice versa. In some embodiments, process 1500 may be performed in real time during operation of the LIDAR system. Accordingly, process 1500 may be performed by an inspection system installed on the particular vehicle. In other embodiments, process 1500 may be performed during a maintenance operation of the particular vehicle (e.g., at a service station, in a garage, at a factory, at predetermined time intervals (hourly, daily, monthly), etc.). In some embodiments, the processor performing process 1500 may be configured to communicate with a controller of the particular vehicle or a controller of the LIDAR system being inspected. For example, the processor may transmit instructions or other information associated with the health of LIDAR system 100 as described above. While a vehicle-based LIDAR system is used as an example throughout the description of process 1500, it is understood that the same process may apply to non-vehicular implementations.

In step 1510, process 1500 may include accessing at least one recent operation parameter of a LIDAR system. In some examples, the LIDAR system may be LIDAR system 100 and may be included in a particular vehicle, such as vehicle 110. The recent operation parameter may correspond to recent operation parameter 1401, described in detail above. In some embodiments, accessing the at least one recent operation parameter may include accessing the at least one recent operation parameter from the particular vehicle. For example, the recent operation parameter may be accessed from LIDAR system 100 and/or vehicle 110. The recent operation parameter may be accessed directly from LIDAR system 100 (e.g., through a wired connection, by a connection through a port of vehicle 110 or LIDAR system 100, a short-range wireless connection, etc.). In other embodiments, the recent operation parameter may be accessed through a remote or network connection (e.g., through network 1320). The recent operation parameter may be indicative of a power of a light source of the LIDAR system, a required voltage to operate the light source, a required voltage to drive a scanner of the LIDAR system, a required voltage to operate a sensor of the LIDAR system, or a detection distance of at least one known object. In some embodiments, recent operation parameter may be indicative of statistical information (e.g., an average, a standard deviation, etc.).

In step 1520, process 1500 may include accessing at least one historical operation parameter. For example, the historical operation parameter may be historical operation parameter 1402, described in detail above. In some embodiments, the historical operation parameter may be associated with a vehicle. For example, the historical operation parameter may represent an operation parameter similar to the recent operation parameter but recorded by the LIDAR system at another time. The historical operation parameter may be based on data from other sensors of vehicle 110 (e.g., cameras, RADAR sensors, other LIDAR sensors, etc.) than those associated with the recent operation parameter. In other embodiments, the historical operation parameter may be associated with other LIDAR systems. Similar to recent operation parameter, historical operation parameter may be accessed or obtained from various sources. For example, accessing the at least one historical operation parameter may comprise accessing the at least one historical operation parameter from a remote server or from the particular vehicle. Sources may further include a memory of inspection system 1310, a memory of LIDAR system 100, a memory of vehicle 110, sever 1330, or any other resource accessible by inspection system 1310.

In step 1530, process 1500 may include analyzing the at least one historical operation parameter and the at least one recent operation parameter to determine an indicator of degradation in operation of the LIDAR system. For example, inspection system 1310 may compare historical operation parameter 1402 to recent operation parameter 1401 to determine degradation indicator 1403, as described in detail above. The degradation indicator may be any value or measure of performance associated with LIDAR system 100 or a component of LIDAR system 100 in reference to a standard level of performance. In some embodiments process 1500 may include obtaining at least one reference operation parameter of LIDAR systems of a plurality of reference vehicles and comparing the at least one reference operation parameter with the at least one recent operation parameter to determine the indicator of degradation in operation of the LIDAR system of the particular vehicle.

In step 1540, process 1500 may include analyzing the indicator of degradation in operation of the LIDAR system and stored data non-specific to the particular vehicle to determine a condition of the LIDAR system. For example, the stored data non-specific to the particular vehicle may correspond to stored data 1404, described in detail above. Accordingly, the stored data may comprise historical or statistical data of other LIDAR systems or data that may be relevant to a decrease in performance of LIDAR system 100 (e.g., weather information, location-specific information, etc.). In some embodiments, comparing the indicator of degradation with stored data non-specific to the particular vehicle may comprise inputting the indicator of degradation into a machine learning model or performing other forms of analysis with respect to the stored data and the indicator of degradation.

The condition may correspond to condition 1405, described in detail above. In some embodiments, determining the condition may comprise ascertaining a failure likelihood and determining that the failure likelihood does not meet a quality criterion. In other embodiments, determining the condition may comprise determining, based on the indicator, that a degradation in operation of the LIDAR system does not meet a quality criterion. For example, the condition may correspond to a mechanical or electrical failure of a component, or may correspond to an unacceptable degradation of the component or the LIDAR system. In some embodiments, process 1500 may further comprise obtaining a value indicative of a time to a next maintenance event and determining a likelihood that the LIDAR system will fail before the next maintenance event.

In step 1550, process 1500 may include triggering, based on the determined condition of the LIDAR system, a remedial action. For example, the remedial action may correspond to remedial action 1406, described in detail above. In some embodiments, the remedial action may comprise transmitting an alert to repair equipment associated with the LIDAR system. In other embodiments, the remedial action may comprise transmitting an alert to repair equipment associated with the LIDAR system. For example, these alerts may be displayed on at least one display of the particular vehicle. These alerts may also be transmitted to other devices or locations, including server 1330, an auxiliary device (e.g., a mobile phone, a tablet, a laptop, surrounding vehicles or LIDAR systems, etc.). In some embodiments, the remedial action may comprise sending an alert associated with the condition to other LIDAR systems or to a computing device of the particular vehicle. In other embodiments, the remedial action may comprise performing at least one of a maintenance operation, a calibration operation, a navigation operation, a safety operation, or transmitting instructions to perform these or other operations to vehicle 110, LIDAR system 100, server 1330, and/or other devices.

It is noted that similar methods and systems may be used for deciding on a preventive action. For example, even if the LIDAR system is fully functional, comparison of recent operation parameters to historical operation parameters may reveal that when other LIDAR systems where operated in similar conditions (e.g., heat, humidity, ambient illumination) with the same operational parameters (e.g., light level, sensing parameters, FOV size), they deteriorated quicker than other systems. In such cases, similar methods to method 1500 may conclude in taking a preemptive action such as changing operational parameters of LIDAR system 100 and/or of vehicle 110, in order to preempt undue deterioration of LIDAR system 100. Also, similar methods and systems may also be used to detect preferable operational parameters in different scenarios, in which case comparison of the at least one recent operation parameter and the at least one historical operation parameter may be used to determine that specific changes to the operational parameter of LIDAR system 100 (or other LIDAR systems or vehicles 110) may yield improved performances in some scenarios, and to implement such changes.

The foregoing description has been presented for purposes of illustration. It is not exhaustive and is not limited to the precise forms or embodiments disclosed. Modifications and adaptations will be apparent to those skilled in the art from consideration of the specification and practice of the disclosed embodiments. Additionally, although aspects of the disclosed embodiments are described as being stored in memory, one skilled in the art will appreciate that these aspects can also be stored on other types of computer readable media, such as secondary storage devices, for example, hard disks or CD ROM, or other forms of RAM or ROM, USB media, DVD, Blu-ray, or other optical drive media.

Computer programs based on the written description and disclosed methods are within the skill of an experienced developer. The various programs or program modules can be created using any of the techniques known to one skilled in the art or can be designed in connection with existing software. For example, program sections or program modules can be designed in or by means of .Net Framework, .Net Compact Framework (and related languages, such as Visual Basic, C, etc.), Java, C++, Objective-C, HTML, HTML/AJAX combinations, XML, or HTML with included Java applets.

Moreover, while illustrative embodiments have been described herein, the scope of any and all embodiments having equivalent elements, modifications, omissions, combinations (e.g., of aspects across various embodiments), adaptations and/or alterations as would be appreciated by those skilled in the art based on the present disclosure. The limitations in the claims are to be interpreted broadly based on the language employed in the claims and not limited to examples described in the present specification or during the prosecution of the application. The examples are to be construed as non-exclusive. Furthermore, the steps of the disclosed methods may be modified in any manner, including by reordering steps and/or inserting or deleting steps. It is intended, therefore, that the specification and examples be considered as illustrative only, with a true scope and spirit being indicated by the following claims and their full scope of equivalents.

What is claimed is:

1. A LIDAR system comprising:
    at least one processor configured to:
        control a light deflector associated with a LIDAR sensor of the LIDAR system to direct light from a light source to illuminate a first object and a second object located in a space being illuminated by the light source, wherein the first object is located within a field of view of the LIDAR sensor and the second object is located in a blind spot region of the LIDAR sensor, the blind spot region comprising a portion of the space being illuminated by the light source that is outside the field of view of the LIDAR sensor;
        determine a distance to the first object based on first reflection signals received from the LIDAR sensor, wherein the first reflection signals are indicative of light directed by the light deflector into the space being illuminated by the light source and reflected from the first object;
        receive, from a supplementary sensor, second reflection signals indicative of light directed by the light deflector into the space being illuminated by the light source and reflected from the second object in the blind spot region;
        determine, based on the second reflection signals that the second object is located within a predetermined distance from the LIDAR system; and
        regulate, based on the determination, at least one of the light source and the light deflector to prevent an accumulated energy density of light emitted by the light source within the predetermined distance from exceeding a maximum permissible exposure level,
    wherein the LIDAR sensor includes at least a first type of photodiode sensor, and the supplementary sensor includes at least a second type of photodiode sensor other than the first type, and
    wherein the second type of photodiode sensor is configured to provide intensity information associated with the light reflected from the second object but not time information.

2. The LIDAR system of claim 1, wherein the supplementary sensor is configured to receive light from the blind spot region.

3. The LIDAR system of claim 1, wherein the light deflector includes a plurality of mirrors and wherein at least a first mirror of the plurality of mirrors is configured to direct light from the light source towards the illuminated space and at least a second mirror of the plurality of mirrors is configured to direct reflection signals from the illuminated space toward the supplementary sensor.

4. The LIDAR system of claim 1, wherein the second type of photodiode sensor has a recovery time shorter than a recovery time of the first type of photodiode sensor.

5. The LIDAR system of claim 1, wherein an instantaneous pixel field-of-view of the supplementary sensor is at least 5 times larger than an instantaneous pixel field-of-view of the LIDAR sensor.

6. The LIDAR system of claim 1, wherein the regulating further comprises:
  determining a distance to the at least one object,
  calculating an intensity of light at the at least one object, and
  determining an exposure time that is eye-safe at the distance to the at least one object.

7. The LIDAR system of claim 1, wherein the regulating further comprises regulating the at least one light source to prevent an accumulated energy density in a region of the illuminated space associated with the second object from exceeding a predetermined level.

8. The LIDAR system of claim 1, wherein the LIDAR system is included in a vehicle and the at least one processor is further configured to identify an existence of the second object within the predetermined distance.

9. The LIDAR system of claim 1, wherein the LIDAR sensor and the supplementary sensor are included on a single chip comprising a plurality of detecting elements, the LIDAR sensor being associated with a first set of the plurality of detecting elements and the supplementary sensor being associated with a second set of the plurality of detecting elements.

10. The LIDAR system of claim 1, wherein the supplementary sensor comprises a plurality of detecting elements and the at least one processor is further configured to determine a distance to the second object based on which of the plurality of detecting elements receives the light reflected from the second object.

11. The LIDAR system of claim 1, wherein a range of the supplementary sensor is at least 5 times shorter than a range of the LIDAR sensor.

12. The LIDAR system of claim 1, wherein an optical axis of the supplementary sensor is tilted by at least 20° with respect to an optical axis of the LIDAR sensor.

13. The LIDAR system of claim 1, wherein the first object and the second object are illuminated by the same light source.

14. A method for detecting an object within a minimum threshold safety distance of a LIDAR system, the method comprising:
  controlling a light deflector associated with a LIDAR sensor of the LIDAR system to direct light from a light source to illuminate a first object and a second object located in a space being illuminated by the light source, wherein the first object is located within a field of view of the LIDAR sensor and the second object is located in a blind spot region of the LIDAR sensor, the blind spot region comprising a portion of the space being illuminated by the light source that is outside the field of view of the LIDAR sensor;
  determining a distance to the first object based on first reflection signals received from the LIDAR sensor, wherein the first reflection signals are indicative of light directed by the light deflector into the space being illuminated by the light source and reflected from the first object;
  receiving, from a supplementary sensor, second reflection signals indicative of light directed by the light deflector into the space being illuminated by the light source and reflected from the second object in the blind spot region;
  determining, based on the second reflection signals that the second object is located within a predetermined distance from the LIDAR system; and
  regulating, based on the determination, at least one of the light source and the light deflector to prevent an accumulated energy density of light emitted from the light source within the predetermined distance from exceeding a maximum permissible exposure level,
  wherein the LIDAR sensor includes at least a first type of photodiode sensor, and the supplementary sensor includes at least a second type of photodiode sensor other than the first type, and
  wherein the second type of photodiode sensor is configured to provide intensity information associated with the light reflected from the second object but not time information.

15. The method of claim 14, wherein the supplementary sensor is configured to receive light from the blind spot region.

16. The method of claim 14, wherein the light deflector includes a plurality of mirrors and wherein at least a first mirror of the array is configured to direct light from the light source towards the illuminated space and at least a second mirror of the array is configured to direct reflection signals from the illuminated space toward the supplementary sensor.

17. The method of claim 14, wherein the second type of photodiode sensor has a recovery time shorter than a recovery time of the first type of photodiode sensor.

18. The method of claim 14, wherein the regulating further comprises:
  determining a distance to the at least one object,
  calculating an intensity of light at the at least one object, and
  determining an exposure time that is eye-safe at the distance to the at least one object.

19. The method of claim 14, wherein the regulating comprises regulating the at least one light source to prevent an accumulated energy density in a region of the illuminated space associated with the second object from exceeding a predetermined level and not regulating the at least one light source in a region of the illuminated space not associated with the second object.

20. The method of claim 14, wherein the method is performed by a LIDAR system mounted on a vehicle and the method further comprises providing an indication of an existence of the second object within the predetermined distance.

21. The method of claim 14, wherein the LIDAR sensor and the supplementary are included on a single chip comprising a plurality of detecting elements, the LIDAR sensor being associated with a first set of the plurality of detecting elements and the supplementary sensor being associated with a secondary set of the plurality of detecting elements.

22. The method of claim 14, wherein the supplementary sensor comprises a plurality of detecting elements and the method further comprises determining a distance to the second object based on which of the plurality of detecting elements receives the light reflected from the second object.

23. The method of claim 14, wherein a range of the supplementary sensor is at least 5 times shorter than a range of the LIDAR sensor.

* * * * *